(12) United States Patent
Yamai et al.

(10) Patent No.: US 10,747,383 B2
(45) Date of Patent: Aug. 18, 2020

(54) TRANSPARENT ELECTRODE MEMBER, METHOD OF MANUFACTURING THE SAME, AND CAPACITIVE SENSOR THAT USES TRANSPARENT ELECTRODE MEMBER

(71) Applicant: Alps Alpine Co., Ltd., Ota-ku, Tokyo (JP)

(72) Inventors: Tomoyuki Yamai, Niigata-ken (JP); Eiichi Komai, Niigata-ken (JP); Yuta Hiraki, Niigata-ken (JP); Manabu Yazawa, Niigata-ken (JP); Keita Tashiro, Niigata-ken (JP); Hideaki Takahashi, Niigata-ken (JP)

(73) Assignee: Alps Alpine Co., Ltd., Tokyo (JP)

( * ) Notice: Subject to any disclaimer, the term of this patent is extended or adjusted under 35 U.S.C. 154(b) by 0 days.

(21) Appl. No.: 16/381,941

(22) Filed: Apr. 11, 2019

(65) Prior Publication Data
US 2019/0235667 A1 Aug. 1, 2019

Related U.S. Application Data

(63) Continuation of application No. PCT/JP2017/042430, filed on Nov. 27, 2017.

(30) Foreign Application Priority Data

Dec. 2, 2016 (JP) ................................ 2016-235395
Nov. 22, 2017 (JP) ................................ 2017-224622

(51) Int. Cl.
*G06F 3/044* (2006.01)
*G06F 3/047* (2006.01)
(Continued)

(52) U.S. Cl.
CPC .............. *G06F 3/044* (2013.01); *G06F 3/041* (2013.01); *H01B 5/14* (2013.01); *H01B 13/00* (2013.01);
(Continued)

(58) Field of Classification Search
CPC ........... G06F 3/044; G06F 2203/04112; G06F 2203/04103; G06F 2203/04111; G06F 2203/04804
See application file for complete search history.

(56) References Cited

U.S. PATENT DOCUMENTS

2013/0189502 A1* 7/2013 Takahashi ............. B29C 59/002
428/195.1
2014/0198266 A1 7/2014 Park et al.
(Continued)

FOREIGN PATENT DOCUMENTS

| JP | 2016-514873 | 5/1916 |
| JP | 2016-197554 | 11/1916 |

(Continued)

OTHER PUBLICATIONS

International Search Report from International Application No. PCT/JP2017/042430 dated Jan. 9, 2018.

*Primary Examiner* — Xuemei Zheng
(74) *Attorney, Agent, or Firm* — Beyer Law Group LLP

(57) ABSTRACT

A transparent electrode member has a transparent base material, a transparent electrode placed on the first surface of the base material, and an insulating layer placed in an insulating region positioned in at least part of the circumference of a region in which the transparent electrode is placed, when viewed from the direction of the normal to the first surface. The transparent electrode has a dispersion layer that includes a matrix composed of an insulating material and also includes conductive nanowires dispersed in the matrix. The transparent electrode also has a region com- (Continued)

posed of the conductive part and regions composed of optical adjustment parts when viewed from the direction of the normal to the first surface. The conductive region has conductivity higher than the optical adjustment part. In the dispersion layer, the dispersion density of conductive nanowires in the optical adjustment part is lower than that in the conductive part.

18 Claims, 33 Drawing Sheets

(51) Int. Cl.
| | |
|---|---|
| *G06F 1/16* | (2006.01) |
| *H01B 13/00* | (2006.01) |
| *H01B 5/14* | (2006.01) |
| *H05K 1/09* | (2006.01) |
| *G06F 3/041* | (2006.01) |
| *H01H 36/00* | (2006.01) |
| *B82Y 15/00* | (2011.01) |

(52) U.S. Cl.
CPC ............... *H01H 36/00* (2013.01); *H05K 1/09* (2013.01); *B82Y 15/00* (2013.01); *G06F 2203/04103* (2013.01); *G06F 2203/04111* (2013.01); *G06F 2203/04112* (2013.01); *G06F 2203/04804* (2013.01); *H05K 2201/026* (2013.01); *H05K 2201/03* (2013.01)

(56) References Cited

U.S. PATENT DOCUMENTS

| | | |
|---|---|---|
| 2016/0048242 A1 | 2/2016 | Ahn et al. |
| 2016/0139710 A1 | 5/2016 | Yamai et al. |
| 2019/0064968 A1* | 2/2019 | Liu .......................... H05K 3/18 |

FOREIGN PATENT DOCUMENTS

| | | |
|---|---|---|
| JP | 2010-157400 | 7/2010 |
| JP | 2013-152578 | 8/2013 |
| JP | 2015-201023 | 11/2015 |
| WO | 2015/019805 | 2/2015 |

\* cited by examiner

TRANSPARENT ELECTRODE MEMBER, METHOD OF MANUFACTURING THE SAME, AND CAPACITIVE SENSOR THAT USES TRANSPARENT ELECTRODE MEMBER

CLAIM OF PRIORITY

This application is a Continuation of International Application No. PCT/JP2017/042430 filed on Nov. 27, 2017, which claims benefit of Japanese Patent Application No. 2016-235395 filed on Dec. 2, 2016 and No. 2017-224622 filed on Nov. 22, 2017. The entire contents of each application noted above are hereby incorporated by reference.

BACKGROUND OF THE INVENTION

1. Field of the Invention

The present invention relates to a transparent electrode member.

2. Description of the Related Art

A capacitive sensor has a transparent electrode member having a transparent electrode to detect the position of a portion with which a manipulating body has come into contact without lowering the visibility of an image displayed on a screen. In general, if a transparent electrode member includes both a pattern portion in which a transparent electrode is provided and a non-pattern portion (that is, a pattern opening portion) in which no transparent electrode is provided are present, the pattern portion and non-pattern portion are visually distinguished from each other. If the difference between the reflectance of the pattern portion and the reflectance of the non-pattern portion becomes large, the difference between the pattern portion and the non-pattern portion is visually clarified. This causes a problem in that the visibility of the outside shape of the display elements that display an image is lowered.

PCT Japanese Translation Patent Publication No. 2016-514873 discloses a transparent electrode laminated body that includes a first transparent electrode layer and a second transparent electrode layer, each of which is laminated on a transparent substrate in a predetermined pattern and also includes an insulating layer intervening between the first transparent electrode layer and the second transparent electrode layer and contact holes that electrically connect the first transparent electrode layer and second transparent electrode layer together. The transparent electrode laminated body described in PCT Japanese Translation Patent Publication No. 2016-514873 further includes a passivation layer on a surface of the transparent electrode laminated structure, the surface being opposite to the transparent substrate.

PCT Japanese Translation Patent Publication No. 2010-157400 discloses a conductive nanofiber sheet that has: a base body sheet; a conductive pattern layer, formed on the base body sheet, that includes conductive nanofibers, which make the conductive pattern layer conductive, and has a plurality of micro pin holes with a size that makes visual recognition impossible; and an insulation pattern layer, formed in a portion in which the conductive pattern layer on the base body sheet is not formed, that includes the conductive nanofibers and is insulated from the conductive pattern layer. The insulation pattern layer in the conductive nanofiber sheet described in PCT Japanese Translation Patent Publication No. 2010-157400 has narrow and small grooves with a width that makes visual recognition impossible. Due to the narrow and small grooves, the insulation pattern layer is insulated from the conductive pattern layer and is formed like a plurality of islands.

SUMMARY OF THE INVENTION

However, the transparent electrode laminated body described in PCT Japanese Translation Patent Publication No. 2016-514873 has a plurality of laminated structures that vary depending on the position. For example, the second transparent electrode layer is disposed on the first transparent electrode layer and the second transparent electrode layer is disposed with the insulating layer intervening between them. Therefore, a step is formed on the transparent substrate. In a case in which a step is formed on a transparent substrate, if a passivation layer is provided in a portion including the step, the effect of the passivation layer is not obtained so much. To avoid this, the passivation layer needs to be disposed on a surface of the transparent substrate, the surface being opposite to the surface on which the first transparent electrode and second transparent electrode are disposed. This causes a problem in that the effect of invisibility to the pattern portions of the first transparent electrode layer and second transparent electrode layer is restrictive.

A possible means for making the pattern portions of the first transparent electrode layer and second transparent electrode layer invisible is to suppress the non-pattern portion to a small width and size. In the first transparent electrode layer, in which a first pattern and a second pattern are mutually adjacent, there is a limit in that the first pattern and second pattern are manufactured and an insulation property is assured between the first pattern and the second pattern.

The present invention provides a transparent electrode member that can improve the invisibility of the pattern of a transparent electrode and also providing a capacitive sensor that has the transparent electrode member.

In one aspect, a transparent electrode member in the present invention has: a base material having a translucent property; a transparent electrode having a translucent property, the transparent electrode being placed on a first surface, which is one of the surfaces of the base material; and an insulating layer placed in an insulating region positioned in at least part of the circumference of a region in which the transparent electrode is placed, when viewed from the direction of the normal to the first surface. The transparent electrode has a dispersion layer that includes a matrix composed of an insulating material and also includes conductive nanowires dispersed in the matrix. The transparent electrode has a conductive region composed of a conductive part and optical adjustment regions composed of optical adjustment parts when viewed from the direction of the normal to the first surface. The conductivity of the conductive region is higher than the conductivity of the optical adjustment part. In the dispersion layer, the dispersion density of conductive nanowires in the optical adjustment part is lower than that in the conductive part.

In this transparent electrode member, since, in the dispersion layer included in the transparent electrode, conductive nanowires are dispersed in the matrix and are mutually linked, it is achieved to attain high conductivity, when compared with other transparent electrode materials, particularly oxide-based conductive materials. Since the conductive nanowire itself has no translucent property, a high dispersion density of the conductive nanowires in the dispersion layer causes the reflectance of the transparent electrode to tend to become high. That is, since, in the transparent electrode having the dispersion layer, the dispersion density of the conductive nanowires affects both conductivity and reflectance, there is a tradeoff between increasing conductivity and lowering reflectance. Therefore, when the transparent electrode is structured so as to have a conductive region the conductivity of which is relatively high and also have optical adjustment regions the reflectance of which is relatively low, it is achieved to reduce the reflectance of the transparent electrode and increase its invisibility while the conductivity of the transparent electrode is maintained.

In the transparent electrode member described above, it is preferable for the reflectance of the insulating region to be lower than the reflectance of the conductive region. In this case, the difference in reflectance between the insulating region and the transparent electrode, the reflectance of which has been lowered as a whole by providing the optical adjustment regions, becomes lower than when no optical adjustment part is provided. Therefore, it becomes difficult to visually recognize the boundary between the transparent electrode and the insulating region, so the invisibility of the transparent electrode can be enhanced.

The insulating layer may include the matrix. In this structure, there is a proximity between the optical properties (such as a refractive index) of the optical adjustment part other than the reflectance and the optical properties of the insulating layer. Therefore, when, for example, there is an image visually recognized through the transparent electrode member, the evenness of the display of the image is easily enhanced and the invisibility of the transparent electrode can thereby be more stably improved.

In the transparent electrode member described above, the optical adjustment region may be positioned in the conductive region. In this structure, there is no portion in which the optical adjustment region comes into direct contact with the insulating region. Therefore, it is possible to use the conductive region to appropriately form conductive paths in the transparent electrode, making it possible to suppress a drop in the conductivity of the transparent electrode.

In the transparent electrode member described above, it is sometimes preferable for the area ratio (also referred to below as the adjustment ratio) of the optical adjustment regions to be preferably 40% or less. As described above, the conductivity of the transparent electrode having the dispersion layer including conductive nanowires is easier to enhance than the conductivity of transparent electrodes made of an oxide-based conductive material. With the optical adjustment part, conductivity tends to be relatively lowered as a tradeoff for lowering reflectance. However, even if the adjustment ratio is increased to about 40% to improve the invisibility of the transparent electrode, conductivity demanded for the transparent electrode can be assured.

In the transparent electrode member described above, it is preferable for the optical adjustment regions to have a plurality of partial regions that are discretely positioned in the conductive region. If the optical adjustment regions and conductive region that have relatively different translucent properties form a large pattern separately, it is feared that the visibility of the pattern is increased depending on the shape of the pattern. Also, since the optical adjustment part is a region having relatively low conductivity, if a set of optical adjustment parts is positioned in the transparent electrode, a conductive path meandering in the transparent electrode may be formed. Therefore, the conductivity of the transparent electrode may be lowered. Therefore, when partial optical adjustment regions are discretely placed in the conductive region as described above, it is suppressed that a pattern that is likely to be visually recognized is formed in the transparent electrode and conductively is essentially lowered. Also, if a plurality of transparent electrodes are placed with insulating regions intervening between them as will be described later, the visibility of the insulating region may be enhanced due to the difference of the reflectance of the insulating region positioned between the plurality of transparent electrodes from the reflectance of the conductive part in the transparent electrode. Even in this case, since optical adjustment regions having relatively low reflectance are discretely placed in the conductive region of the transparent electrode, it is possible to improve the invisibility of the transparent electrode placed in a state in which at least part is enclosed by the insulating region.

In the transparent electrode member described above, it is sometimes preferable for the plurality of partial regions to be separated 30 μm or more from one another. This separation distance is, that is, the width of the conductive region positioned between optical adjustment parts that are discretely placed, so the separation distance is the width of an individual conductive path in the transparent electrode. Therefore, when the separation distance is 30 μm or more, a drop in the conductivity of the transparent electrode is stably suppressed.

When partial regions having optical adjustment regions are discretely placed, the shape of each of the plurality of partial regions may be a circle. The diameter of the circle may be 10 μm or more and 100 μm or less. To stably improve the invisibility of the transparent electrode, it is preferable that the shapes of the plurality of partial regions described above be uniform in the transparent electrode. If the shape of this partial region is a circle and its diameter is within the above range, it can be easily achieved to set the separation distance between the plurality of partial regions to 30 μm or more with the adjustment ratio being 40% or less.

The shape of each of the plurality of partial regions may be a quadrangle instead of a circle. In this case, it is preferable that the length of the longest diagonal line of the quadrangle be 10 μm or more and 100 μm or less due to a reason similar to the above reason.

The plurality of partial regions may be placed across the whole of the transparent electrode. In this case, a large pattern based on the presence of regions differing in reflectance in the transparent electrode is less likely to be created. Therefore, variations in reflectance are less likely to occur in the whole of the transparent electrode, so the invisibility of the transparent electrode is likely to be improved, which is preferable.

In the transparent electrode member described above, a plurality of transparent electrodes may be placed on the first surface, a transparent wire composed of a material having a translucent property may be further provided, and the transparent wire may electrically connect the plurality of transparent electrodes. In this case, the plurality of transparent electrodes are covered by insulating regions except for portions connected by the transparent wire. That is, a region composed of the transparent electrodes and a region composed of the insulating regions and transparent wire are present on the first surface of the transparent electrode member. Even in this case, since the translucent property of the transparent electrode is appropriately enhanced, patterns based on these regions are less likely to be visually recognized.

In the transparent electrode member described above, the transparent electrode may have a plurality of first transparent electrodes that are arranged along a first direction, which is one of the in-plane directions of the first surface, the plurality of first transparent electrodes being mutually connected electrically, and may also have a plurality of second transparent electrodes that are arranged along a second direction, which is another one of the in-plane directions of the first surface, the plurality of second transparent electrodes being mutually connected electrically. The transparent wire may have a first transparent wire that electrically connects the plurality of first transparent electrodes may also have a second transparent wire that electrically connects the plurality of second transparent electrodes. The first transparent wire and second transparent wire may have an overlapping portion in the direction of the normal to the first surface with an insulator intervening between them. If the transparent electrode member has this structure, a region composed of the transparent electrode and a region including the insulating regions and transparent wire are present on the first surface of the transparent electrode member. In the region including the transparent wire, a region including the first transparent wire, a region including the second transparent wire, and a region in which the two transparent wires are laminated are present. Even in this case, since the invisibility of the transparent electrode has been appropriately enhanced, a pattern is less likely to be visually recognized on the first surface. In particular, if the optical adjustment regions are present in the conductive area as a plurality of partial regions as described above, ease of visual identification between the region composed of the transparent electrode and the region including the transparent wire is more stably lowered, which is preferable.

In the transparent electrode member described above, a dummy region having a translucent property, the dummy region being enclosed by the insulating layer (therefore, the dummy region is not electrically connected to any of the first transparent electrode and second transparent electrode), may be provided between the first transparent electrode and the second transparent electrode. In this case, to enhance the invisibility of the dummy region, it is preferable that the length of the dummy region be 70 μm or more in a separation direction in which the first transparent electrode and second transparent electrode are separated by the dummy region, the dummy region have a dummy conductive region having a structure in common with the conductive region in the transparent electrode and also have dummy optical adjustment regions having a structure in common with the optical adjustment region in the transparent electrode, and the minimum separation distance Df, which is the distance from the insulation layer to the dummy optical adjustment region at the position closest to the insulating layer, satisfy the following relationship:

$$Df>0$$

When the minimum separation distance Df is larger than 0, this means that the insulating layer and any dummy optical adjustment region are not in direct contact with each other and there is no contiguous portion between the insulating layer and any dummy optical adjustment region.

If Df is larger than 0, to more stably enhance the invisibility of the dummy region, it is preferable that the optical adjustment regions in the transparent electrode have a plurality of partial regions that are discretely positioned in the conductive region in the transparent electrode and that the minimum separation distance Df and the inter-closest-region separation distance D0, which is the separation distance between each two partial regions of the plurality of partial regions, the two partial regions being placed at the closest positions, satisfy the following relationship:

$$0.5 \leq Df/D0 \leq 2.5$$

If Df is greater than 0, to more stably enhancing the invisibility of the dummy region, it is preferable that the area ratio AA0 of the optical adjustment regions in the transparent electrode and the area ratio AAf of the dummy optical adjustment regions in the dummy region satisfy the following relationship:

$$AAf/AA0<1$$

To more stably enhancing the invisibility of the dummy region, it is preferable for the following relationship be satisfied:

$$0.3 \leq AAf/AA \leq 0.95$$

When the dummy region is provided as described above, if the length of the dummy region in a direction in which the first transparent electrode and second transparent electrode are separated by the dummy region is 100 μm or less, to enhance the invisibility of the dummy region, it is sometimes preferable for the dummy region to be composed of a dummy conductive region having a structure in common with the conductive region in the transparent electrode.

It is sometimes preferable for the transparent electrode to have a non-adjustment region, in which no optical adjustment part is provided, in a region positioned around the transparent wire. Insulating regions are likely to be positioned relatively closely in a region around the region in which the transparent wire is placed. If the reflectance of the insulating region is lower than the reflectance of the conductive part, even if the reflectance of the transparent electrode positioned in the region around the transparent wire is not actively lowered by using part of the transparent electrode positioned in the region around the transparent wire as optical adjustment parts, the reflectance in the region is lower than in other regions. Therefore, the non-adjustment region may be provided in the region around the transparent wire. Although the reflectance of the optical adjustment part 112 is relatively lowered, in the region around the transparent wire, a current tends to become high during usage. Accordingly, when the non-adjustment region is provided, it is possible to lower the possibility that a problem such as the blowout of a conductive nanowire due to current concentration occurs.

In the dispersion layer in the optical adjustment part in the transparent electrode member, the dispersion density of conductive nanowires may be lowered to an extent in which an insulation property is still exhibited. Since, in this structure (also referred to below as the first structure), conductive nanowires have been essentially removed from the dispersion layer in the optical adjustment part, the reflectance of the optical adjustment part is particularly lowered. Therefore, the invisibility of the whole of the transparent electrode can be enhanced without increasing the adjustment ratio. In this case, if the insulating layer placed in the insulating region includes the matrix of optical adjustment parts, the insulating layer and optical adjustment part are composed of essentially the same material. Therefore, the structure of the transparent electrode member is such that members placed in regions positioned around the conductive region, the reflectance of these regions being low, are composed of a common material. When the transparent electrode member has this structure, the invisibility of the transparent electrode may be particularly improved.

In the transparent electrode member described above, the optical adjustment part may have higher conductivity than the insulating layer. In this structure (also referred to below as the second structure), the conductivity of the whole of the transparent electrode can be increased. Also, in this case, since the difference in the dispersion density of conductive nanowires between the dispersion layer in the optical adjustment part and the dispersion layer in the conductive part becomes relatively small, a pattern formed by the optical adjustment parts and conductive part in the transparent electrode becomes less likely to be visually recognized.

As another aspect, the present invention provides a method of manufacturing the transparent electrode member in the first structure described above. This manufacturing method has: a step of preparing a first laminated body in which a layer in which silver nanowires are dispersed in the matrix is laminated on the first surface as the dispersion layer; a step of covering part of the dispersion layer in the first laminated body with a resist layer; a step of processing a first region, which is not covered by the resist layer, in the dispersion layer with an iodine liquid so that at least part of the silver nanowires present in the first region is iodinated to a silver iodide and the dispersion layer positioned in the first region is thereby made insulative; a step of processing the first region with a thiosulfate solution to remove at least part of the silver iodide from the first region; and a step of removing the resist layer to obtain a member in which the optical adjustment parts having an insulation property and the insulating layer are provided in the first region and the conductive part is provided in the region that has been covered by the resist layer.

When this manufacturing method is used, the insulating layer and optical adjustment parts can be manufactured by one-time resist working. Therefore, the transparent electrode member can be efficiently manufactured. Also, since the optical properties of the insulating layer and optical adjustment part become equal, a pattern formed by the transparent electrode and insulating regions becomes less likely to be visually recognized. Therefore, a transparent electrode member having particularly high invisibility may be obtained.

As another aspect, the present invention provides a method of manufacturing the transparent electrode member in the second structure described above. This manufacturing method has: a step of preparing a first laminated body in which a layer in which silver nanowires are dispersed in the matrix is laminated on the first surface as the dispersion layer; a step of covering part of the dispersion layer in the first laminated body with a first resist layer; a step of processing a first region, which is not covered by the first resist layer, in the dispersion layer with an iodine liquid so that at least part of the silver nanowires present in the first region is iodinated to a silver iodide and the dispersion layer positioned in the first region is caused to function as the insulating layer; a step of processing the first region with a thiosulfate solution to remove at least part of the silver iodide from the first region; a step of removing the first resist layer to obtain an intermediate member having the insulating layer in the first region; a step of covering a second region with a second resist layer, the second region being part of the region that has been covered by the first resist layer; a step of processing a third region with an iodine liquid, the third region being a region that has been covered by the first resist layer but is not covered by the second resist layer, so that at least part of the silver nanowires present in the third region is iodinated to a silver iodide and the conductivity of the third region is made lower than the conductivity of the second region; a step of processing the third region with a thiosulfate solution to remove at least part of the silver iodide from the third region; and a step of removing the second resist layer to obtain a member in which the insulating layer is provided in the first region, the conductive part is provided in the second region, and the optical adjustment parts having conductivity higher than the conductivity of the insulating layer and lower than the conductivity of the conductive part are provided in the third region.

When this manufacturing method is used, an optical adjustment part having a certain level of conductivity can be manufactured. Therefore, a transparent electrode member having a transparent electrode with high conductivity can be manufactured. When the manufacturing method described above is appropriately executed, silver nanowires present at positions at which they the most affect the visibility of a dispersion layer can be preferentially removed. Therefore, it is also possible to form an optical adjustment part having low reflectance and high conductivity. When an optical adjustment part of this type is formed, a transparent electrode member with higher conductivity and higher invisibility may be obtained.

As another aspect, the present invention provides a capacitive sensor that has the transparent electrode member described above and a detection unit that detects a change in capacitance generated between the transparent electrode and a manipulating body such as a finger of the manipulator. Since, in this capacitive sensor, the invisibility of the transparent electrode is high, it is possible to enhance the visibility of an image observed by the user through the capacitive sensor, and it is also possible to enhance display evenness.

According to the present invention, it is possible to provide a transparent electrode member that can improve the invisibility of the pattern of transparent electrode. Also, according to the present invention, a capacitive sensor that has the transparent electrode member is also provided.

DESCRIPTION OF THE PREFERRED EMBODIMENTS

Figure 1:
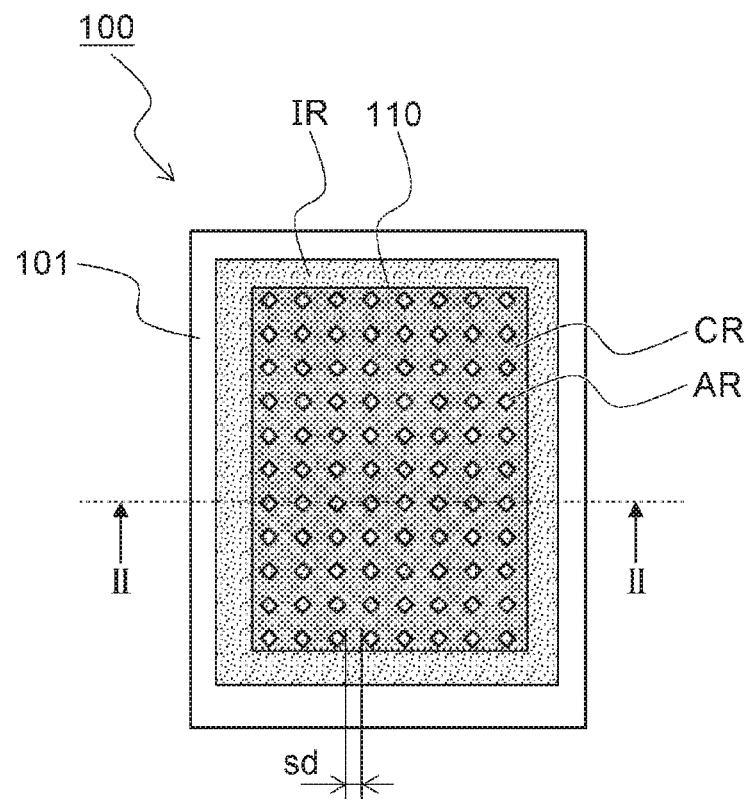
FIG. 1 is a plan view that conceptually illustrates the structure of a transparent electrode member according to an embodiment of the present invention.

An embodiment of the present invention will be described below with reference to the drawings. In the drawings, like elements are assigned like reference characters and detailed descriptions will be appropriately omitted.

Figure 2:
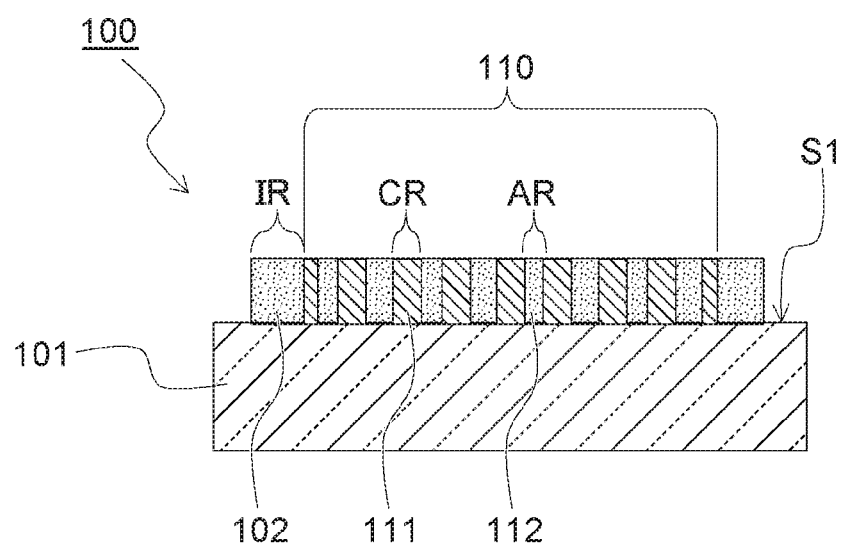
FIG. 2 is a cross-sectional view taken along line II-II in FIG. 1.
Figure 3:
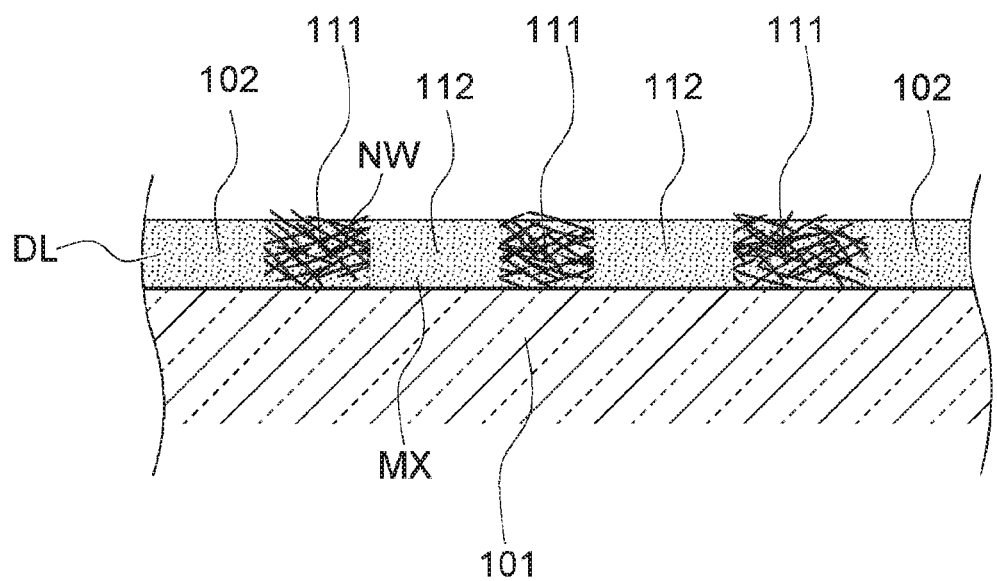
FIG. 3 is a partial cross-sectional view that conceptually illustrates a specific example of the structure of a transparent electrode of the transparent electrode member according to an embodiment of the present invention.
Figure 4:
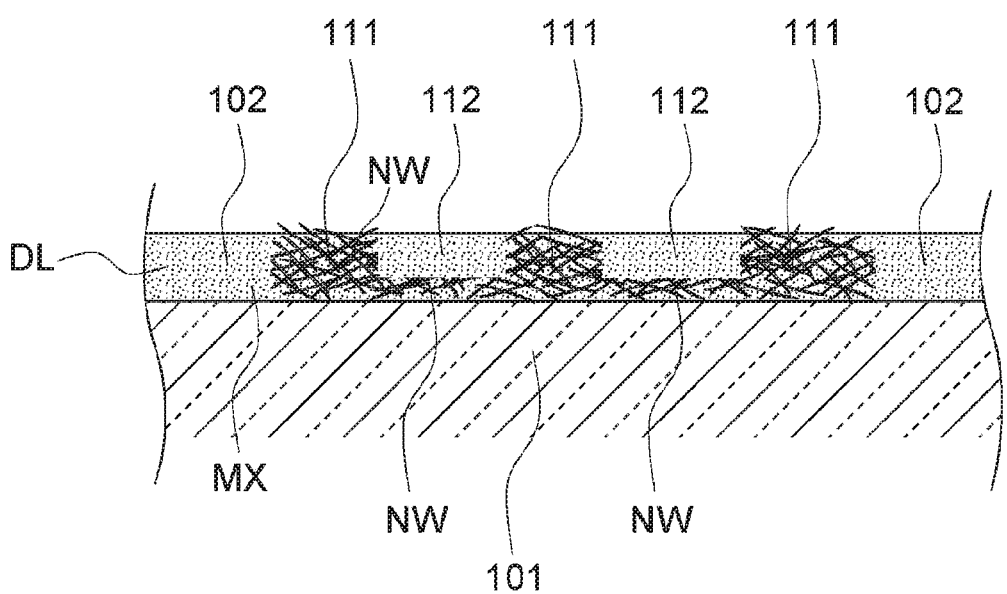
FIG. 4 is a partial cross-sectional view that conceptually illustrates another specific example of the structure of the transparent electrode of the transparent electrode member according to an embodiment of the present invention.

FIG. 1 is a plan view that conceptually illustrates the structure of a transparent electrode member according to an embodiment of the present invention. FIG. 2 is a cross-sectional view taken along line II-II in FIG. 1. FIG. 3 is a partial cross-sectional view that conceptually illustrates a specific example of the structure of a transparent electrode of the transparent electrode member according to an embodiment of the present invention. FIG. 4 is a partial cross-sectional view that conceptually illustrates another specific example of the structure of the transparent electrode of the transparent electrode member according to an embodiment of the present invention.

As indicated in FIGS. 1 and 2, the transparent electrode member 100 according to an embodiment of the present invention includes a base material 101 having a translucent property. In the specification of this application, "transparency" and "translucent property" indicate a state in which visible light transmittance is 50% or higher (preferably, 80% or higher). Furthermore, it is preferable for the haze value to be 6% or lower. In the specification of this application, "light shielding" and "light shielding property" indicate a state in which visible light transmittance is lower than 50% (preferably, lower than 20%). The base material 101 is formed from a glass base material or a transparent base material, such as polyethylene terephthalate (PET), in a film shape.

The transparent electrode member 100 includes a transparent electrode 110 having a translucent property and an insulating layer 102, which are placed on a first surface S1, which is one surface of the base material 101.

The insulating layer 102 is placed in an insulating region IR positioned in at least part of the circumference of a region in which the transparent electrode 110 is placed, when viewed from the direction of the normal to the first surface S1.

The transparent electrode 110 has a dispersion layer DL. The dispersion layer DL includes a matrix MX composed of an insulating material and also includes conductive nanowires NW in the matrix MX, as illustrated in FIG. 3 and FIG. 4. Specific examples of the insulating material forming the matrix MX include a polyester resin, an acrylic resin, a polyurethane resin, and the like. As the conductive nanowire NW, at least one selected from a group comprising a gold nanowire, a silver nanowire, and a copper nanowire is used. The dispersibility of the conductive nanowires NW is assured by the matrix MX. Since at least some of a plurality of conductive nanowires NW come into contact with one another, the conductivity of the transparent electrode 110 in its plane is maintained.

The transparent electrode 110 has a region (specifically, a conductive region) CR composed of a conductive part 111, and also has regions (specifically, optical adjustment regions) AR, each of which has an optical adjustment part 112, when viewed from the direction of the normal to the first surface S1, as indicated in FIGS. 1 and 2. The conductivity of the conductive part 111 is higher than the conductivity of the optical adjustment part 112. In the dispersion layer DL, the dispersion density of conductive nanowires NW in the optical adjustment part 112 is lower than in the conductive part 111.

In this structure, since conductive nanowires NW are dispersed in the matrix MX and are mutually linked in the dispersion layer DL that the transparent electrode 110 has, high conductivity can be attained when compared with other transparent electrode materials, particularly oxide-based conductive materials. However, since the conductive nanowire NW itself has no translucent property, a high dispersion density of the conductive nanowires NW in the dispersion layer DL causes the reflectance of the transparent electrode 110 to tend to become high. That is, since, in the transparent electrode 110 having the dispersion layer DL, the dispersion density of the conductive nanowires NW affects both conductivity and reflectance, there is a tradeoff between high conductivity and low reflectance. Therefore, when the transparent electrode 110 is structured so as to have the conductive region CR the conductivity of which is relatively high and also have the optical adjustment region AR the reflectance of which is relatively low, it is achieved to reduce the reflectance of the transparent electrode 110 and increase its invisibility while the conductivity of the transparent electrode 110 is maintained.

The reflectance of the optical adjustment region AR can be made lower than the reflectance of the conductive region CR without changing optical properties (such as a refractive index) other than the reflectance so much when compared with a case in which the transparent electrode has through-holes as described in PCT Japanese Translation Patent Publication No. 2016-514873 and PCT Japanese Translation Patent Publication No. 2010-157400. Therefore, when, for example, there is an image visually recognized through the transparent electrode member 100, the evenness of the display of the image can be enhanced. Furthermore, when the structure of the optical adjustment region AR is appropriately controlled, it is also possible to increase the conductivity of the optical adjustment region AR when compared with through-holes are formed in the transparent electrode 110. In this case, it is possible to increase the conductivity of the whole of the transparent electrode 110 and it is also possible to increase the area ratio of the optical adjustment regions AR in the transparent electrode 110. Therefore, when the optical adjustment regions AR are provided, it is achieved at a high order to increase the conductivity of the transparent electrode 110 and to increase its invisibility when compared with a case in which through-holes are provided.

It is preferable for the reflectance of the insulating region IR to be lower than the reflectance of the conductive region CR. In this case, the difference in reflectance between the insulating region IR and the transparent electrode 110, the reflectance of which has been lowered as a whole by providing the optical adjustment regions AR, becomes lower than when no optical adjustment part 112 is provided. Therefore, it becomes difficult to visually recognize the boundary between the transparent electrode 110 and the insulating region IR, so the invisibility of the transparent electrode 110 can be enhanced.

It is also preferable for the insulating layer 102 placed in the insulating region IR to include the matrix MX, which is one of the constituent elements of the dispersion layer DL. In this case, due to the sharing of the matrix MX, there is a proximity between the optical properties (such as a refractive index) of the optical adjustment part 112 other than the reflectance and the optical properties of the insulating layer 102. Therefore, when, for example, there is an image visually recognized through the transparent electrode member 100, the evenness of the display of the image is easily enhanced and the invisibility of the transparent electrode 110 can be more stably improved.

In the dispersion layer DL of the optical adjustment part 112 in the transparent electrode member 100, the dispersion density of conductive nanowires NW may be lowered to an extent in which an insulation property is still exhibited. FIG. 3 is a specific example of this structure (specifically, a first structure). In the dispersion layer DL of the optical adjustment part 112, no conductive nanowires NW are essentially present. The dispersion layer DL is composed of the matrix MX. In this case, since conductive nanowires NW, which are a material that increases reflectance, are not essentially present, the reflectance of the optical adjustment part 112 is particularly lowered. As illustrated in FIG. 3, the insulating layer 102 placed in the insulating region IR in the transparent electrode member 100 is composed of the matrix MX as in the dispersion layer DL of the optical adjustment part 112. In this case, the structure of the transparent electrode member 100 is such that members placed in regions (specifically, the insulating region IR and optical adjustment regions AR) positioned around the conductive region CR, the reflectance of the regions being low, are composed of a common material (specifically, the matrix MX). When the transparent electrode member 100 has this structure, the reflectance of the whole of the transparent electrode 110 is particularly low and the invisibility of the transparent electrode 110 is more stably improved.

Although, in FIG. 3, a case is indicated in which both the insulating layer 102 and the optical adjustment part 112 are composed of the matrix MX without the conductive nanowires NW essentially being present, this is not a limitation. If conductivity of both the insulating layer 102 and optical adjustment part 112 is appropriately lowered and they become non-conductive and can bring out an insulation function, conductive nanowires NW or materials based on the conductive nanowire NW may be still dispersed in the matrix MX.

In the transparent electrode member 100, the optical adjustment part 112 may have higher conductivity than the insulating layer 102. FIG. 4 illustrates a specific example of this structure (specifically, a second structure). In the dispersion layer DL of the optical adjustment part 112, the dispersion density of conductive nanowires NW is low on a side distant from the base material 101 (that is, on a side opposite to the user) and is high on a side close to the base material 101 (that is, on a side opposite to the base material 101). Although exposed conductive nanowires NW, which are part of the conductive nanowires NW dispersed in the dispersion layer DL, are most visible, if the dispersion layer DL of the optical adjustment part 112 has the structure illustrated in FIG. 4, the visibility of the optical adjustment part 112 can be appropriately lowered. Furthermore, although conductivity in the dispersion layer DL of the optical adjustment part 112 is lower than in the dispersion layer DL of the conductive part 111, a certain degree of conductivity can be assured due to the conductive nanowires NW positioned on the side close to the base material 101. Therefore, if the dispersion layer DL of the optical adjustment part 112 has the structure illustrated in FIG. 4, the conductivity of the whole of the transparent electrode 110 can be increased. In this case, since the difference in the dispersion density of conductive nanowires NW between the dispersion layer DL of the optical adjustment part 112 and the dispersion layer DL of the conductive part 111 becomes relatively small, patterns formed by the optical adjustment parts 112 and conductive part 111 in the transparent electrode 110 become less likely to be visually recognized.

Although, in FIG. 4, a case is indicated in which the dispersion density of conductive nanowires NW in the optical adjustment part 112 varies along the direction of the normal to the first surface S1, this is not a limitation. If conductivity of both the insulating layer 102 and optical adjustment part 112 is appropriately lowered and they become non-conductive and can bring out an insulation function, conductive nanowires NW or materials based on the conductive nanowire NW may be still dispersed in the matrix MX.

In the transparent electrode member 100, the optical adjustment regions AR are positioned in the conductive region CR as illustrated in FIG. 1. In this structure, there is no portion in which the optical adjustment region AR comes into direct contact with the insulating region IR. Therefore, it is possible to use the conductive region CR to appropriately form conductive paths in the transparent electrode 110, suppressing a drop in the conductivity of the transparent electrode 110. If there is a portion in which the optical adjustment region AR comes into direct contact with the insulating region IR, the conductive path formed in the transparent electrode 110 may meander. In this case, the conductivity of the transparent electrode 110 is lowered. If there is a portion in which the optical adjustment region AR is connected to the insulating region IR, invisibility may be lowered as will be described later.

In the transparent electrode member 100, the area ratio (that is, the adjustment ratio) of the optical adjustment regions AR is not limited. It is sometimes preferable for the adjustment ratio to be 40% or less as will be described later. The conductivity of the optical adjustment part 112 tends to be relatively lowered as a tradeoff for lowering reflectance. With the transparent electrode member 100 according to an embodiment of the present invention, however, even if the adjustment ratio is increased to about 40% to improve the invisibility of the transparent electrode 110, conductivity demanded for the transparent electrode 110 may be capable of being assured.

With the transparent electrode 110 according to an embodiment of the present invention, the optical adjustment regions AR occupy a plurality of partial regions that are discretely positioned in the conductive region CR. The optical adjustment region AR and conductive region CR have relatively different translucent properties. If the optical adjustment regions AR and conductive region CR form a large pattern separately, it is feared that the visibility of the pattern is increased depending on the shape of the pattern. Since the optical adjustment part 112 is a region with relatively low conductivity, if a collection of optical adjustment parts 112 is positioned in the transparent electrode 110, conductive paths meandering in the transparent electrode 110 may be formed. In this case, the conductivity of the transparent electrode 110 is lowered. Therefore, when partial regions composed of optical adjustment parts 112 with relatively low conductivity (that is, optical adjustment regions AR) are discretely placed in the conductive region CR as described above, it is suppressed that a pattern that is likely to be visually recognized is formed in the transparent electrode 110 and conductively is essentially lowered. If a plurality of transparent electrodes 110 are placed with insulating regions IR intervening between them as will be described later, since the reflectance of the insulating region IR positioned between transparent electrodes 110 differs from the reflectance of the conductive part 111 in the transparent electrode 110, the visibility of the insulating region IR may be increased. Even in this case, since optical adjustment regions AR are discretely placed in the conductive region CR of the transparent electrode 110, it is possible to improve the invisibility of the transparent electrode 110 placed in a state in which at least part of the transparent electrode 110 is enclosed by the insulating region.

It is sometimes preferable for the partial regions constituting the optical adjustment regions AR to be separated 30 μm or more from one another. That is, this separation distance denoted sd is the width of the conductive region CR positioned between optical adjustment parts 112 that are discretely placed, so the separation distance sd is the width of an individual conductive path in the transparent electrode 110. Therefore, when the separation distance sd is 30 μm or more, a drop in the conductivity of the transparent electrode 110 is stably suppressed.

When optical adjustment regions AR are discretely placed, the shape of each of a plurality of partial regions (that is, optical adjustment regions AR) may be a circle. The diameter of the circle may be 10 μm or more and 100 μm or less. To stably improve the invisibility of the transparent electrode 110, it is preferable that the shapes of the plurality of partial regions (that is, optical adjustment regions AR) described above be uniform in the transparent electrode 110. If the shape of this partial region (that is, the optical adjustment region AR) is a circle and its diameter is within the above range, it can be easily achieved to set the separation distance between the plurality of partial regions (that is, optical adjustment regions AR) to 30 μm or more with the adjustment ratio being 40% or less.

The shape of each of the plurality of partial regions (that is, optical adjustment regions AR) may be a quadrangle instead of a circle. In this case, it is preferable that the length of the longest diagonal line of the quadrangle be 10 μm or more and 100 μm or less due to a reason similar to the above reason.

If the plurality of partial regions (that is, optical adjustment regions AR) are placed across the transparent electrode 110, as illustrated in FIG. 1, variations are less likely to occur in reflectance in the whole of the transparent electrode 110, so the invisibility of the transparent electrode 110 is likely to be improved, which is preferable.

Figure 5:
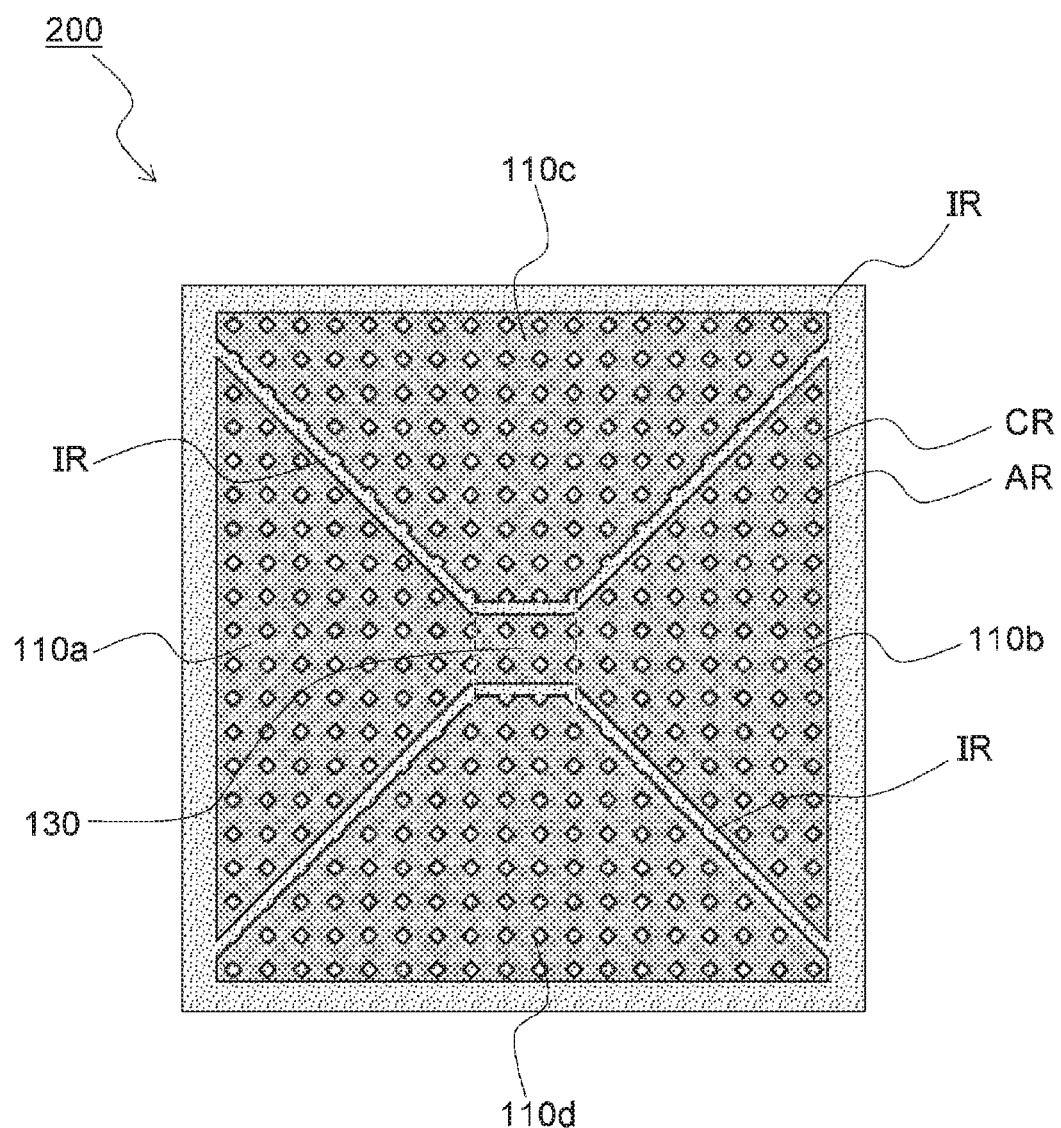
FIG. 5 is a plan view that conceptually illustrates the structure of an example of a transparent electrode member having a plurality of transparent electrodes.

FIG. 5 is a plan view that conceptually illustrates the structure of an example of a transparent electrode member having a plurality of transparent electrodes. As illustrated in FIG. 5, a transparent electrode member 200 according to an embodiment of the present invention has a plurality of transparent electrodes, 110a to 110d. Since insulating regions IR are positioned in at least part of the circumferential region around these transparent electrodes 110a to 110d, the transparent electrode 110a and transparent electrode 110b are electrically independent from each other and the transparent electrode 110c and transparent electrode 110d are electrically independent from each other. Specifically, insulating regions IR are positioned between the transparent electrode 110a and the transparent electrode 110c and between the transparent electrode 110b and the transparent electrode 110c and other insulating regions IR are positioned between the transparent electrode 110a and the transparent electrode 110d and between and transparent electrode 110b and the transparent electrode 110d. A transparent wire 130 composed of a material having a translucent property is positioned between the transparent electrode 110a and the transparent electrode 110b, electrically connecting the transparent electrode 110a and transparent electrode 110b together. In the transparent electrode member 200, the transparent wire 130 is formed from the dispersion layer DL as with the transparent electrode 110a and transparent electrode 110b, and has the conductive region CR and optical adjustment regions AR. In the transparent electrode member 200, a region composed of the transparent electrodes 110a to 110d and a region composed of insulating regions IR and the transparent wire 130 are present on the first surface S1. Even in this case, since the translucent property of the transparent electrodes 110a to 110d is appropriately enhanced, patterns based on these regions are less likely to be visually recognized.

Even if no optical adjustment region AR is provided in the transparent wire 130 as illustrated in FIG. 5, if the area of the transparent wire 130 is appropriately small, an influence on visibility can be lowered. Specifically, it is preferable for the length (width) of the transparent wire 130 in the minor-axis direction to have been set so as to be smaller than the lengths of the transparent electrode 110a and transparent electrode 110b connected to the transparent wire 130 in that direction.

Figure 6:
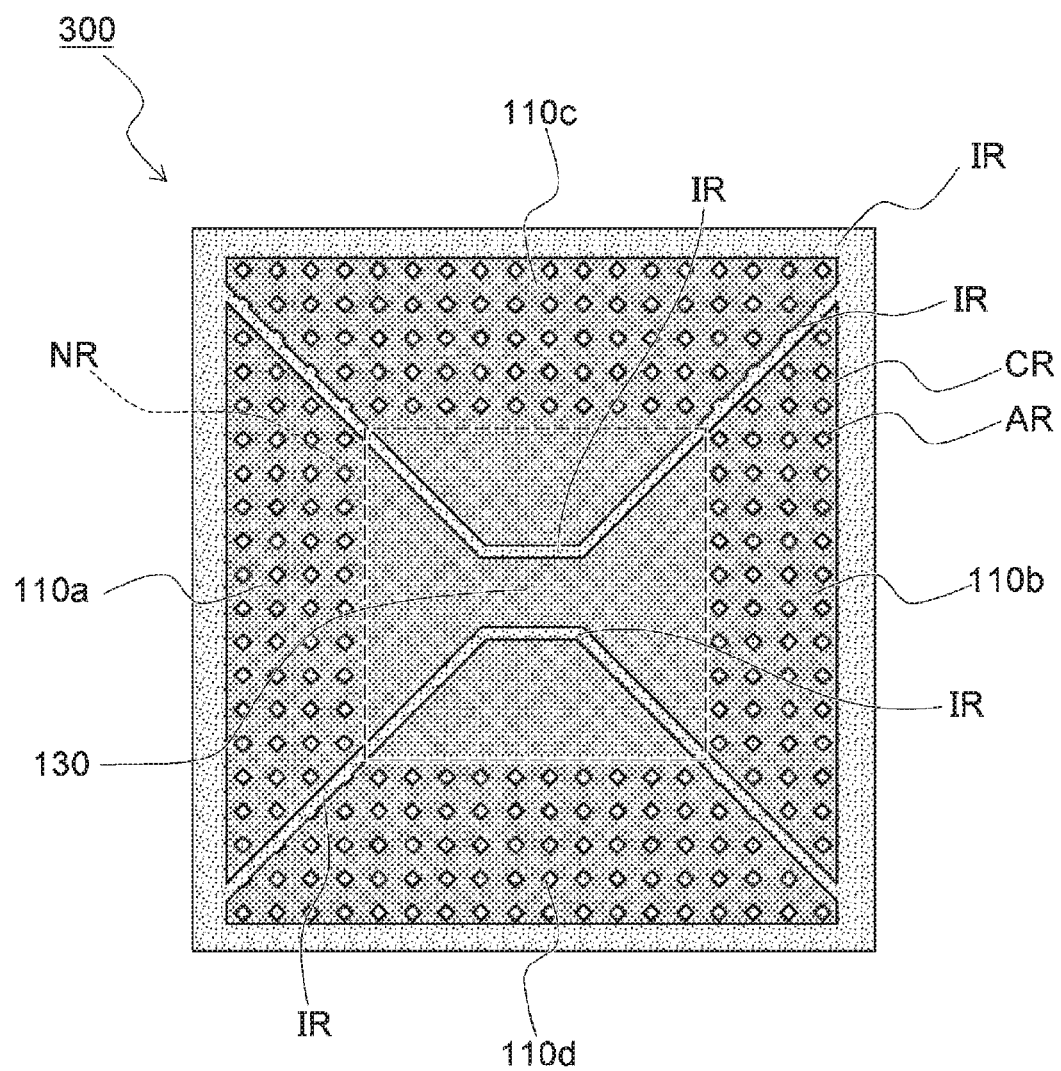
FIG. 6 is a plan view that conceptually illustrates the structure of another example of a transparent electrode member having a plurality of transparent electrodes.

FIG. 6 is a plan view that conceptually illustrates the structure of another example of a transparent electrode member having a plurality of transparent electrodes. As illustrated in FIG. 6, the transparent electrode 110a to transparent electrode 110d in a transparent electrode member 300 have a non-adjustment region NR, in which no optical adjustment part 112 is provided, in a region positioned around the transparent wire 130. In a region around the region in which the transparent wire 130 is placed, insulating regions IR are likely to be positioned relatively closely. Since the insulating layer 102 positioned in the insulating region IR is composed of the matrix MX, the reflectance of the insulating layer 102 is lower than the reflectance of the conductive part 111. Thus, even if part of each of the transparent electrode 110a to transparent electrode 110d positioned in the region around the transparent wire 130 is not formed as the optical adjustment part 112 to actively lower the reflectance of the transparent electrode 110 in that region, the reflectance in the region is lower than in other regions. Therefore, the non-adjustment region NR may be provided in the region around the transparent wire 130. Although the conductivity of the optical adjustment part 112 is relatively lowered, charges tend to concentrate in the region around the transparent wire 130 during usage. When the non-adjustment region NR is provided, however, it is possible to lower the possibility of the occurrence of a problem such as the blowout of the conductive nanowire NW due to charge concentration.

A method, according to an embodiment of the present invention, of manufacturing a transparent electrode member is not limited. When a manufacturing method described next is used, it may be possible to efficiently manufacture the transparent electrode member according to an embodiment of the present invention and to manufacture a high-quality transparent electrode member.

An example of the method, according to an embodiment of the present invention, of manufacturing a transparent electrode member is a method of manufacturing the transparent electrode member 100 in the first structure described above.

Figure 7:
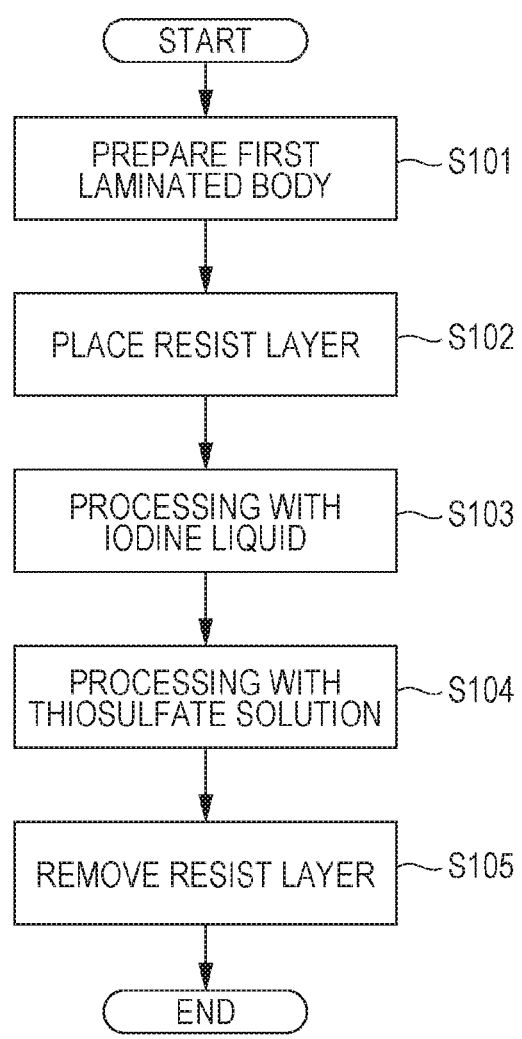
FIG. 7 is a flowchart of a method of manufacturing a transparent electrode member in a first structure.
Figure 8:
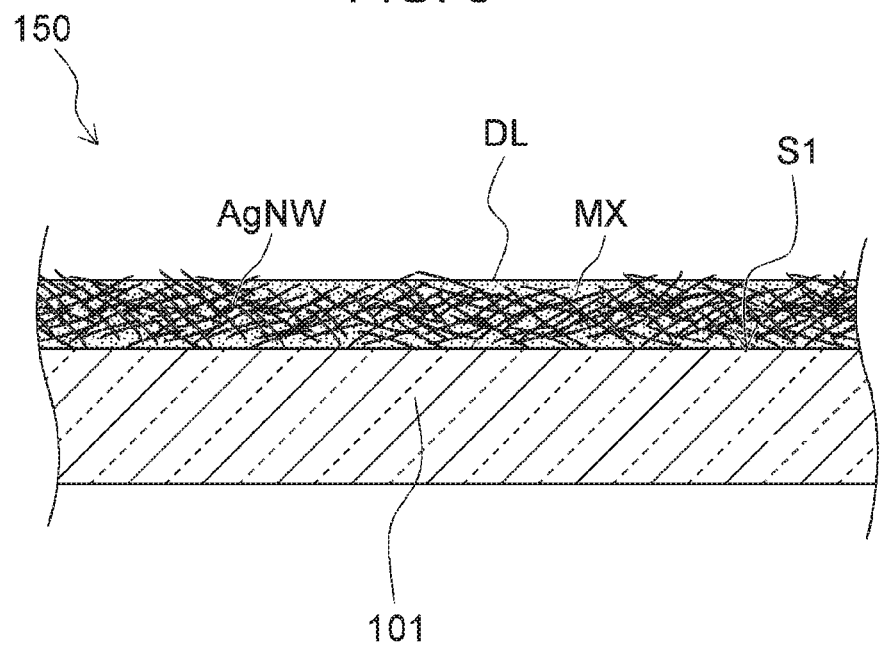
FIG. 8 is a cross-sectional view that conceptually illustrates a state in which a first laminated body is prepared.
Figure 9:
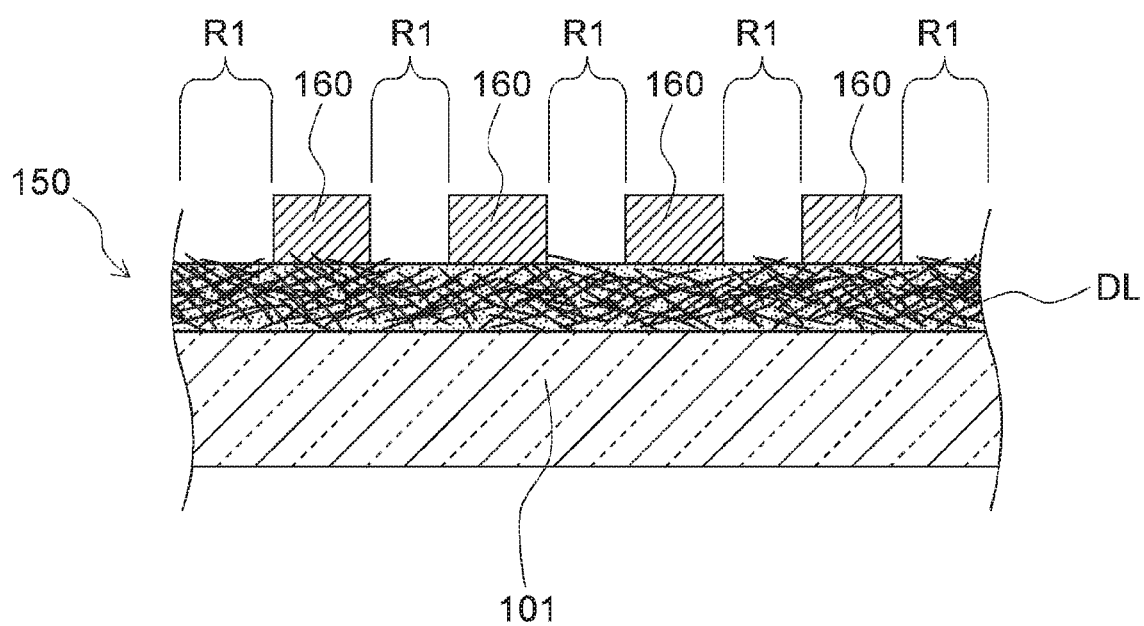
FIG. 9 is a cross-sectional view that conceptually illustrates a state in which a resist layer is placed on the first laminated body.
Figure 10:
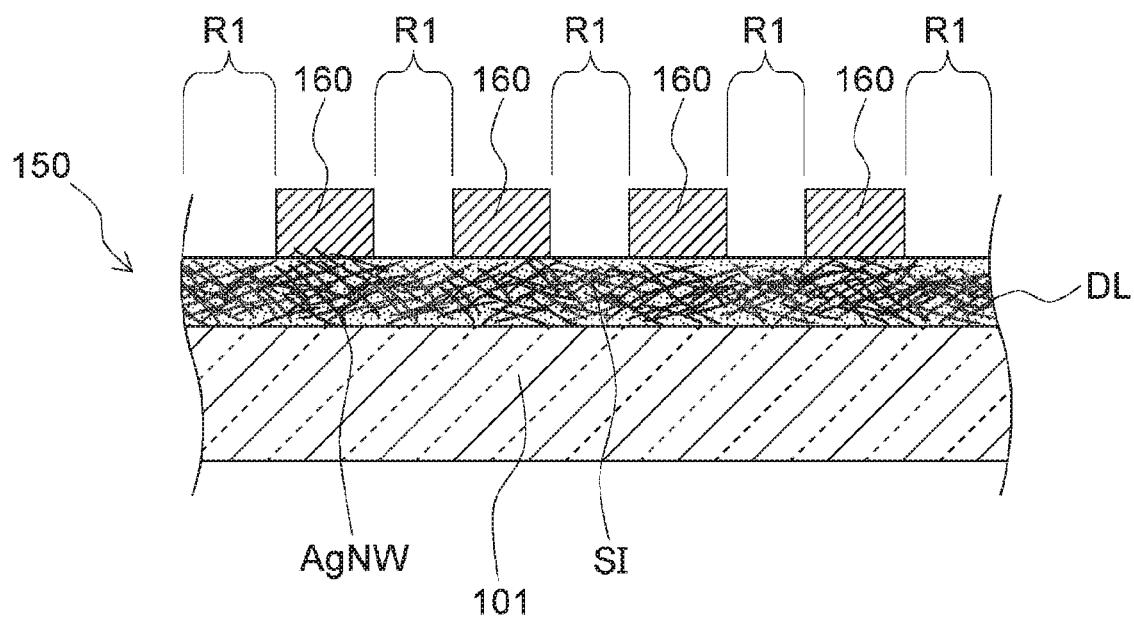
FIG. 10 is a cross-sectional view that conceptually illustrates a state in which processing based on an iodine liquid has been performed.
Figure 11:
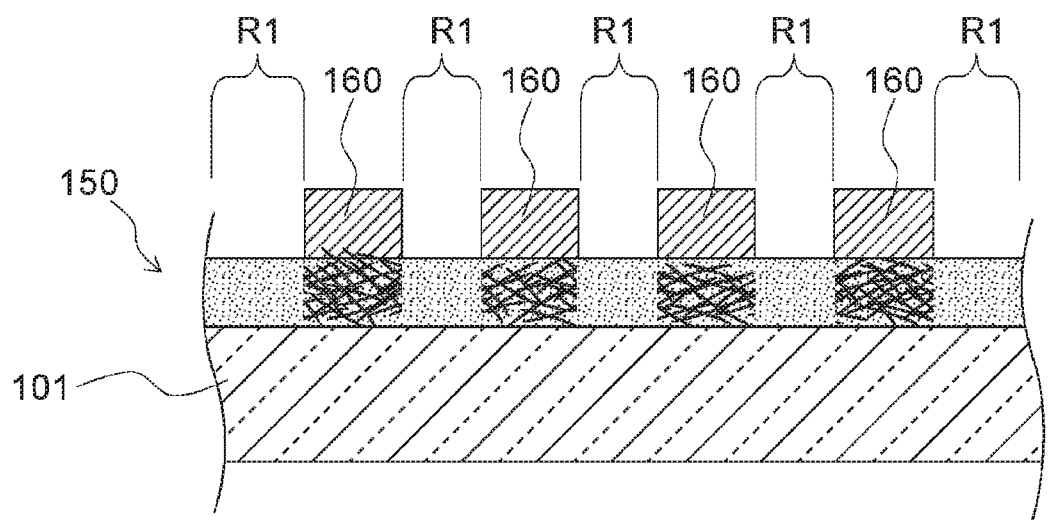
FIG. 11 is a cross-sectional view that conceptually illustrates a state in which processing based on a thiosulfate solution has been performed.
Figure 12:
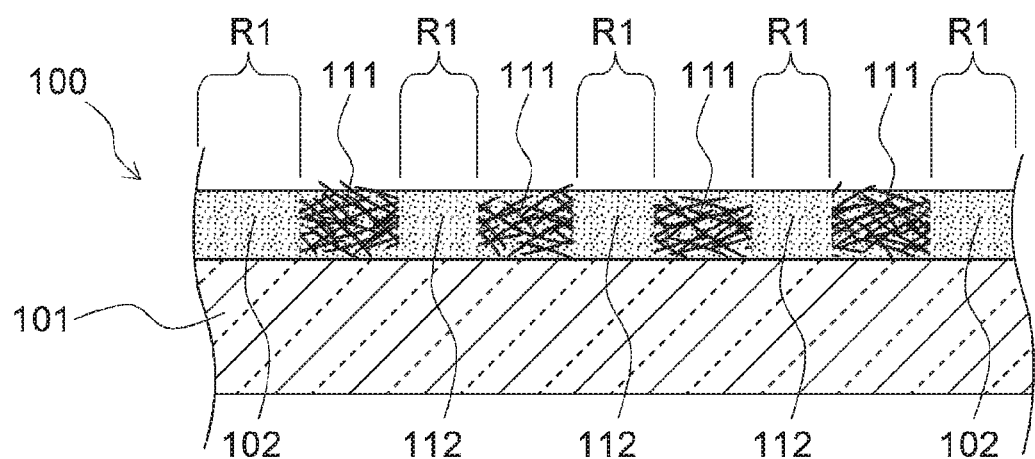
FIG. 12 is a cross-sectional view that conceptually illustrates a state in which the resist layer has been removed.

FIG. 7 is a flowchart of the method of manufacturing the transparent electrode member in the first structure. FIG. 8 is a cross-sectional view that conceptually illustrates a state in which a first laminated body is prepared. FIG. 9 is a cross-sectional view that conceptually illustrates a state in which a resist layer is placed on the first laminated body. FIG. 10 is a cross-sectional view that conceptually illustrates a state in which processing based on an iodine liquid has been performed. FIG. 11 is a cross-sectional view that conceptually illustrates a state in which processing based on a thiosulfate solution has been performed. FIG. 12 is a cross-sectional view that conceptually illustrates a state in which the resist layer has been removed.

First, a first laminated body 150 is prepared in which a layer in which silver nanowires AgNW, which are one type of conductive nanowires NW, are dispersed in the matrix MX is laminated on the first surface S1 of the base material 101 as the dispersion layer DL as illustrated in FIG. 8 (S101). In all regions, the dispersion density of the silver nanowires AgNW in this dispersion layer DL is equal to the dispersion density of the silver nanowires AgNW in the conductive part 111 of the transparent electrode member 100 that is finally obtained.

Next, part of the dispersion layer DL of the first laminated body 150 is covered with a resist layer 160 (S102). A positive-type or negative-type photoresist or a film resist is formed on the dispersion layer DL. The photoresist is formed by one of various methods such as a roll coat method so that the photoresist has a film thickness of about 1 µm to 5 µm. When a film resist is used, it is formed so as to have a film thickness of about 20 µm. The photoresist is partially exposed by using a mask and an exposure machine. When a conductive layer exposed in a subsequent development process is developed by using an alkaline liquid such as tetramethyl ammonium hydroxide (TMAH), the resist layer 160 partially remains as illustrated in FIG. 9.

Subsequently, a first region R1, which is not covered by the resist layer 160, in the dispersion layer DL is processed with an iodine liquid (S103). Due to this processing, at least part of silver nanowires AgNW present in the first region R1 is iodinated to a silver iodide SI as illustrated in FIG. 10, making the dispersion layer DL positioned in the first region R1 insulative.

The iodine liquid used in this processing is an iodine iodide solution. For example, the iodine liquid is an iodine potassium iodide solution. The iodine potassium iodide solution is such that iodine is dissolved in a potassium iodide solution. A solution including 0.05 to 1.0 mass % iodine and 0.1 to 5.0 mass % potassium iodide is used.

When the first laminated body 150 in which the resist layer 160 is formed is immersed in the iodine potassium iodide solution for about 0.5 to 10 minutes, the solution infiltrates into the interior of the dispersion layer DL in regions that are not covered by the resist layer 160 and at least part of the silver nanowires AgNW is iodinated and is transformed to a silver iodide SI.

In the first region R1, since silver nanowires AgNW are iodinated, the area resistivity of the dispersion layer DL in that region is increased, resulting in a state in which an insulation function that is essentially electrical can be brought out.

However, if an iodine potassium iodide solution is used for processing, silver nanowires AgNW in the dispersion layer DL are iodinated in the first region R1, and whitish or white metallic compounds (including a silver iodide SI) is created.

Therefore, the first region R1 is processed with a thiosulfate solution (S104). Due to this processing, at least part of the silver iodide SI is removed from the first region R1 as illustrated in FIG. 11. As the thiosulfate solution, a sodium thiosulfate solution with a concentration of 1.0 to 25 mass % is used. When the first laminated body 150 covered by the resist layer 160 is immersed in the sodium thiosulfate solution for about 10 to 60 seconds, the metallic compounds, such as a silver iodide SI, included in the dispersion layer DL in the first region R1 is removed. As a result, the translucent property of the dispersion layer DL positioned in the first region R1 is enhanced. Also, if a silver iodide SI exposed on the surface of the dispersion layer DL is exposed to oxygen for a long time, the silver iodide SI may return to sliver. If the silver iodide SI returns to silver, the reflectance of the optical adjustment part 112 becomes equivalent to the reflectance of the conductive part 111, and the optical adjustment function of the optical adjustment region AR in which the optical adjustment part 112 is positioned is lowered. Furthermore, if silver nanowires AgNW become whitish or white during iodination, contrast to the silver nanowires AgNW makes the obtained silver iodide SI noticeable. Therefore, it is preferable to perform processing as described above to remove metallic compounds, such as a silver iodide SI, positioned on the front surface side of the dispersion layer DL positioned in the first region R1.

Finally, the resist layer 160 is removed by using a resist stripping liquid (S105). As a result, the transparent electrode member 100 is obtained that has the insulative optical adjustment parts 112 and insulating layer 102 in the first region R1 and also has the conductive part 111 in the region that has been covered by the resist layer 160, as illustrated in FIG. 12.

When this manufacturing method is used, the insulating layer 102 and optical adjustment parts 112 can be manufactured by one-time resist working. Therefore, the transparent electrode member 100 can be efficiently manufactured. Also, in the transparent electrode member 100 in the first structure, the optical properties of the insulating layer 102 and optical adjustment part 112 become equal. Therefore, patterns formed by the transparent electrode 110 and insulating regions IR become less likely to be visually recognized. Therefore, the transparent electrode member 100 with particularly high invisibility may be obtained when the transparent electrode member 100 is manufactured by the manufacturing method described above.

Figure 36A:
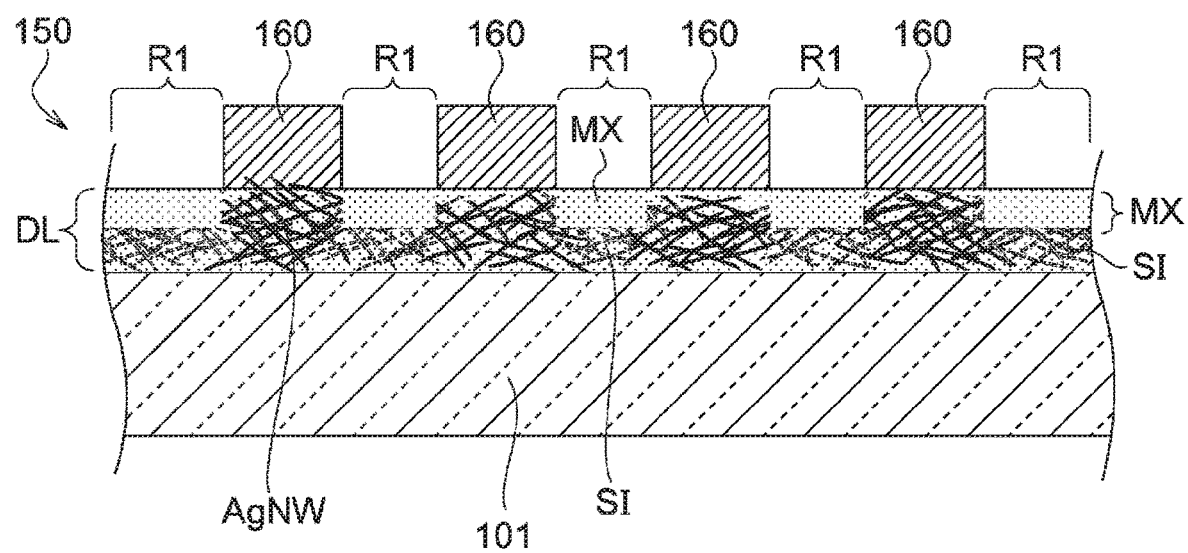
FIG. 36A illustrates a state in which processing based on a thiosulfate solution has been performed in a variation of the method of manufacturing the transparent electrode member in the first structure.
Figure 36B:
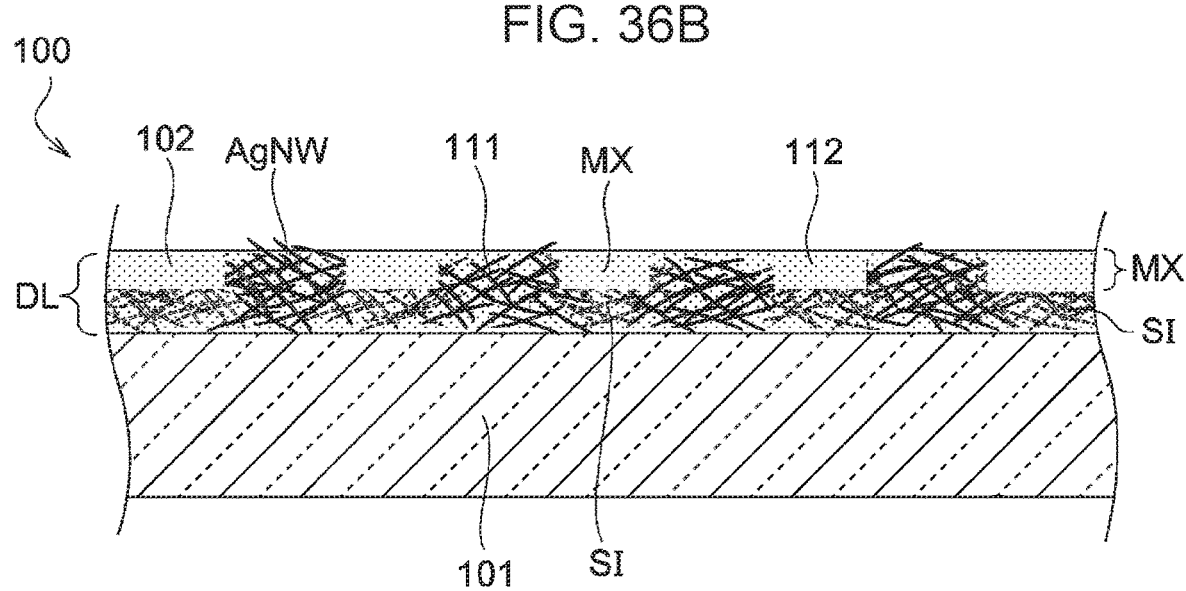
FIG. 36B is a cross-sectional view that conceptually illustrates a state in which the first resist layer has been removed and a transparent electrode member is obtained.

FIG. 36A illustrates a state in which processing based on a thiosulfate solution has been performed in a variation of the method of manufacturing the transparent electrode member in the first structure. FIG. 36B is a cross-sectional view that conceptually illustrates a state in which the first resist layer has been removed and a transparent electrode member is obtained. In thiosulfate solution processing (S104) subsequent to iodine liquid processing (S103), it is preferable to remove metallic compounds, such as a silver iodide SI, at distances from the base material 101, that is, on the front surface side of the dispersion layer DL, in the dispersion layer DL positioned in the first region R1, as illustrated in FIG. 36A. When, for example, time taken in processing based on a thiosulfate solution (for 5 to 30 seconds, as an example) is relatively shortened, it is possible to remove these metallic compounds, such as a silver iodide SI, positioned on the front surface side. When the resist layer 160 is then removed (S105), a structure is obtained in which, in the optical adjustment part 112, metallic compounds, such as a silver iodide SI, are removed from the front surface side of the dispersion layer DL, the dispersion layer DL is essentially composed of the matrix MX, and metallic compounds, such as a silver iodide SI, are left on the side close to the base material 101, as indicated in FIG. 36B.

In this structure in which metallic compounds such as a silver iodide SI are removed from the front surface side of the dispersion layer DL (that is, on the side distant from the base material 101) and metallic compounds such as a silver iodide SI are left on the side close to the base material 101, the optical adjustment part 112 and conductive part 111 become more difficult to visually identify. Therefore, the invisibility of the transparent electrode member 100 is improved. If a manufacturing method similar to that for the optical adjustment part 112 is executed for the insulating layer 102 to form a similar structure, this is preferable in that the manufacturing process is simplified. This is also preferable in that the insulating layer 102 is less likely to be visually recognized from the conductive part 111 (that is, invisibility is improved).

Another example of the method, according to an embodiment of the present invention, of manufacturing of a transparent electrode member is a method of manufacturing the transparent electrode member 100 in the second structure described above.

Figure 13:
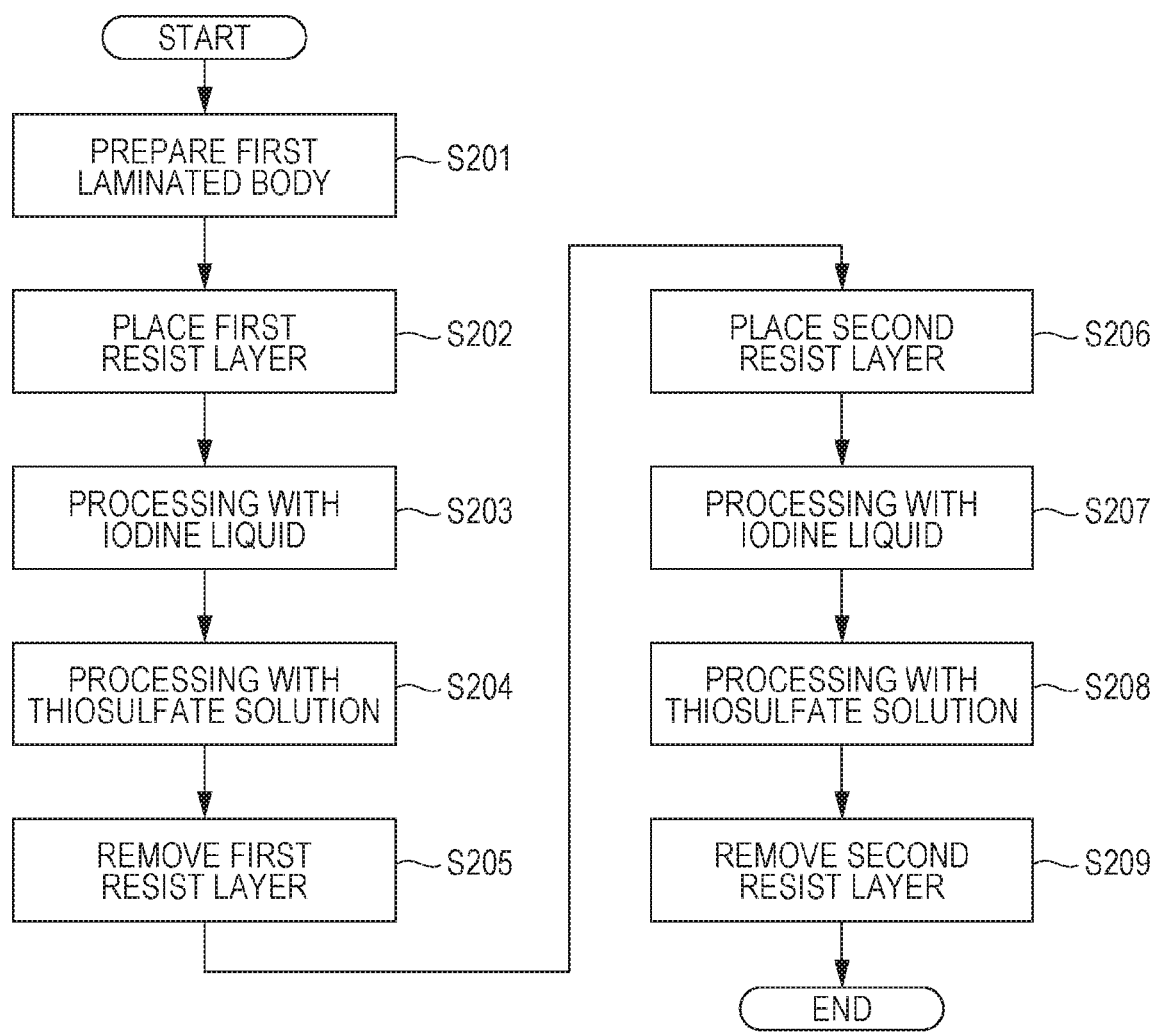
FIG. 13 is a flowchart of a method of manufacturing a transparent electrode member in a second structure.
Figure 14:
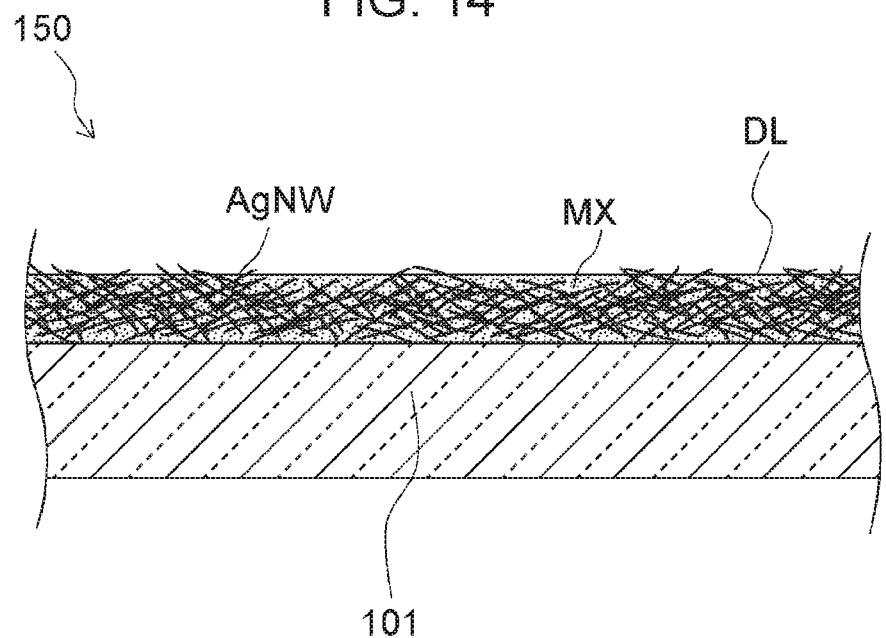
FIG. 14 is a cross-sectional view that conceptually illustrates a state in which the first laminated body is prepared.
Figure 15:
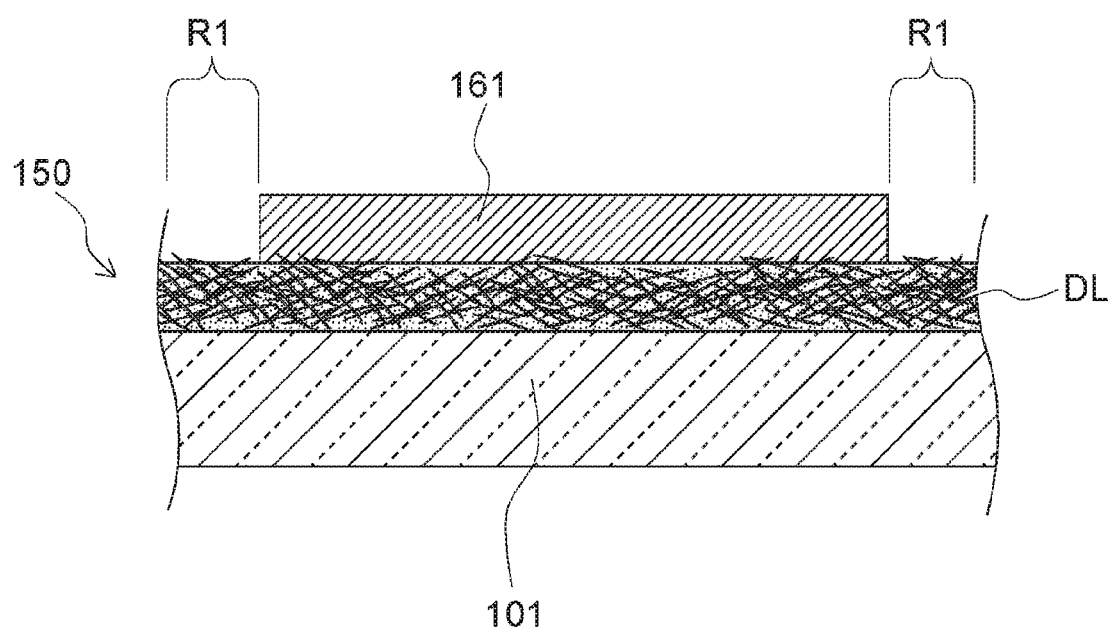
FIG. 15 is a cross-sectional view that conceptually illustrates a state in which a first resist layer is placed on the first laminated body.
Figure 16:
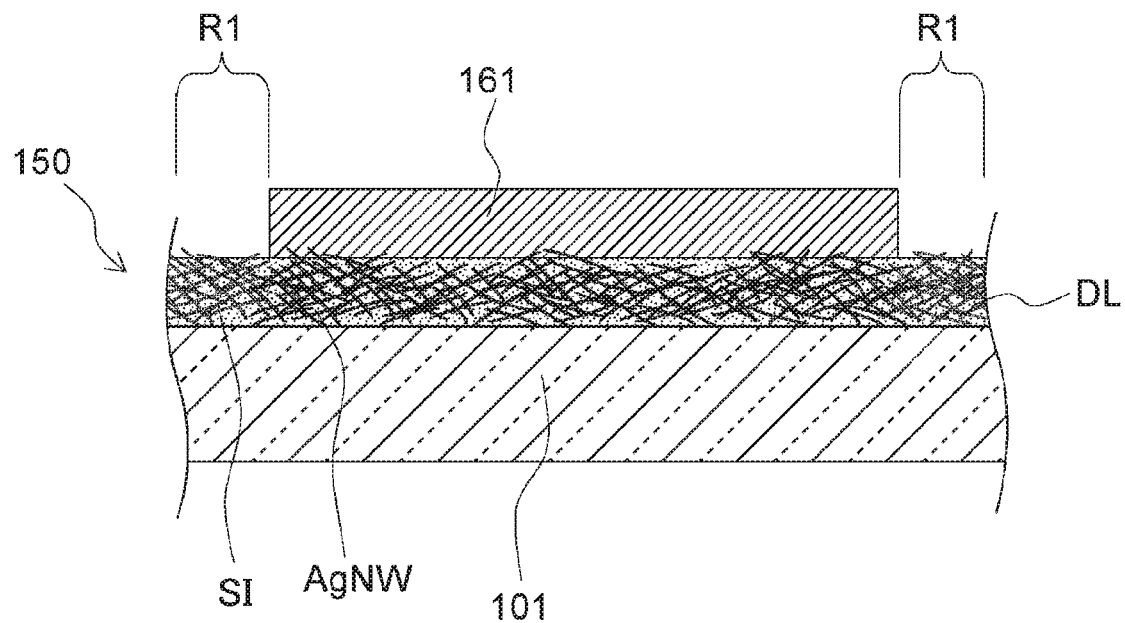
FIG. 16 is a cross-sectional view that conceptually illustrates a state in which processing based on an iodine liquid has been performed.
Figure 17:
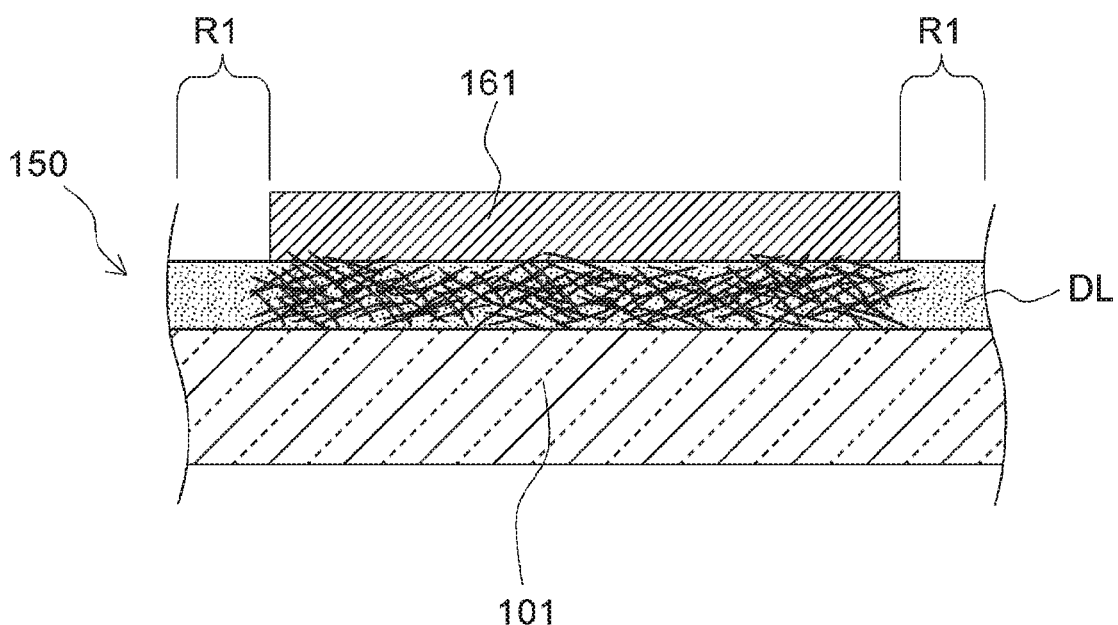
FIG. 17 is a cross-sectional view that conceptually illustrates a state in which processing based on a thiosulfate solution has been performed.
Figure 18:
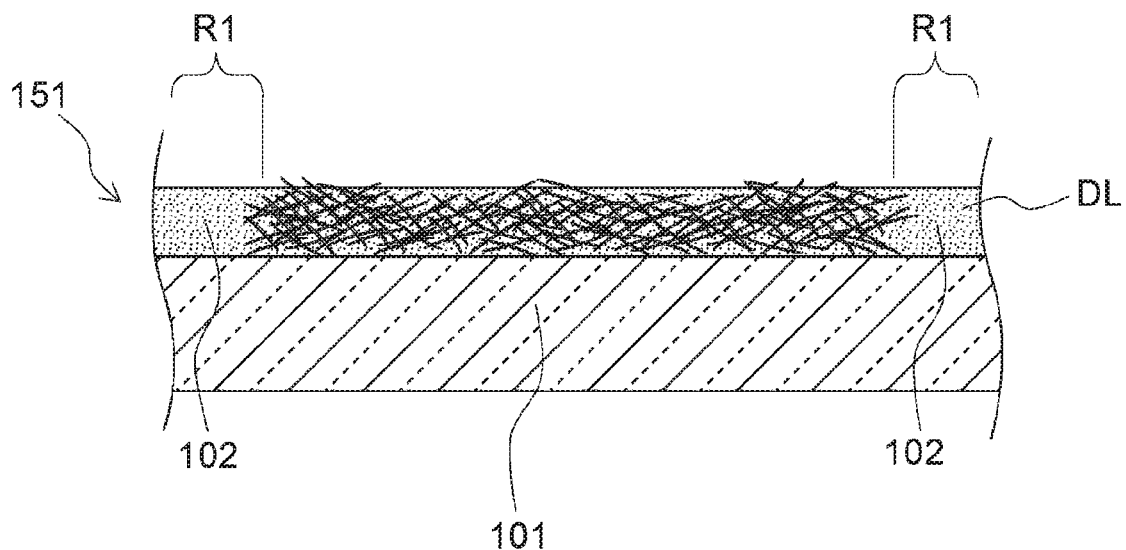
FIG. 18 is a cross-sectional view that conceptually illustrates a state in which the first resist layer has been removed.
Figure 19:
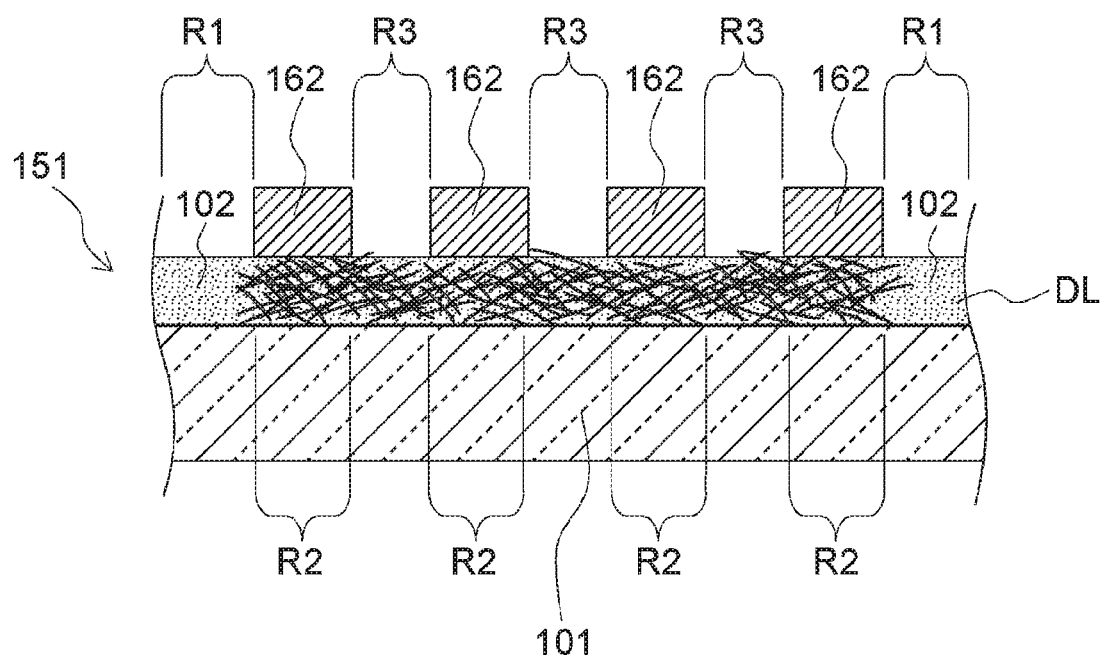
FIG. 19 is a cross-sectional view that conceptually illustrates a state in which a second resist layer is placed on the first laminated body.
Figure 20:
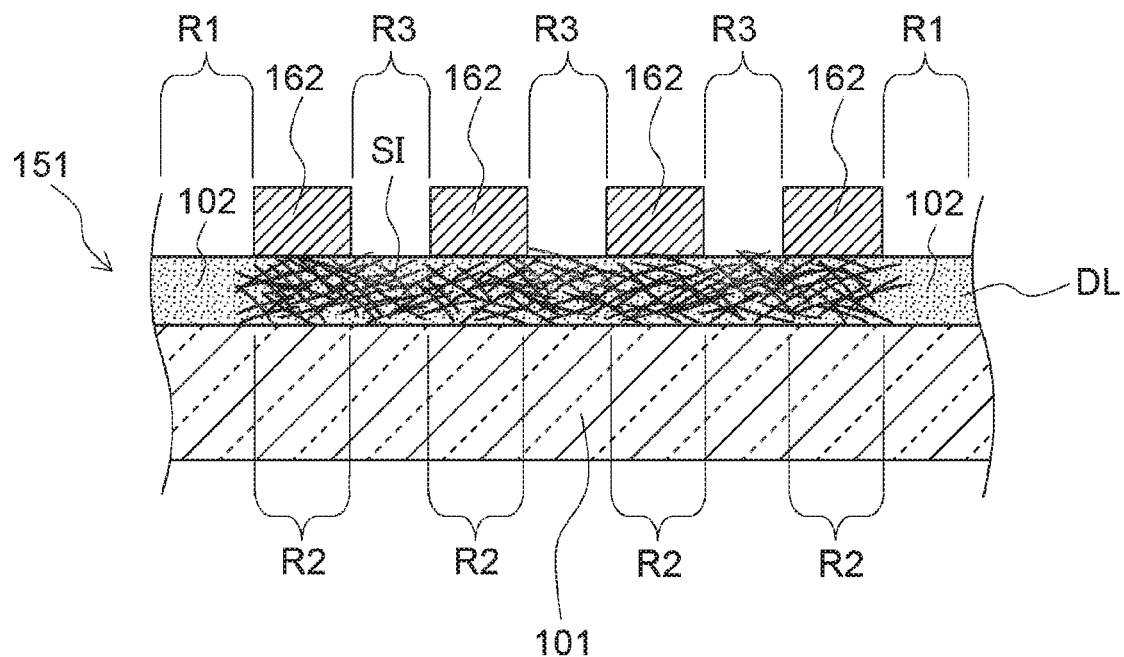
FIG. 20 is a cross-sectional view that conceptually illustrates a state in which processing based on an iodine liquid has been performed.
Figure 21:
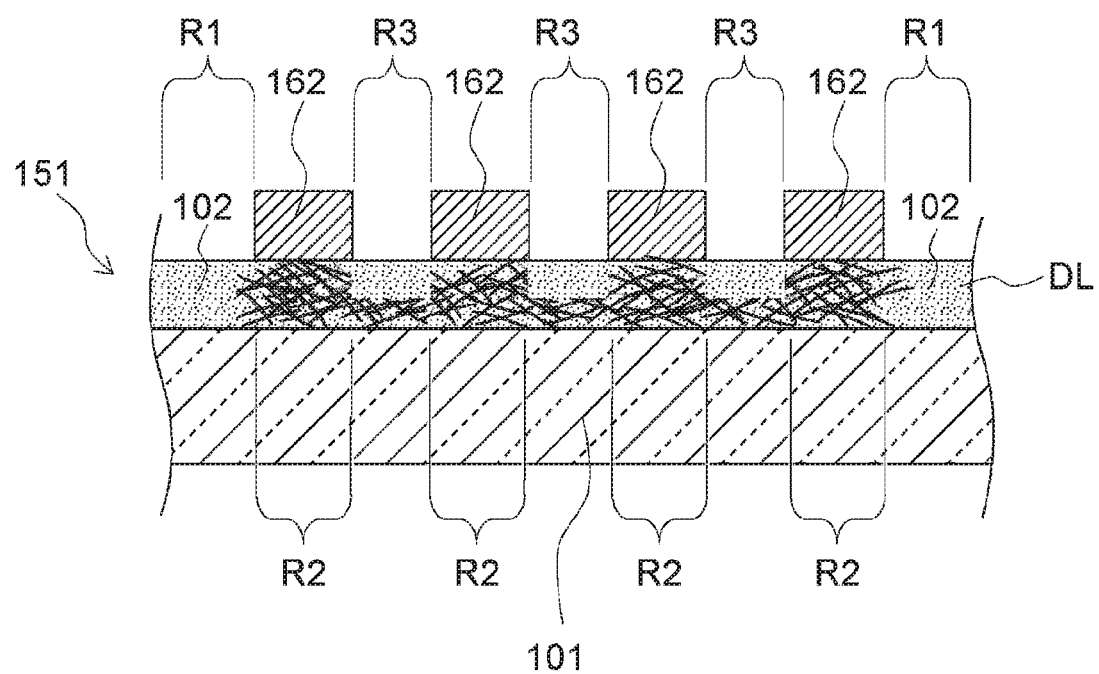
FIG. 21 is a cross-sectional view that conceptually illustrates a state in which processing based on a thiosulfate solution has been performed.
Figure 22:
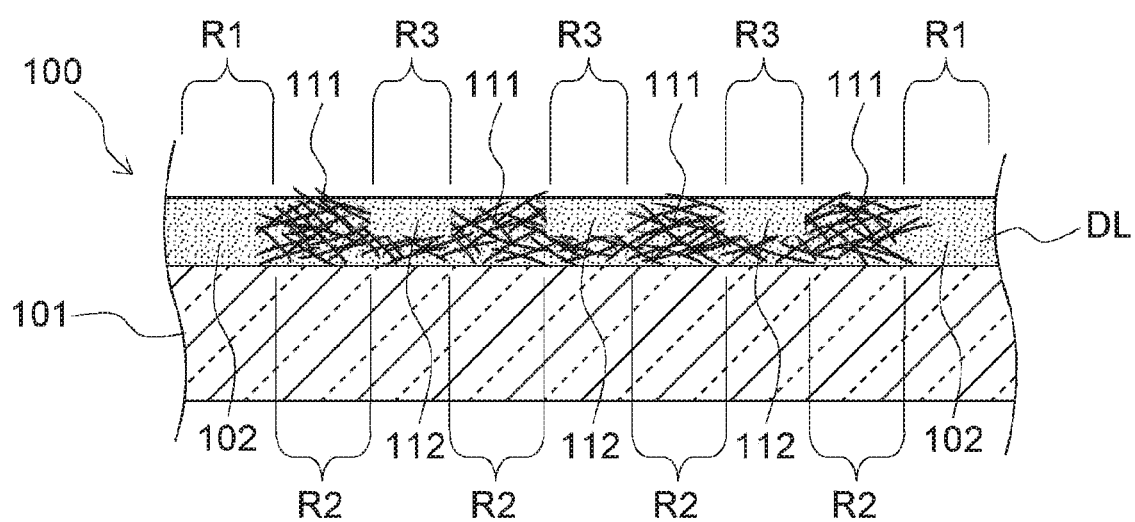
FIG. 22 is a cross-sectional view that conceptually illustrates a state in which the second resist layer has been removed.

FIG. 13 is a flowchart of a method of manufacturing a transparent electrode member in the second structure. FIG. 14 is a cross-sectional view that conceptually illustrates a state in which the first laminated body is prepared. FIG. 15 is a cross-sectional view that conceptually illustrates a state in which the first resist layer is placed on the first laminated body. FIG. 16 is a cross-sectional view that conceptually illustrates a state in which processing based on an iodine liquid has been performed. FIG. 17 is a cross-sectional view that conceptually illustrates a state in which processing based on a thiosulfate solution has been performed. FIG. 18 is a cross-sectional view that conceptually illustrates a state in which the first resist layer has been removed. FIG. 19 is a cross-sectional view that conceptually illustrates a state in which a second resist layer is placed on the first laminated body. FIG. 20 is a cross-sectional view that conceptually illustrates a state in which processing based on an iodine liquid has been performed. FIG. 21 is a cross-sectional view that conceptually illustrates a state in which processing based on a thiosulfate solution has been performed. FIG. 22 is a cross-sectional view that conceptually illustrates a state in which the second resist layer has been removed.

First, the first laminated body 150 is prepared in which a layer in which silver nanowires AgNW, which are one type of conductive nanowires NW, are dispersed in the matrix MX is laminated on the first surface S1 of the base material 101 as the dispersion layer DL, as illustrated in FIG. 14 (S201). In all regions, the dispersion density of the silver nanowires AgNW in this DL is equal to the dispersion density of the silver nanowires AgNW in the conductive part 111 of the transparent electrode member 100 that is finally obtained.

Next, part of the dispersion layer DL of the first laminated body 150 is covered with a first resist layer 161, as illustrated in FIG. 15 (S202). Details of the first resist layer 161 and a second resist layer 162, which will be referred to later, are common to the resist layer 160, so their details will be omitted.

Subsequently, the first region R1, which is not covered by the first resist layer 161, in the dispersion layer DL is processed with an iodine liquid (S203). Details of this processing are similar to those in the method of manufacturing the transparent electrode member 100 in the first structure, so a description of this processing will be omitted. Due to this processing, at least part of silver nanowires AgNW present in the first region R1 is iodinated to a silver iodide SI as illustrated in FIG. 16, making the dispersion layer DL in the first region R1 insulative.

Furthermore, the first region R1 is processed with a thiosulfate solution (S204). Details of this processing are similar to those in the method of manufacturing the transparent electrode member 100 in the first structure, so a description of this processing will be omitted. Due to this processing, at least part of the silver iodide SI is removed from the first region R1 as illustrated in FIG. 17. As a result, the translucent property of the dispersion layer DL in the first region R1 is enhanced.

Then, the first resist layer 161 is removed by using a resist stripping liquid (S205). As a result, an intermediate member 151 that has the insulating layer 102 in the first region R1 is obtained.

Subsequently, the transparent electrode member 100 is manufactured as the starting member of this intermediate member 151. First, a second region R2, which is part of the region that has been covered by the first resist layer 161 in the dispersion layer DL, is covered by the second resist layer 162, as illustrated in FIG. 19 (S206).

Next, a third region R3, which is a region that has been covered by the first resist layer 161 but is not covered by the second resist layer 162, is processed with an iodine liquid (S207). At that time, although the first region R1 is also processed with the iodine liquid, silver nanowires AgNW have been appropriately removed from the dispersion layer DL positioned in this region, so this processing based on the iodine liquid does not affect the first region R1. Due to this processing, at least part of silver nanowires AgNW present in the third region R3 is iodinated to a silver iodide SI as illustrated in FIG. 20 so that the conductivity of the third region R3 falls below the conductivity of the second region R2.

Subsequently, the third region R3 is processed with a thiosulfate solution (S208). Due to this processing, at least part of the silver iodide SI is removed from the third region R3 as illustrated in FIG. 21. As a result, the translucent property of the dispersion layer DL in the third region R3 is enhanced.

Finally, the second resist layer 162 is removed (S209). As a result, the transparent electrode member 100 is obtained in which the insulating layer 102 is provided in the first region R1, the conductive part 111 is provided in the second region R2, and the optical adjustment part 112 with conductivity higher than the conductivity of the insulating layer 102 and lower than the conductivity of the conductive part 111 is disposed in the third region R3, as illustrated in FIG. 22.

When this manufacturing method is used, the optical adjustment part 112 with a certain level of conductivity can be manufactured. Therefore, the transparent electrode member 100 having the transparent electrode 110 with high conductivity can be manufactured. Also, when the manufacturing method described above is appropriately executed, silver nanowires AgNW present at a distance from the base material 101 in the dispersion layer DL can be preferentially removed. The silver nanowire AgNW in this portion in the dispersion layer DL the most affects visibility. In view of this, the optical adjustment part 112 with low reflectance and high conductivity may be formed. When the optical adjustment part 112 of this type is formed, the transparent electrode member 100 with higher conductivity and higher invisibility may be obtained.

Figure 37A:
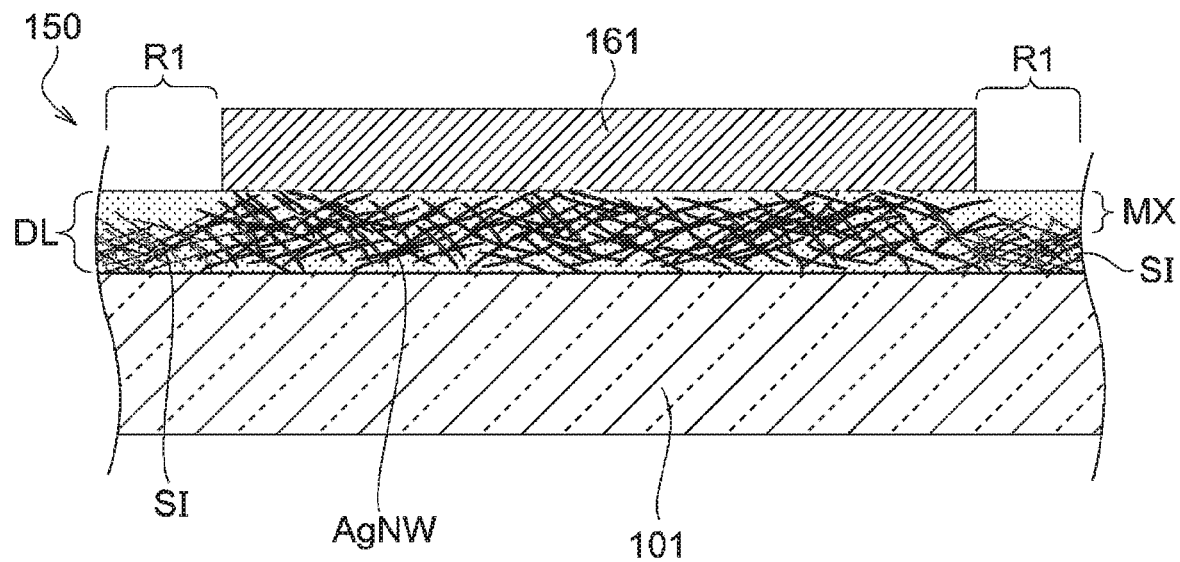
FIG. 37A illustrates a state in which processing based on a thiosulfate solution has been performed to form an insulating layer in a variation of the method of manufacturing the transparent electrode member in the second structure.
Figure 37B:
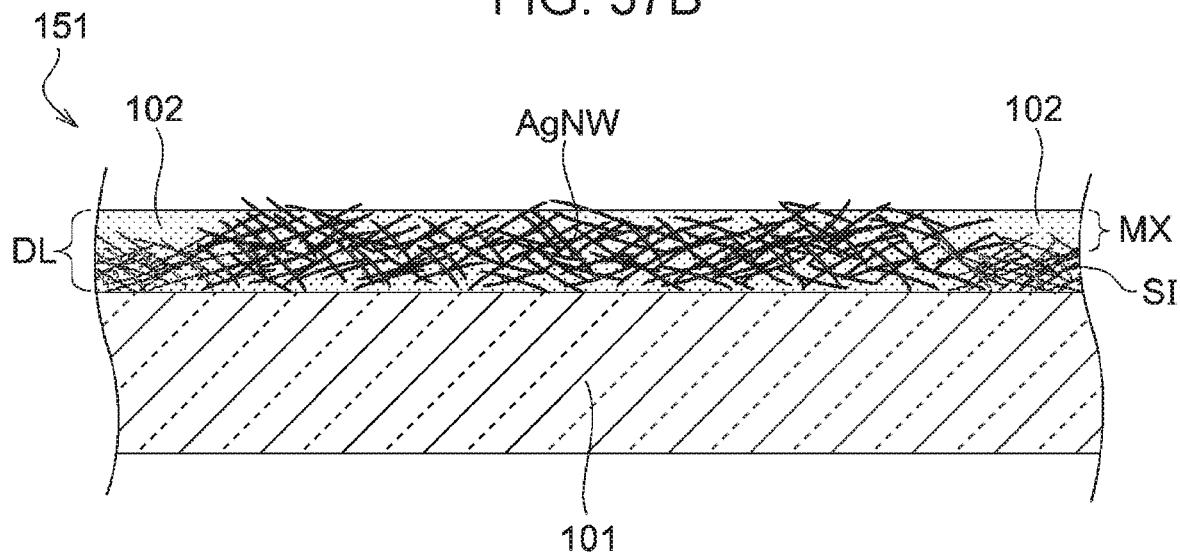
FIG. 37B is a cross-sectional view that conceptually illustrates a state in which the first resist layer has been removed an intermediate member is obtained.
Figure 38A:
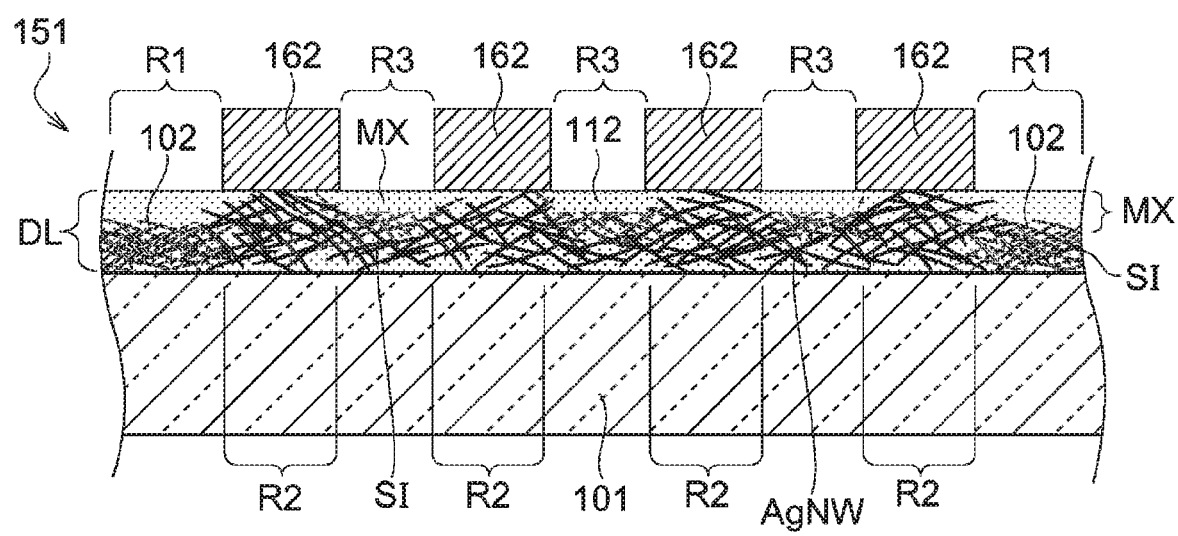
FIG. 38A illustrates a state in which processing based on a thiosulfate solution has been performed to form optical adjustment parts in a variation of the method of manufacturing the transparent electrode member in the second structure.
Figure 38B:
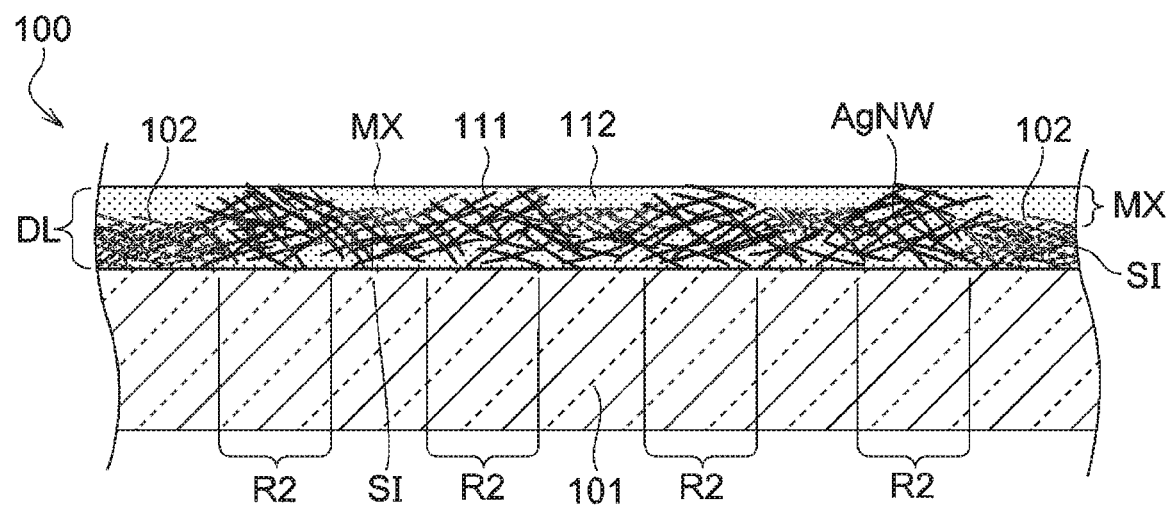
FIG. 38B is a cross-sectional view that conceptually illustrates a state in which the second resist layer has been removed and a transparent electrode member is obtained.

To further enhance the invisibility of the transparent electrode member 100, it is preferable the insulating layer 102 and optical adjustment part 112 to have a structure in which metallic compounds such as a silver iodide SI are removed from the front surface side (that is, on the side distant from the base material 101) so that the insulating layer 102 and optical adjustment part 112 are essentially composed of the matrix MX and metallic compounds such as a silver iodide SI are dispersed in the matrix MX on the lower layer side of the front surface side (that is, on the side close to the base material 101), as indicated in FIGS. 37A and 37B and FIGS. 38A and 38B. FIG. 37A illustrates a state in which processing based on a thiosulfate solution has been performed to form an insulating layer in a variation of the method of manufacturing the transparent electrode member in the second structure. FIG. 37B is a cross-sectional view that conceptually illustrates a state in which the first resist layer has been removed and an intermediate member is obtained. FIG. 38A illustrates a state in which processing based on a thiosulfate solution has been performed to form the optical adjustment part in a variation of the method of manufacturing the transparent electrode member in the second structure. FIG. 38B is a cross-sectional view that conceptually illustrates a state in which the second resist layer has been removed and a transparent electrode member is obtained.

Upon the termination of the iodine liquid processing to form the insulating layer 102 (S203), by, for example, shortening time taken in processing based on a thiosulfate solution (S204), metallic compounds such as a silver iodide SI (see FIG. 16) positioned in the first region R1 are removed only from the front surface side, as illustrated in FIG. 37A. After that, when the first resist layer 161 is removed (S205), the intermediate member 151 as illustrated in FIG. 37B is obtained instead of the intermediate member 151 in FIG. 18; this intermediate member 151 in FIG. 37B has the insulating layer 102 in which a region composed of the matrix MX is positioned on the front surface side and a region in which metallic compounds such as a silver iodide SI are dispersed is positioned on the lower layer side of the region composed of the matrix MX (that is, on the side close to the base material 101).

Then, step S206 is performed for this intermediate member 151 and iodine liquid processing to form the optical adjustment part 112 (S207) is further performed. After that, by, for example, shortening time taken in processing based on a thiosulfate solution (S208), metallic compounds such as a silver iodide SI (see FIG. 20) positioned in the third region R3 are removed only from on the front surface side, as illustrated in FIG. 38A. Finally, when the second resist layer 162 is removed (S209), the optical adjustment part 112 as illustrated in FIG. 38B is obtained instead of the optical adjustment part 112 in FIG. 22; in this optical adjustment part 112 in FIG. 38B, a region composed of the matrix MX is positioned on the front surface side, a region in which metallic compounds such as a silver iodide SI are dispersed is positioned on the lower layer side of the region composed of the matrix MX (that is, on the side close to the base material 101), and a region in which silver nanowires AgNW are dispersed is further positioned on the lower layer side of the region with metallic compounds dispersed. When the transparent electrode member 100 has a structure of this type, the insulating layer 102, optical adjustment part 112, and conductive part 111 become particularly difficult to visually identify. Therefore, the invisibility of the transparent electrode member 100 is further improved.

The above transparent electrode member 100 according to an embodiment of the present invention can be preferably used as a constituent element of a position sensor such as a capacitive sensor. A capacitive sensor having the transparent electrode member 100 will be described below.

Figure 23:
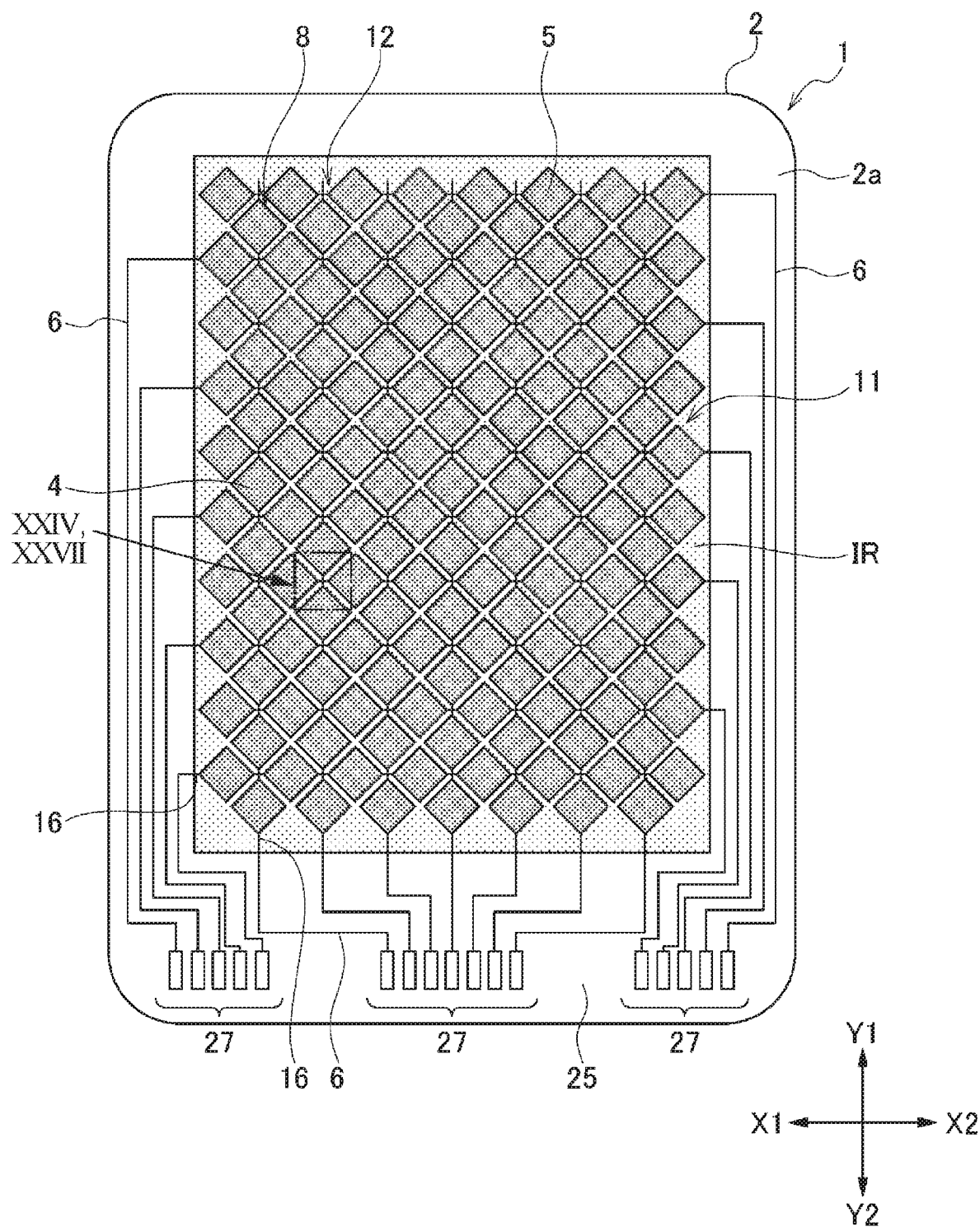
FIG. 23 is a plan view that illustrates a capacitive sensor according to an embodiment.
Figure 24:
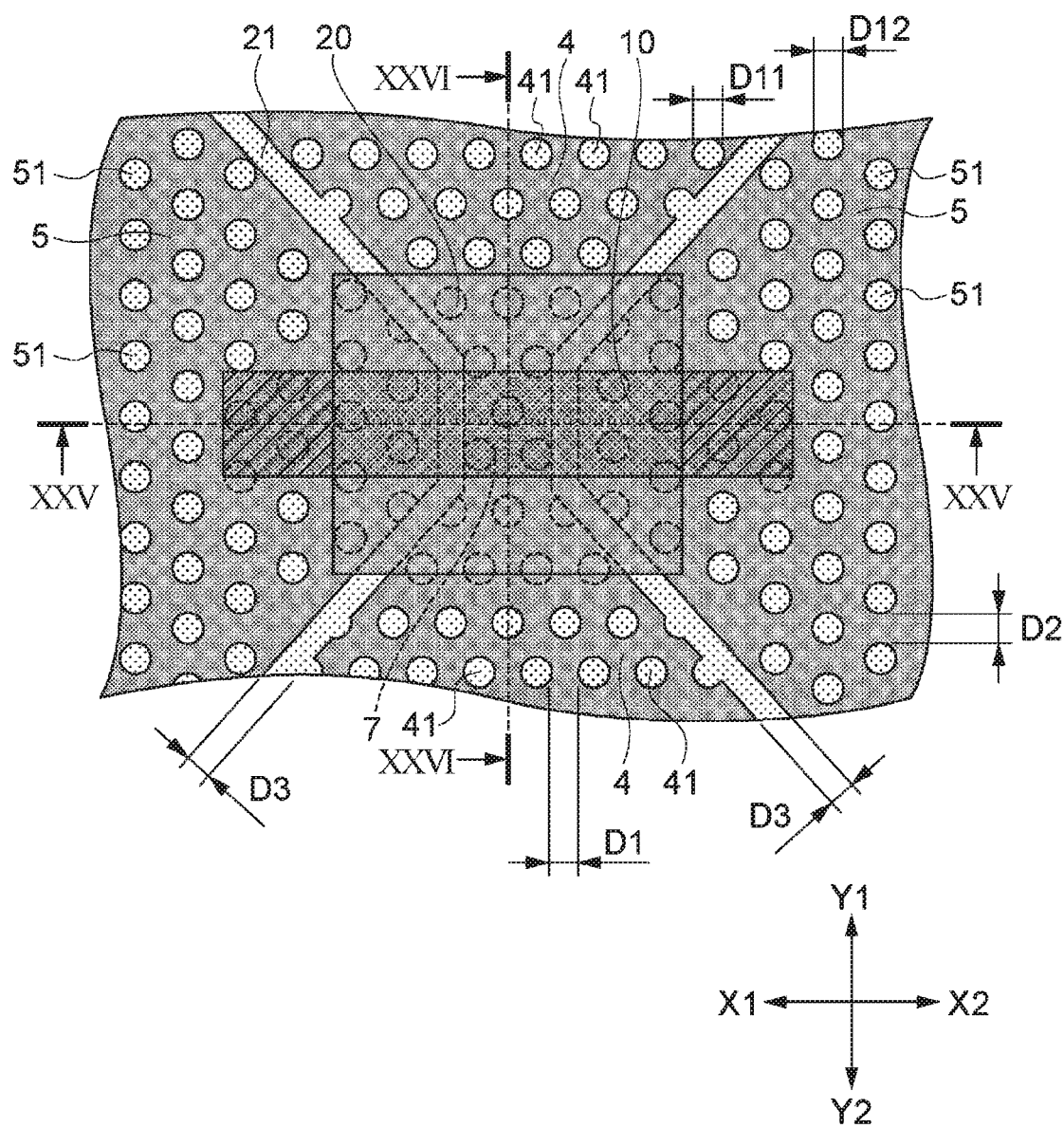
FIG. 24 is a plan view in which the region XXIV, XXVII illustrated in FIG. 23 is enlarged.
Figure 25:
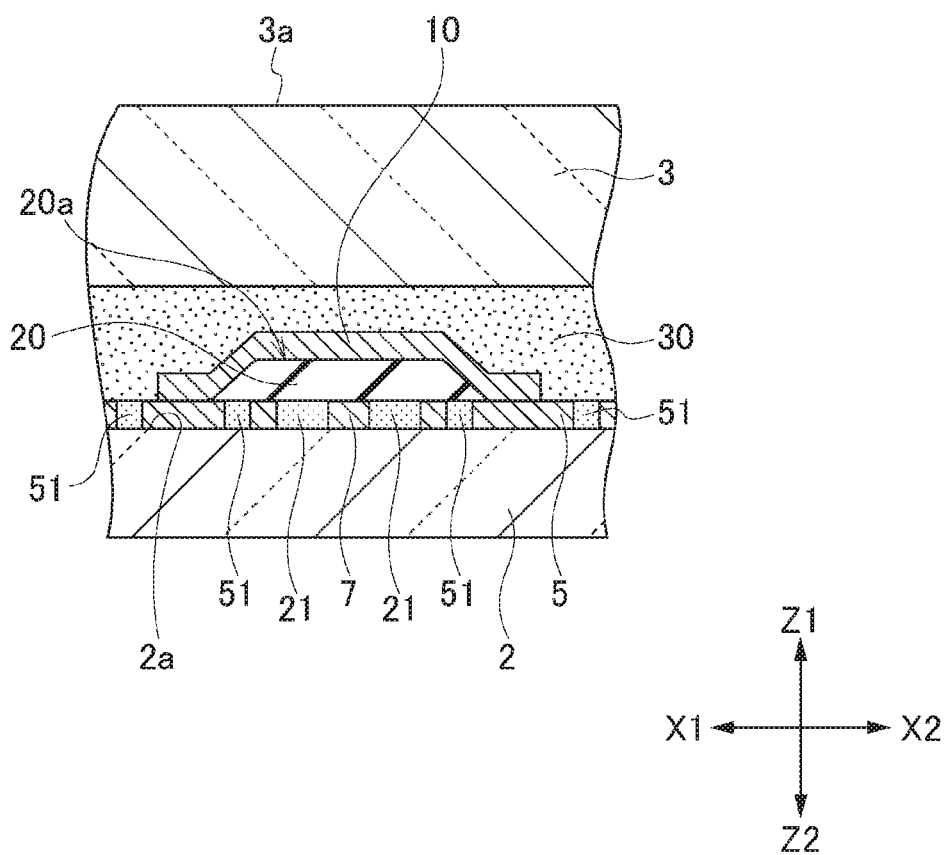
FIG. 25 is a cross-sectional view taken along line XXVI-XXVI illustrated in FIG. 24.
Figure 26:
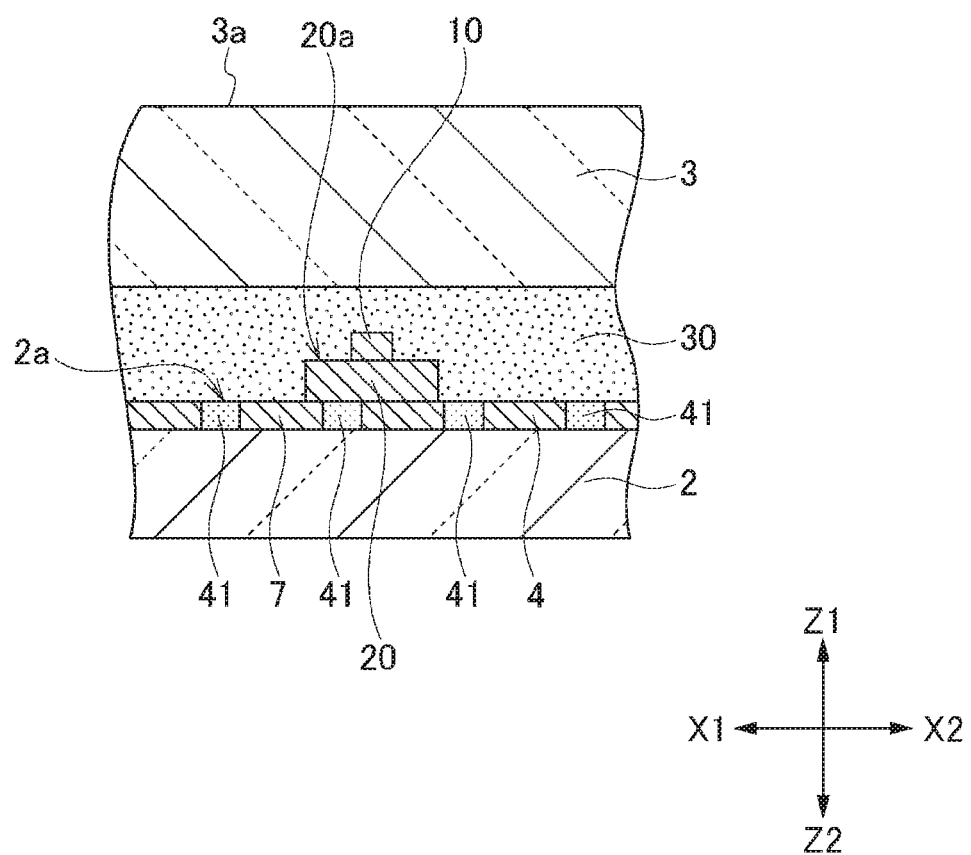
FIG. 26 is a cross-sectional view taken along line XXV-XXV illustrated in FIG. 24.

FIG. 23 is a plan view that illustrates a capacitive sensor according to this embodiment. FIG. 24 is a plan view in which the region XXIV, XXVII illustrated in FIG. 23 is enlarged. FIG. 25 is a cross-sectional view taken along line XXVI-XXVI illustrated in FIG. 24. FIG. 26 is a cross-sectional view taken along line XXV-XXV illustrated in FIG. 24. Since transparent electrodes are transparent, they cannot be viewed in reality. In FIGS. 23 and 24, however, the outlines of the transparent electrodes are illustrated for easy understanding.

As illustrated in FIGS. 23 to 26, a capacitive sensor 1 according to this embodiment has a base material 2, first transparent electrodes 4, second transparent electrodes 5, bridge wiring parts 10, and a panel 3 as well as a detection unit and a control unit (which are not illustrated). The panel 3 is disposed on the opposite side to the base material 2 when viewed from the bridge wiring part 10. An optical clear adhesive (OCA) 30 is provided between the base material 2 and the panel 3. An insulating part 20 is provided between the base material 2 and the bridge wiring part 10. As illustrated in FIG. 25, at the portion where the bridge wiring part 10 is disposed, the optical clear adhesive 30 is disposed between the bridge wiring part 10 and the panel 3.

The base material 2 is formed from a glass base material or a transparent base material such as polyethylene terephthalate (PET), which has a translucent property, in a film shape. The first transparent electrodes 4 and second transparent electrodes 5 are disposed on a main surface 2a, which is one of the main surfaces of the base material 2. Details of this will be described below. As illustrated in FIG. 25, the panel 3 is disposed on the opposite side to the base material 2 when viewed from the bridge wiring part 10 and has a translucent property. When a manipulating body such as a finger of the manipulator comes into contact with or close to this panel 3, a manipulation to transparent electrodes is performed. The material of the panel 3 is not particularly restricted. As the material of the panel 3, a glass base material and a plastic base material are preferably applied. The panel 3 is bonded to the base material 2 through the optical clear adhesive 30 disposed between the base material 2 and the panel 3. The optical clear adhesive 30 is composed of an acrylic adhesive, a double-sided adhesive tape, or the like.

As represented in FIG. 23, the capacitive sensor 1 is composed of a detection region 11 and a non-detection region 25 when viewed from a direction (Z1-Z2 direction: see FIGS. 25 and 26) along the normal to a surface of the panel 3. On the detection region 11, a manipulation can be performed with a manipulating body such as a finger. The non-detection region 25, shaped like a picture frame, is positioned on the outer circumference side of the detection region 11. The non-detection region 25 is light-shielded by a decorative layer (not illustrated). In the capacitive sensor 1, light (exemplified by external light) that propagates from a surface of the panel 3 toward a surface of the base material 2 and light (exemplified by light from a backlight of a display device used in combination with the capacitive sensor 1) that propagates from the surface of the base material 2 toward the surface of the panel 3 are less likely to pass through the non-detection region 25.

As illustrated in FIG. 23, first electrode links 8 and second electrode links 12 are provided on the main surface 2a, which is one of the main surfaces of the base material 2. The first electrode links 8 are placed in the detection region 11. Each first electrode link 8 has a plurality of first transparent electrodes 4. As indicated in FIGS. 25 and 26, the plurality of first transparent electrodes 4 are disposed on the main surface (sometimes simply referred to below as the front surface) 2a, which is one of the main surfaces of the base material 2 and is positioned on the Z1 side, the normal to the main surfaces being along the Z1-Z2 direction. Each first transparent electrode 4 is linked through an elongated link 7 in the Y1-Y2 direction (specifically, a first direction). The first electrode links 8, each of which has a plurality of first transparent electrodes 4 linked in the Y1-Y2 direction, are arranged in the X1-X2 direction at intervals. The link 7 is formed integrally with the first transparent electrode 4. The link 7 electrically connects two adjacent first transparent electrodes 4 to each other. The insulating region IR is disposed around the first electrode links 8 and second electrode links 12.

The first transparent electrode 4 and link 7 are formed from a material that has a translucent property and includes conductive nanowires. When a material including conductive nanowires is used, it is possible to achieve a high translucent property and low electric resistance for the first transparent electrode 4. Also, when a material including conductive nanowires is used, it is possible to improve the deformation performance of the capacitive sensor 1.

As illustrated in FIGS. 24 and 26, the first transparent electrode 4 has a plurality of first optical adjustment regions 41. The plurality of first optical adjustment regions 41 are placed apart from one another and are provided across the whole of the first transparent electrode 4. The distance (specifically, the first distance) D1 between each two adjacent first optical adjustment regions 41 is constant; the distance is 30 μm or more. That is, the plurality of first optical adjustment regions 41 are evenly disposed across the whole of the first transparent electrode 4. In the example illustrated in FIG. 24, the shape of the first optical adjustment region 41 is a circle. The diameter D11 of the first optical adjustment region 41 is 10 μm or more and 100 μm or less. Details of dimensions related to the first optical adjustment region 41 will be described later.

The second electrode links 12 are placed in the detection region 11. Each second electrode link 12 has a plurality of second transparent electrodes 5. As indicated in FIGS. 25 and 26, the plurality of second transparent electrodes 5 are disposed on the front surface 2a of the base material 2. Thus, the second transparent electrodes 5 are disposed on the same surface (front surface 2a of the base material 2) as the first transparent electrodes 4. Each second transparent electrode 5 is linked through the elongated bridge wiring part 10 in the X1-X2 direction (specifically, a second direction). Then, as illustrated in FIG. 23, the second electrode links 12, each of which has the plurality of second transparent electrodes 5 linked in the X1-X2 direction, are arranged in the Y1-Y2 direction at intervals. The bridge wiring part 10 is formed separately from the second transparent electrodes 5. The X1-X2 direction crosses the Y1-Y2 direction. For example, the X1-X2 direction perpendicularly crosses the Y1-Y2 direction.

The second transparent electrode 5 is formed from a material that has a translucent property and includes conductive nanowires. The conductive nanowires are as described above in relation to the material of the first transparent electrode 4.

As illustrated in FIGS. 24 and 26, the second transparent electrode 5 has a plurality of second optical adjustment regions 51. The plurality of second optical adjustment regions 51 are placed apart from one another and are disposed across the whole of the second transparent electrode 5. The distance (specifically, the second distance) D2 between each two adjacent second optical adjustment regions 51 is constant; the distance is 30 μm or more. That is, the plurality of second optical adjustment regions 51 are evenly provided across the whole of the second transparent electrode 5. In the example illustrated in FIG. 24, the shape of the second optical adjustment region 51 is a circle. The diameter D12 of the second optical adjustment region 51 is 10 μm or more and 100 μm or less. Details of dimensions related to the second optical adjustment region 51 will be described later together with dimensions related to the first optical adjustment region 41.

The bridge wiring part 10 is formed from a material that has a translucent property and conductivity and includes an oxide material. As the oxide material that has a translucent property and conductivity, at least one selected from a group of an indium tin oxide (ITO) material, an indium zinc oxide (IZO) material, a gallium-doped zinc oxide (GZO) material, an aluminum-doped zinc oxide (AZO) material, and an fluorine-doped tin oxide (FTO) material is used.

Alternatively, the bridge wiring part 10 may have a first layer including an oxide material such as an ITO material and a second layer composed of a metal that has a lower resistance than the first layer and is transparent. Also, the bridge wiring part 10 may further have a third layer including an oxide material such as an ITO material. If the bridge wiring part 10 has a laminated structure of the first layer and second layer or a laminated structure of the first layer, second layer, and third layer, it is preferable that there be etching selectivity between a combination of the bridge wiring part 10 and the first transparent electrode 4 and a combination of the bridge wiring part 10 and the second transparent electrode 5.

As illustrated in FIGS. 24 to 25, the insulating part 20 is disposed on the front surface of the link 7, which links first transparent electrodes 4. As illustrated in FIG. 25, the insulating part 20 fills space between the link 7 and the second transparent electrode 5 and also slightly rides on the front surface of the second transparent electrode 5. As the insulating part 20, a novolak resin (a type of resist), for example, is used.

As indicated in FIGS. 25 and 26, the bridge wiring part 10 is disposed so as to extent from the front surface 20a of the insulating part 20 to the front surfaces of the individual second transparent electrodes 5 positioned on both sides of the insulating part 20 in the X1-X2 direction. The bridge wiring part 10 electrically connects two adjacent second transparent electrodes 5 to each other.

As indicated in FIGS. 25 and 26, the insulating part 20 is disposed on the front surface of the link 7, which links first transparent electrodes 4, and the bridge wiring part 10, which connects second transparent electrode 5, is disposed on the front surface of the insulating part 20. Thus, the insulating part 20 is present between the link 7 and the second linking part 10, so the first transparent electrode 4 and second transparent electrode 5 are electrically insulated from each other. Since, in this embodiment, the first transparent electrode 4 and second transparent electrode 5 are disposed on the same surface (specifically, the front surface 2a of the base material 2), the thinning of the capacitive sensor 1 can be achieved.

As illustrated in FIG. 24, the first transparent electrode 4 and second transparent electrode 5 are arranged adjacently on the main surface 2a of the base material 2. The first transparent electrode 4 and second transparent electrode 5 correspond to the transparent electrodes, 110a to 110d in FIGS. 5 and 6. An insulating layer 21 is provided between the first transparent electrode 4 and the second transparent electrode 5. The insulating layer 21 corresponds to the insulating region IR in FIGS. 5, 6, and 23. Therefore, the first transparent electrode 4 and second transparent electrode 5 are electrically insulated from each other. The insulating layer 21 may be embedded in, for example, a novolak resin (a type of resist) or the like by an insulating material. That is, an insulating material may be present in the insulating layer 21 between the first transparent electrode 4 and the second transparent electrode 5. As described above, the insulating part 20 is present in part of the insulating layer 21 (specifically, between the second transparent electrode 5 and the link 7 of the first transparent electrode 4). That is, the first transparent electrode 4 and second transparent electrode 5 are placed in a state in which they are segmented from each other through the insulating part 20 and part of the insulating layer 21. The width D3 of the insulating layer 21 is, for example, about 10 μm or more and 20 μm or less. Details of the width D3 of the insulating layer 21 will be described later.

The link 7 illustrated in FIGS. 24 to 26 is integrally formed as part of the first transparent electrode 4 and extends in the Y1-Y2 direction. Also, the bridge wiring part 10 illustrated in FIGS. 24 to 26 is formed on the front surface 20a of the insulating part 20, which covers the link 7, separately from the second transparent electrodes 5, and extends in the X1-X2 direction. However, forms of the placement of the link 7 and bridge wiring part 10 are not limited to this. For example, the link 7 may be integrally formed as part of the second transparent electrode 5 and may extend in the X1-X2 direction. In this case, the link 7 electrically connects two adjacent second transparent electrodes 5 to each other. The bridge wiring part 10 may be formed on the front surface 20a of the insulating part 20, which covers the link 7, separately from the first transparent electrodes 4, and may extend in the Y1-Y2 direction. In this case, the bridge wiring part 10 electrically connects two adjacent first transparent electrodes 4 to each other. In the description of the capacitive sensor 1 according to this embodiment, an example is used in which the bridge wiring part 10 is formed on the front surface 20a of the insulating part 20, which covers the link 7, separately from the second transparent electrodes 5, and extends in the X1-X2 direction.

As illustrated in FIG. 23, a plurality of wiring parts 6 led out from individual first electrode links 8 and 1 second electrode links 12 are formed in the non-detection region 25. Each of the first electrode links 8 and second electrode links 12 is electrically connected to the wiring part 6 through a connection wire 16. Each wiring part 6 is connected to an external connection part 27 that is electrically connected to a flexible printed circuit board (not illustrated). That is, the wiring parts 6 electrically connect the first electrode links 8 and second electrode links 12 and the external connection part 27. The external connection part 27 is electrically connected to the flexible printed circuit board (not illustrated) through, for example, a material that has a conductive paste or a metal such as Cu, a Cu alloy, a CuNi alloy, Ni, Ag, Au, or the like.

On a printed wiring board (not illustrated) connected to this flexible printed circuit board, the detection unit (not illustrated) that detects a change in capacitance generated between the manipulating body and a transparent electrode (mainly, the first transparent electrode 4 or second transparent electrode 5) and the control unit (not illustrated) that calculates the position of the manipulating body according to a signal from the detection unit are mounted. Although not described in detail, an integrated circuit is used in the detection unit and control unit.

Each wiring part 6 is formed from a material that has a metal such as Cu, a Cu alloy, a CuNi alloy, Ni, Ag, Au, or the like. The connection wire 16, which is formed from a transparent conductive material such as an ITO material or metal nanowires, extends from the detection region 11 to the non-detection region 25. The wiring part 6 is laminated on the connection wire 16 in the non-detection region 25 and is electrically connected to the connection wire 16. Also, the capacitive sensor 1 may have a laminated wiring structure in which the dispersion layer DL having the same metal nanowires (a specific example is silver nanowires) as the first transparent electrode 4 and second transparent electrode 5 continuously extends to the non-detection region 25 to form the connection wire 16 and, in the non-detection region 25, this connection wire 16 and a metal layer forming the wiring part 6 are laminated.

The wiring part 6 is disposed at a portion, on the front surface 2a of the base material 2, where the non-detection region 25 is positioned. The external connection part 27 is also disposed at a portion, on the front surface 2a of the base material 2, where the non-detection region 25 is positioned, as is the wiring part 6.

In FIG. 23, the wiring part 6 and external connection part 27 are illustrated so as to be visually recognized for easy understanding. In practice, however, a decorative layer (not illustrated) having a shielding property is provided at a portion where the non-detection region 25 is positioned. Therefore, the wiring part 6 and external connection part 27 are hidden by the decorative layer and are not visually recognized when the capacitive sensor 1 is viewed from the panel on the same side as the panel 3. Any material can be used to form the decorative layer if the material has a light shielding property. The decorative layer may have an insulating property.

In the capacitive sensor 1 according to this embodiment, when a finger, which is an example of a manipulation body, is caused to come into contact with, for example, a surface 3a of the panel 3 as illustrated in FIG. 25, a capacitance is generated between the finger and the first transparent electrode 4 close to the finger and between the finger and the second transparent electrode 5 close to the finger. The capacitive sensor 1 can detect a change in capacitance at this time by the detecting unit and can calculate the contact position of the finger by the control unit according to this change in capacitance. Specifically, the capacitive sensor 1 detects the X coordinate of the position of the finger according to a change in capacitance between the finger and the first electrode link 8 and detects the Y coordinate of the position of the finger according to a change in capacitance between the finger and the second electrode link 12 (that is, the capacitive sensor 1 is of self-capacitance detection type).

Alternatively, the capacitive sensor 1 may be of mutual capacitance detection type. Specifically, the capacitive sensor 1 may apply a driving voltage to any one of the first electrode link 8 and second electrode link 12, and may detect a change in capacitance between the finger and the other of the first electrode link 8 and the second electrode link 12. Thus, the capacitive sensor 1 detects the X direction of the position of the finger from one electrode link, and also detects the Y coordinate of the position of the finger from the other electrode link.

Here, when the difference between the reflectance of a conductive region including conductive nanowires and the reflectance of an insulating part including a gap becomes large, the difference between the conductive region and the insulting part becomes visually apparent. Then, the first transparent electrode and second transparent electrode become likely to be visually recognized as a pattern. If the capacitive sensor has a reflection preventing layer, a reflection reducing layer, or the like, the difference between the reflectance of the conductive region and the reflectance of the insulating part can be suppressed, but a facility to form the reflection preventing layer or reflection reducing layer needs to be added and process to manufacture the capacitive sensor are increased.

In the capacitive sensor 1 according to this embodiment, however, the first transparent electrode 4 has a plurality of first optical adjustment regions 41 placed apart from one another. Also, the second transparent electrode 5 has a plurality of second optical adjustment regions 51 placed apart from one another. Therefore, the first transparent electrodes 4 includes a conductive region including conductive nanowires and a plurality of regions (specifically, optical adjustment regions) formed by a plurality of first optical adjustment regions 41. Similarly, the second transparent electrode 5 includes a conductive region including conductive nanowires and a plurality of regions (specifically, optical adjustment regions) formed by a plurality of second optical adjustment regions 51. Therefore, in each of the first transparent electrode 4 and second transparent electrode 5, a plurality of boundaries (specifically, inner boundaries) are present between the conductive region and the optical adjustment regions. Furthermore, a boundary (specifically, an outer boundary) is present between the first transparent electrode 4 and the insulating layer 21 and between the second transparent electrode 5 and the insulating layer 21.

Therefore, even if both inner boundaries and outer boundaries are visually recognized in a plan view of the capacitive sensor 1, it is suppressed that only the outer boundaries are emphasized. Therefore, the first transparent electrodes 4 and second transparent electrodes 5 become difficult to visually recognize as patterns. Thus, the invisibility of the patterns of the first transparent electrodes 4 and second transparent electrodes 5 can be improved.

Also, the first optical adjustment regions 41 are provided across the whole of the first transparent electrodes 4, and the second optical adjustment regions 51 are provided across the whole of the second transparent electrode 5. According to this, since the first optical adjustment regions 41 and second optical adjustment regions 51 are provided, it is possible to restrain the electric resistances of the first transparent electrode 4 and second transparent electrode 5 from being excessively increased. It is also possible to restrain the first optical adjustment regions 41 and second optical adjustment regions 51 from being concentrated and thereby the first transparent electrode 4 and second transparent electrode 5 from being visually recognized easily as a pattern.

Also, the first distance between each two adjacent first optical adjustment regions 41 is constant, and the second distance between each two adjacent second optical adjustment regions 51 is constant. That is, the plurality of first optical adjustment regions 41 are evenly provided across the whole of the first transparent electrode 4, and the plurality of second optical adjustment regions 51 are evenly provided across the whole of the second transparent electrode 5. Therefore, it is possible to restrain the electric resistance of each of the first transparent electrode 4 and second transparent electrode 5 from varying depending on the position and to restrain the electric resistances of the first transparent electrode 4 and second transparent electrode 5 from being locally increased. Also, it is possible to restrain the first optical adjustment regions 41 and second optical adjustment regions 51 from being concentrated and thereby the first transparent electrode 4 and second transparent electrode 5 from being visually recognized easily as a pattern.

Also, the conductive nanowire included in the first transparent electrode 4 and second transparent electrode 5 is at least one selected from a group of a gold nanowire, a silver nanowire, and a copper nanowire. According to this, it is possible to suppress the electric resistance of the first transparent electrode 4 including the first optical adjustment regions 41 and the electric resistance of the second transparent electrode 5 including the second optical adjustment regions 51 to a lower resistance than when an oxide material such as, for example, an ITO material is used as the material of the first transparent electrode 4 and second transparent electrode 5.

Figure 27:
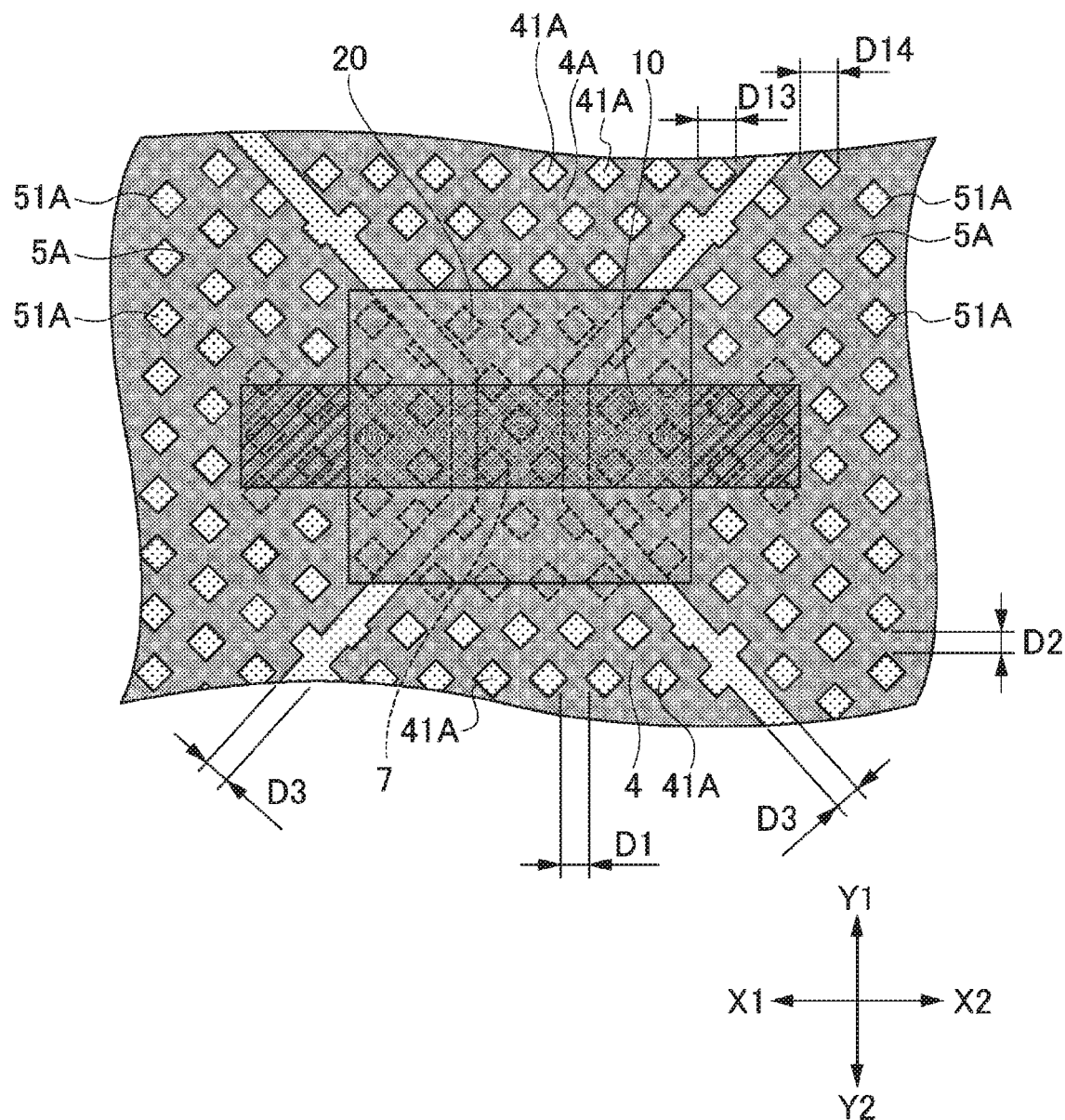
FIG. 27 is a plan view that illustrates a variation (specifically, a first variation) of a first transparent electrode and a second transparent electrode in an embodiment.

FIG. 27 is a plan view that illustrates a variation (specifically, a first variation) of the first transparent electrode and second transparent electrode in this embodiment. FIG. 27 is equivalent to a plan view in which the region XXIV, XXVII illustrated in FIG. 23 is enlarged.

A first transparent electrode 4A in this variation has a plurality of first optical adjustment regions 41A. The shape of the first optical adjustment region 41A is a quadrangle. The length D13 of the longest diagonal line of the first optical adjustment region 41A in a quadrangular shape is 10 µm or more and 100 µm or less. Details of dimensions related to the first optical adjustment region 41A will be described later. In other respects, the structure of the first transparent electrode 4A is similar to the structure of the first transparent electrode 4 described above with reference to FIGS. 23 to 26.

A second transparent electrode 5A in this variation has a plurality of second optical adjustment regions 51A. The shape of the second optical adjustment region 51A is a quadrangle. The length D14 of the longest diagonal line of the second optical adjustment region 51A in a quadrangular shape is 10 µm or more and 100 µm or less. Details of dimensions related to the second optical adjustment region 51A will be described later together with dimensions related to the first optical adjustment region 41A. In other respects, the structure of the second transparent electrode 5A is similar to the structure of the second transparent electrode 5 described above with reference to FIGS. 23 to 26.

As exemplified in this variation, the shape of each of the first optical adjustment region 41A and second optical adjustment region 51A may be a quadrangle without being limited only to a circle. Even in this case, according to the findings that the present inventor obtained, the optical properties such as the reflectance of each of the first transparent electrode 4A and second transparent electrode 5A are similar to the optical properties such as the reflectance of each of the first transparent electrode 4 and second transparent electrode 5 described above with reference to FIGS. 23 to 26. Therefore, even if both inner boundaries and outer boundaries are visually recognized in a plan view of the capacitive sensor 1, it is suppressed that only the outer boundaries are emphasized. Therefore, the first transparent electrodes 4A and second transparent electrodes 5A become difficult to visually recognize as a pattern. Thus, the pattern invisibility of the first transparent electrodes 4A and second transparent electrodes 5A can be improved.

Figure 28:
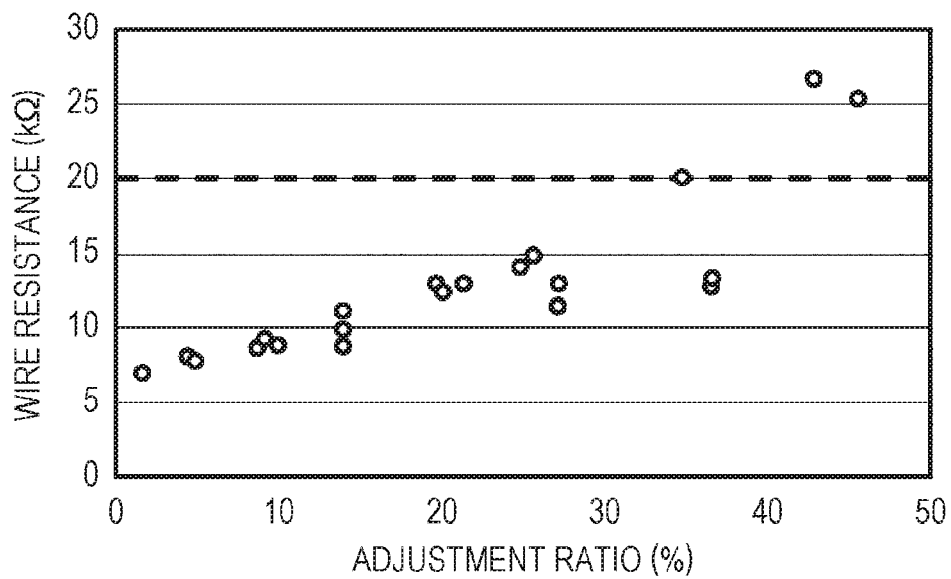
FIG. 28 is a graph that exemplifies an example of a relationship between an adjustment ratio and wire resistance.

FIG. 28 is a graph that exemplifies an example of a relationship between the adjustment ratio and wire resistance. In the graph in FIG. 28, the horizontal axis represents the adjustment ratio (%) and the vertical axis represents the wire resistance (kΩ). In this specification, the adjustment ratio refers to the area of the optical adjustment region per unit area.

As in the graph illustrated in FIG. 28, when the adjustment ratio is relatively high, the wire resistance is relatively high. According to the findings that the present inventor obtained, when the screen size is about 4 inches or more and 6 inches or less as with, for example, a movable terminal such as smartphone, to assure the performance of the capacitive sensor 1, it is preferable for the wire resistance to be 20 kΩ or less. In FIG. 28, a 20-kΩ line is indicated by a dashed line. In this case, according to the graph illustrated in FIG. 28, the adjustment ratios of the first optical adjustment regions 41 in the first transparent electrode 4 and the second optical adjustment regions 51 in the second transparent electrode 5 are preferably 40% or less.

If the adjustment ratios of the first optical adjustment regions 41 in the first transparent electrode 4 and the second optical adjustment regions 51 in the second transparent electrode 5 are 40% or less, it is possible to improve the invisibility of the patterns of the first transparent electrodes 4 and second transparent electrodes 5 and suppress the rise of the electric resistance of each of the first transparent electrode 4 and second transparent electrode 5, making it possible to assure the performance of the capacitive sensor 1.

If the screen size of a terminal in which the capacitive sensor 1 according to this embodiment is mounted is about less than 4 inches, to assure the performance of the capacitive sensor 1, it is preferable for wiring resistance to be 30 kΩ or less. In this case, according to the graph illustrated in FIG. 28, it is preferable for the adjustment ratios of the first optical adjustment regions 41 in the first transparent electrode 4 and the second optical adjustment regions 51 in the second transparent electrode 5 to be 45% or less.

Figure 29:
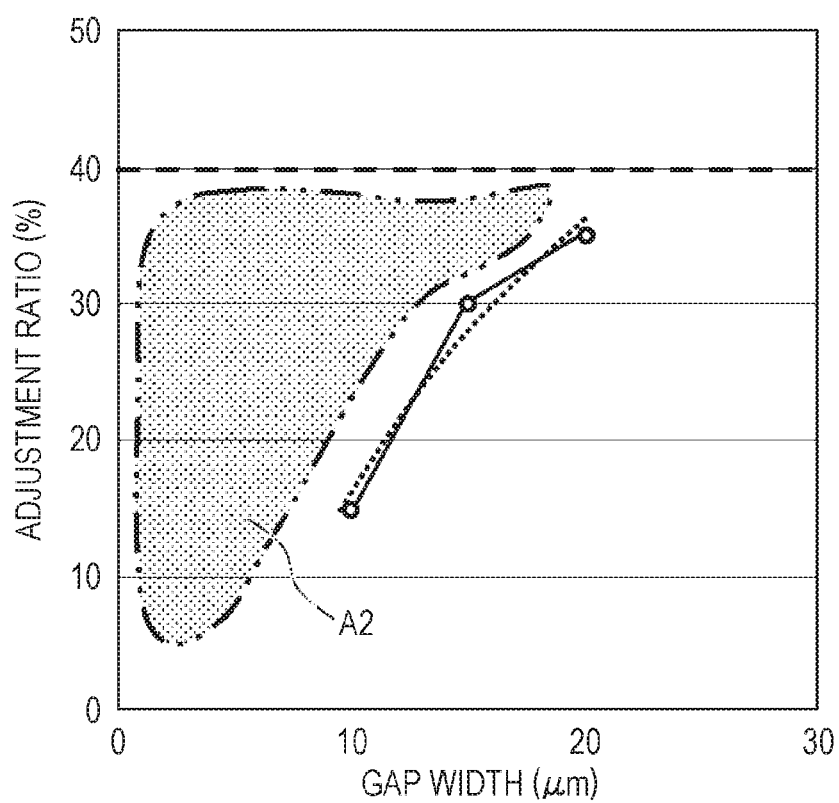
FIG. 29 is a graph that exemplifies an example of a relationship between a gap width and the adjustment ratio.

FIG. 29 is a graph that exemplifies an example of a relationship between a gap width and the adjustment ratio. In the graph in FIG. 29, the vertical axis represents the gap width (µm) and the horizontal axis represents the adjustment ratio (%). The gap width illustrated in FIG. 29 is equivalent to the width D3 of the insulating layer 21 described above with reference to FIG. 24.

The present inventor studied the invisibility of the patterns of the first transparent electrodes 4 and second transparent electrodes 5 when the width D3 and adjustment ratio were varied. In this study, the inventor made visual decisions on invisibility under conditions described below.

In this study, a sample was used in which a glass substrate is pasted to a sensor film on which transparent electrodes having optical adjustment parts are provided, with an optical transparent adhesive layer intervening between the glass substrate and the sensor film. A light source that emits light to the sample was a three-waveform type of daylight fluorescent lamp. The illumination of the light source was 1300 lux (lx). The distance (specifically, an inspection distance) between the sample and a visual position was 30 cm. The angle between the eye line and a straight line (specifically, the normal) perpendicular to the front surface of the sensor film or glass substrate was 0 degree or more and 45 degrees or less. A black board was placed on a side (specifically, rear side of the sample) opposite to the eye line.

An example of the results of the study is as illustrated in FIG. 29. The graph in FIG. 29 indicates that: when the width D3 is 10 μm, if the adjustment ratio is 15% or more, the invisibility of the patterns of the first transparent electrodes 4 and second transparent electrodes 5 is assured; when the width D3 is 15 μm, if the adjustment ratio is 30% or more, the invisibility of the patterns of the first transparent electrodes 4 and second transparent electrodes 5 is assured; and when the width D3 is 20 μm, if the adjustment ratio is 35% or more, the invisibility of the patterns of the first transparent electrodes 4 and second transparent electrodes 5 is assured. That is, when the width D3 is relatively wide, a relatively high adjustment ratio is needed to assure the invisibility of the patterns of the first transparent electrodes 4 and second transparent electrodes 5.

As described above with reference to FIG. 28, it is preferable for the adjustment ratios of the first optical adjustment regions 41 and the second optical adjustment regions 51 to be 40% or less. According to the graph illustrated in FIG. 29, it is preferable for the width D3 to be 10 μm or more and 20 μm or less in consideration of the invisibility of the patterns of the first transparent electrodes 4 and second transparent electrodes 5 and the allowable limit of the wire resistance. That is, the region A2 illustrated in FIG. 29 is a region that satisfies both the invisibility of the patterns of the first transparent electrodes 4 and second transparent electrodes 5 and the allowable limit of the wire resistance. As illustrated in FIG. 29, it was found that there is a correlation between the invisibility of the patterns of the first transparent electrodes 4 and second transparent electrodes 5 and the adjustment ratios of the first optical adjustment regions 41 and second optical adjustment regions 51.

Figure 30:
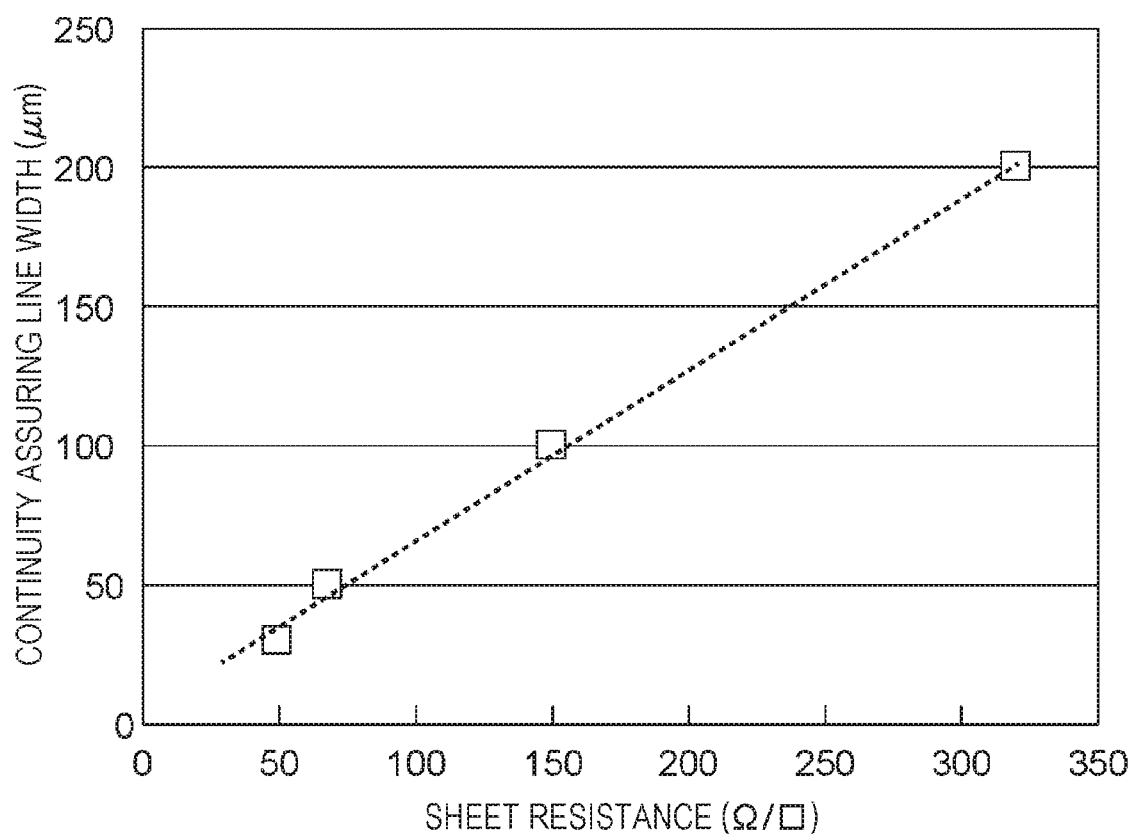
FIG. 30 is a graph that exemplifies an example of a relationship between sheet resistance and a continuity assuring line width.

FIG. 30 is a graph that exemplifies an example of a relationship between sheet resistance and a continuity assuring line width. In the graph in FIG. 30, the horizontal axis represents sheet resistance ($\Omega/\square$) and the vertical axis represents the continuity assuring line width (μm). The continuity assuring line width refers to the width of an electrical conductor needed to assure its conductivity without the electrical conductor being broken. Therefore, if the sheet resistance is relatively high as illustrated in FIG. 30, a relatively long width is needed as the width (specifically, the continuity assuring line width) of an electrical conductor needed to assure its conductivity without the electrical conductor being broken.

The broken line in the graph illustrated in FIG. 30 exemplifies a relationship between the sheet resistance and the width of the continuity assuring line width for a transparent electrode formed from a material including silver nanowires.

According to the findings that the present inventor obtained, the lower limit of the sheet resistance of the transparent electrode formed from a material including silver nanowires is about 30 to 50$\Omega/\square$. Therefore, according to the graph illustrated in FIG. 30, for the transparent electrode formed from a material including silver nanowires, it is preferable for the continuity assuring line width to be 30 μm or more.

Accordingly, in the conductive region of the first transparent electrode 4 having a plurality of first optical adjustment regions 41, it is preferable for a width of 30 μm or more to be assured. Therefore, as described above with reference to FIG. 24, it is preferable for the distance D1 between a plurality of adjacent first optical adjustment regions 41 to be 30 μm or more. This is also true for the second transparent electrode 5. That is, it is preferable for the distance D2 between a plurality of adjacent second optical adjustment regions 51 to be 30 μm or more.

According to this, even if a plurality of first optical adjustment regions 41 are provided in the first transparent electrode 4 including conductive nanowires and a plurality of second optical adjustment regions 51 are provided in the second transparent electrode 5 including conductive nanowires, since the width of the conductive region is narrow, it is possible to restrain the first transparent electrode 4 and second transparent electrode 5 from being broken.

Figure 31:
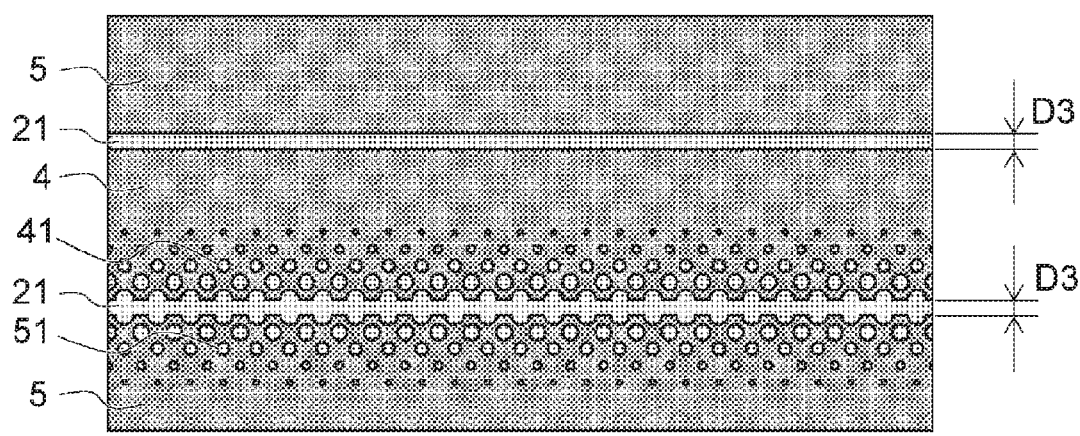
FIG. 31 is a plan view that explains visibility when optical adjustment parts are provided in the vicinity of a gap in an embodiment.

FIG. 31 is a plan view that explains visibility when optical adjustment parts are provided only in the vicinity of the insulating layer 21 in this embodiment. In FIG. 31, for convenience of explanation, two insulating layers 21 are arranged vertically; one insulating layer 21 is placed between one first transparent electrode 4 and one second transparent electrode 5 and the other insulating layer 21 is placed between the one first transparent electrode 4 and another second transparent electrode 5. That is, one first transparent electrode 4 is placed between two insulating layers 21 and two second transparent electrodes 5 are placed on both sides of the two insulating layers 21. The placement of the transparent electrodes illustrated in FIG. 30 is just for convenience of explanation. Therefore, one second transparent electrode 5 may be provided between two insulating layers 21 and two first transparent electrodes 4 may be provided on both sides of the two insulating layers 21.

The width D3 of the insulating layer 21 on the upper side is the same as the width D3 of the insulating layer 21 on the lower side. In the vicinity of the insulating layer 21 on the upper side of the two insulating layers 21 illustrated in FIG. 31, neither the first optical adjustment region 41 nor the second optical adjustment region 51 is provided. However, in the vicinity of the insulating layer 21 on the lower side of the two insulating layers 21 illustrated in FIG. 31, both the first optical adjustment region 41 and the second optical adjustment region 51 are provided.

It was found that when the first optical adjustment region 41 and second optical adjustment region 51 are provided only in the vicinity of the insulating layer 21 as illustrated in FIG. 31, the insulating layer 21 is emphasized and becomes noticeable due to the existence of the first optical adjustment region 41 and second optical adjustment region 51 when compared with a case in which neither the first optical adjustment region 41 nor the second optical adjustment region 51 is provided in the vicinity of the insulating layer 21. Specifically, since the first optical adjustment region 41 and second optical adjustment region 51, which were originally circular, were semicircular and were contiguous to the insulating layer 21 in a stripe shape, the local area of a region composed of the insulating layer 21, first optical adjustment region 41, and second optical adjustment region 51 was increased. As a result, the pattern of the insulating layer 21 positioned between the first transparent electrode 4 and the second transparent electrode 5 was emphasized instead. This tendency became outstanding in a case in which optical adjustment regions (specifically, first optical adjustment region 41 and second optical adjustment region 51) are provided only in the vicinity of the insulating layer 21 and no optical adjustment region is provided in regions in the transparent electrodes (specifically, first transparent electrode 4 and second transparent electrode 5), the regions being distant from the insulating layer 21, as illustrated in FIG. 31. Therefore, it is preferable for the plurality of first optical adjustment regions 41 to be evenly provided across the whole of the first transparent electrode 4 without being concentrated in the vicinity of the insulating layer 21. Similarly, it is preferable for the plurality of second optical adjustment region 51 to be evenly provided across the whole of the second transparent electrode 5 without being concentrated in the vicinity of the insulating layer 21. When this point is explained in another representation, it is preferable that optical adjustment regions, each of which is a region in which an optical adjustment part is positioned, be positioned in a conductive region, which is a region in which a conductive part is positioned, and that the optical adjustment region and an insulating region, in which the insulating layer is positioned, are not in direct contact with each other. It is also preferable that the optical adjustment regions be placed across the whole of the transparent electrode.

Figure 32:
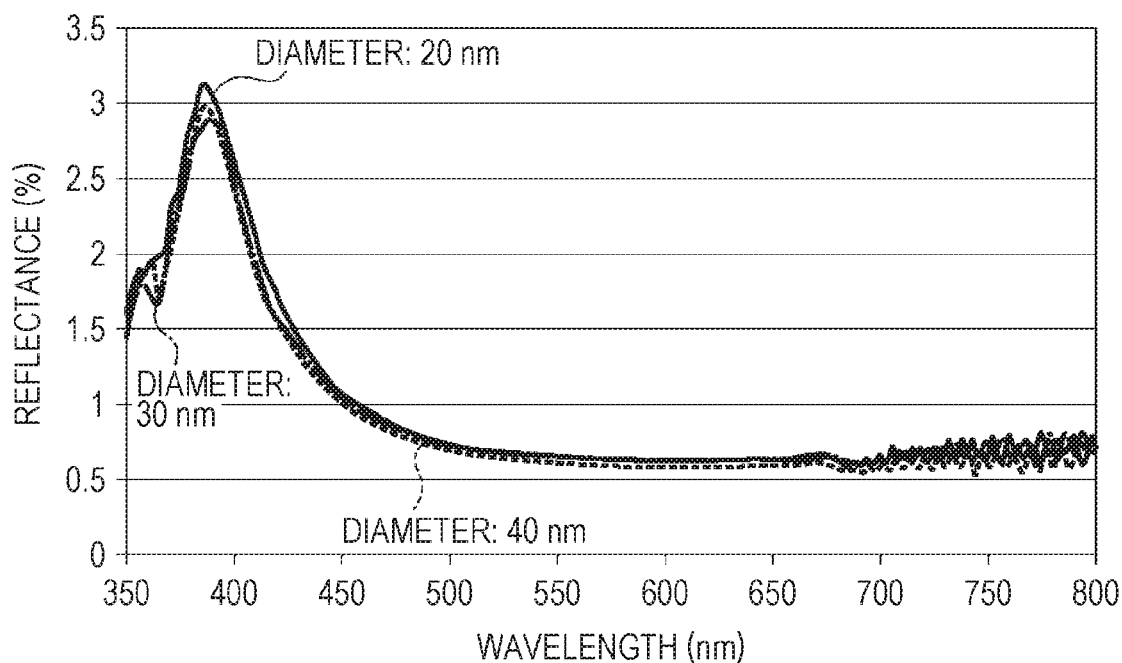
FIG. 32 is a graph that exemplifies an example of a relationship between wavelength and reflectance when the diameter of the optical adjustment part is varied.
Figure 33:
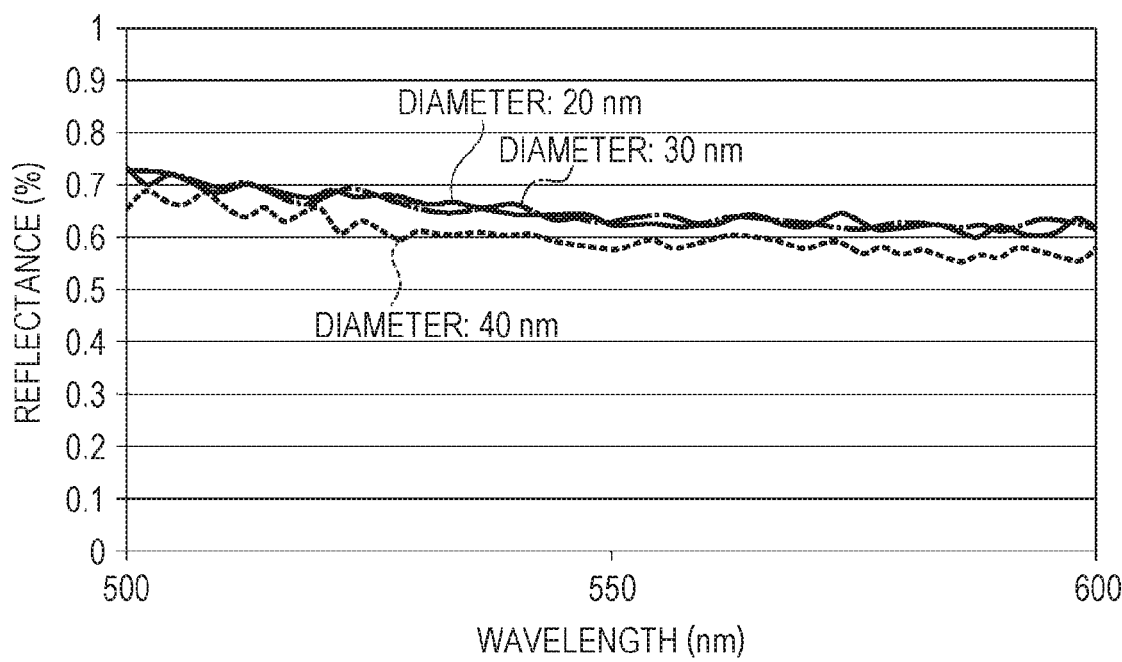
FIG. 33 is a graph in which part of the graph illustrated in FIG. 32 is enlarged.

FIG. 32 is a graph that exemplifies an example of a relationship between wavelength and reflectance when the diameter of the optical adjustment part is varied. FIG. 33 is a graph in which part of the graph illustrated in FIG. 32 is enlarged. FIG. 33 is a graph in which a wavelength range of 500 μm to 600 μm in the graph illustrated in FIG. 32 is enlarged.

The present inventor studied a relationship between the wavelength of light and reflectance when the diameter of the optical adjustment part in a round shape (that is, a circular shape) was varied. In this study, the inventor used an ultraviolet-visible (UV-vis) spectrophotometer to measure the reflectance of the transparent electrodes. The measurement method was based on expanded reflection. Measured waveforms were 250 nm or more and 800 nm or less. A sample was used in which a cover member is pasted to a sensor film on which transparent electrodes having optical adjustment parts are provided, with an optical transparent adhesive layer intervening between the cover member and the sensor film. The cover member was EAGLE XG (registered trademark), from Corning Incorporated, that has a thickness of 0.5 mm.

An example of the results of the study is as illustrated in FIGS. 32 and 33. That is, when the diameter of the optical adjustment part was relatively large, the reflectance of the transparent electrode was relatively low. The graphs illustrated in FIGS. 32 and 33 indicate that the diameter D11 (see FIG. 24) of the first optical adjustment region 41 and the diameter D12 (see FIG. 24) of the second optical adjustment region 51 are preferably 10 μm or more and more preferably 20 μm or more.

According to the findings that the present inventor obtained, when the diameter of the optical adjustment part in the transparent electrode was more than 100 μm, it was visually confirmed that the invisibility of the patterns of the first transparent electrodes 4 and second transparent electrodes 5 is lowered. Conditions for visual confirmation were as described above with reference to FIG. 29. Accordingly, the diameter D11 of the first optical adjustment region 41 and the diameter D12 of the second optical adjustment region 51 are preferably 100 μm or less and more preferably 90 μm or less.

According to this, it is possible to restrain the reflectance of the first transparent electrode 4 and second transparent electrode 5 from being increased because the diameter D11 of the first optical adjustment region 41 and the diameter D12 of the second optical adjustment region 51 are too small and to assure the invisibility of the patterns of the first transparent electrodes 4 and second transparent electrodes 5. It is also possible to restrain the inner boundaries from being easily viewed because the diameter D11 of the first optical adjustment region 41 and the diameter D12 of the second optical adjustment region 51 are too large and to assure the invisibility of the patterns of the first transparent electrode 4 and second transparent electrode 5.

Figure 34:
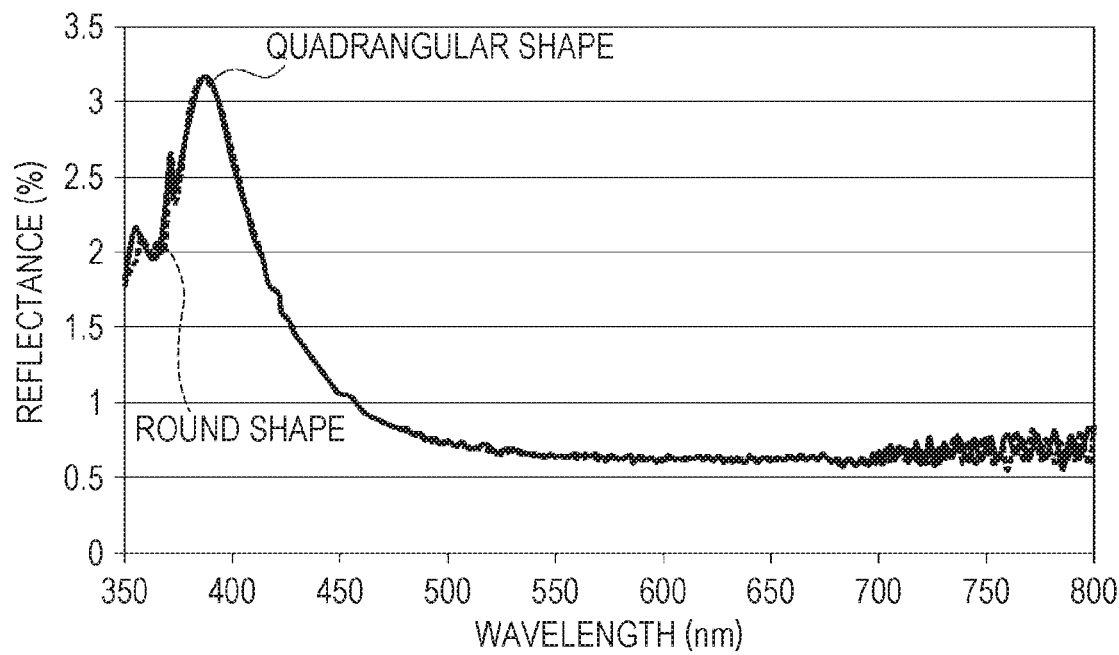
FIG. 34 is a graph that exemplifies an example of a relationship between wavelength and reflectance when the shape of the optical adjustment part is varied.
Figure 35:
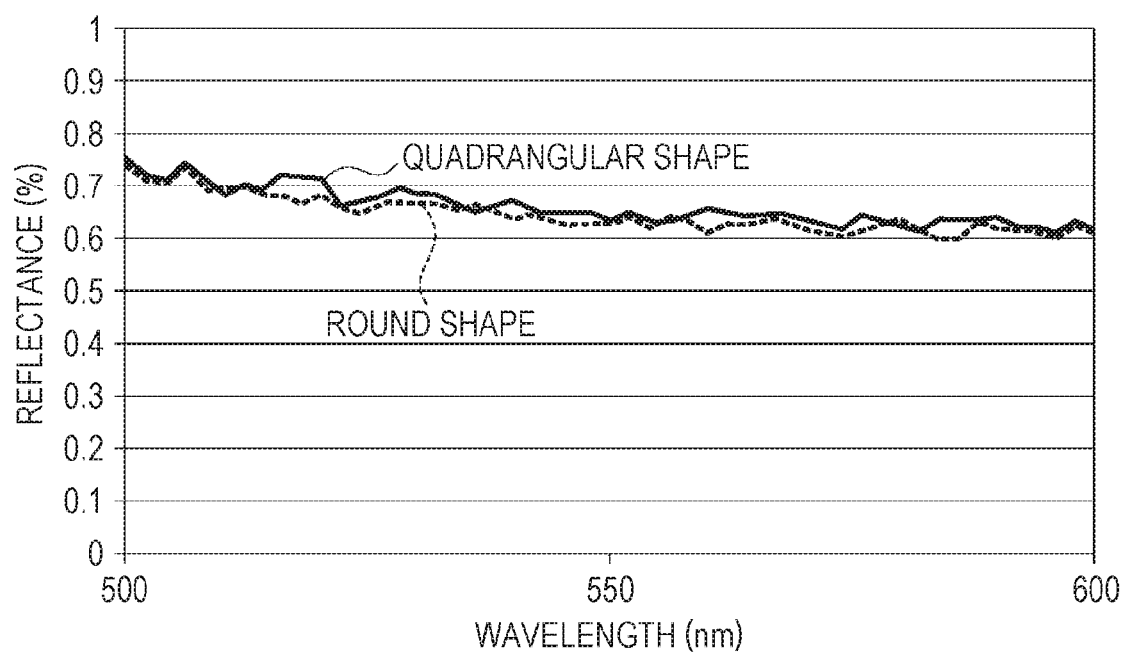
FIG. 35 is a graph in which part of the graph illustrated in FIG. 34 is enlarged.

FIG. 34 is a graph that exemplifies an example of a relationship between wavelength and reflectance when the shape of the optical adjustment part is varied. FIG. 35 is a graph in which part of the graph illustrated in FIG. 34 is enlarged. FIG. 35 is a graph in which a wavelength range of 500 μm to 600 μm in the graph illustrated in FIG. 34 is enlarged.

The present inventor studied a relationship between the wavelength of light and reflectance when the shape of the optical adjustment part was round (that is, circular) and when the shape was quadrangular. The method of measuring reflectance was as described above with reference to FIGS. 32 and 33.

An example of the results of the study is as illustrated in FIGS. 34 and 35. That is, reflectance when the shape of the optical adjustment part was round was substantially the same as reflectance when the shape of the optical adjustment part was quadrangular. Accordingly, as described above with reference to FIG. 27, the shape of each of the first optical adjustment region 41 and second optical adjustment region 51 is not limited to a circle, and may be a quadrangle. As with the diameter range described above with reference to FIGS. 32 and 33, the length D13 (see FIG. 27) of the longest diagonal line of the first optical adjustment region 41A in a quadrangular shape and the length D14 (see FIG. 27) of the longest diagonal line of the second optical adjustment region 51A in a quadrangular shape are preferably 10 μm or more and more preferably be 20 μm or more. Also, the length D13 of the longest diagonal line and the length D14 of the longest diagonal line are preferably 100 μm or less and more preferably 90 μm or less.

According to this, it is possible to restrain the reflectance of the first transparent electrode 4A and second transparent electrode 5A from being increased because the length D13 of the first optical adjustment region 41A and the length D14 of the second optical adjustment region 51A are too short and to assure the invisibility of the patterns of the first transparent electrodes 4A and second transparent electrodes 5A. It is also possible to restrain the inner boundaries from being easily viewed because the length D13 of the first optical adjustment region 41A and the length D14 of the second optical adjustment region 51A are too long and to assure the invisibility of the patterns of the first transparent electrodes 4A and second transparent electrodes 5A.

Figure 39:
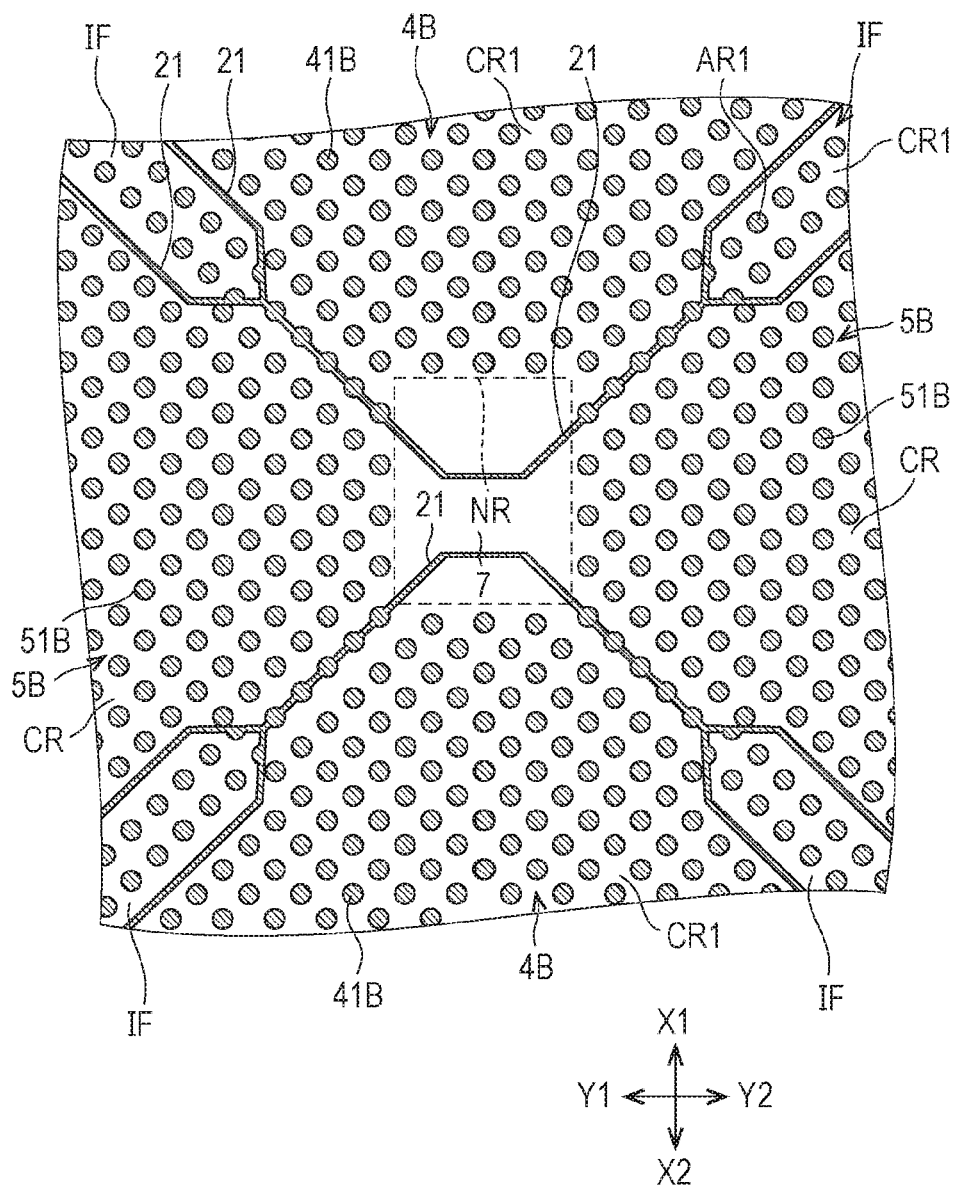
FIG. 39 is a plan view that illustrates part of a detection region in another variation (specifically, a second variation) of the capacitive sensor in an embodiment.

FIG. 39 is a plan view that illustrates part of a detection region in another variation (specifically, a second variation) of the capacitive sensor 1 in this embodiment. FIG. 39 is a plan view in which the region corresponding to the region A1 illustrated in FIG. 23 is further enlarged.

This variation is similar to the example illustrated in FIG. 39 in that a first transparent electrode 4B in this variation has a plurality of first optical adjustment regions 41B in a substantially circular shape, a second transparent electrode 5B has a plurality of second optical adjustment regions 51B in a substantially circular shape, and the insulating layer 21 is provided between the first transparent electrode 4B and the second transparent electrode 5B. For convenience of explanation, the insulating part 20 and bridge wiring part 10 are not illustrated. In a region including the link 7, neither the first optical adjustment region 41B nor the second optical adjustment region 51B is provided. This region is a non-adjustment region NR.

A dummy region IF, which is electrically insulted from both the first transparent electrode 4B and the second transparent electrode 5B by the insulating layers 21, is provided between the first transparent electrode 4B and the second transparent electrode 5B so as to be enclosed by the insulating layers 21. The dummy region IF has a dummy conductive region CR1 having a structure in common with the conductive region CR in the first transparent electrode 4B and second transparent electrode 5B, that is, a structure in which conductive nanowires are dispersed in an insulating material that functions as a matrix. When the dummy region IF of this type is provided, the separation distance between the first transparent electrode 4B and the second transparent electrode 5B in an XY plane can be changed with an influence on invisibility suppressed. When the separation distance between these electrodes is changed, capacitance between electrodes can be adjusted.

To lower the visibility of the dummy region IF, a plurality of dummy optical adjustment regions AR1 in a substantially circular shape are placed in the dummy conductive region CR1 in the dummy region IF so as to be mutually discrete in a plan view, as in the first optical adjustment region 41B and second optical adjustment region 51B. The dummy optical adjustment region AR1 is formed by a method similar to the method for the first optical adjustment region 41B and second optical adjustment region 51B (specifically, the method in which conductive nanowires are removed from the insulating material that functions as a matrix at least on the front surface part). The dummy optical adjustment region AR1 has a structure in common with the first optical adjustment region 41B and second optical adjustment region 51B.

As will be described next, the visibility of the dummy region IF can be lowered by appropriately placing the dummy optical adjustment regions AR1 in the dummy region IF. Thus, if the length of the dummy region IF in a direction in which the first transparent electrode 4B and second transparent electrode 5B are separated by the dummy region IF, that is, the width Wf of the dummy region IF, is 70 µm or more, it is preferable for the dummy optical adjustment region AR1 having a predetermined shape (exemplified by a circle, a quadrangle, or the like) to be placed. If the width Wf of the dummy region IF is 80 µm or more, it is more preferable for the dummy optical adjustment region AR1 to be placed. If the width Wf of the dummy region IF is 90 µm or more, it is further preferable for the dummy optical adjustment region AR1 to be placed. If the width Wf of the dummy region IF is 100 µm or more, it is particularly preferable for the dummy optical adjustment region AR1 to be placed.

If the width Wf of the dummy region IF is less than 100 µm, the dummy region IF does not have the dummy optical adjustment region AR1. That is, it is sometimes preferable for the dummy region IF to be composed of the dummy conductive region CR1. If the width Wf of the dummy region IF is less than 70 µm, particularly 60 µm or less, it is preferable for the dummy region IF to be composed of the dummy conductive region CR1. The minimum value of the width Wf of the dummy region IF is appropriately determined according to, for example, the settings of a semiconductor device (IC) that drives the capacitive sensor 1. In non-limiting exemplary examples, the width Wf of the dummy region IF may be 30 µm or more, may be 40 µm or more, and may be 50 µm or more.

Figure 40:
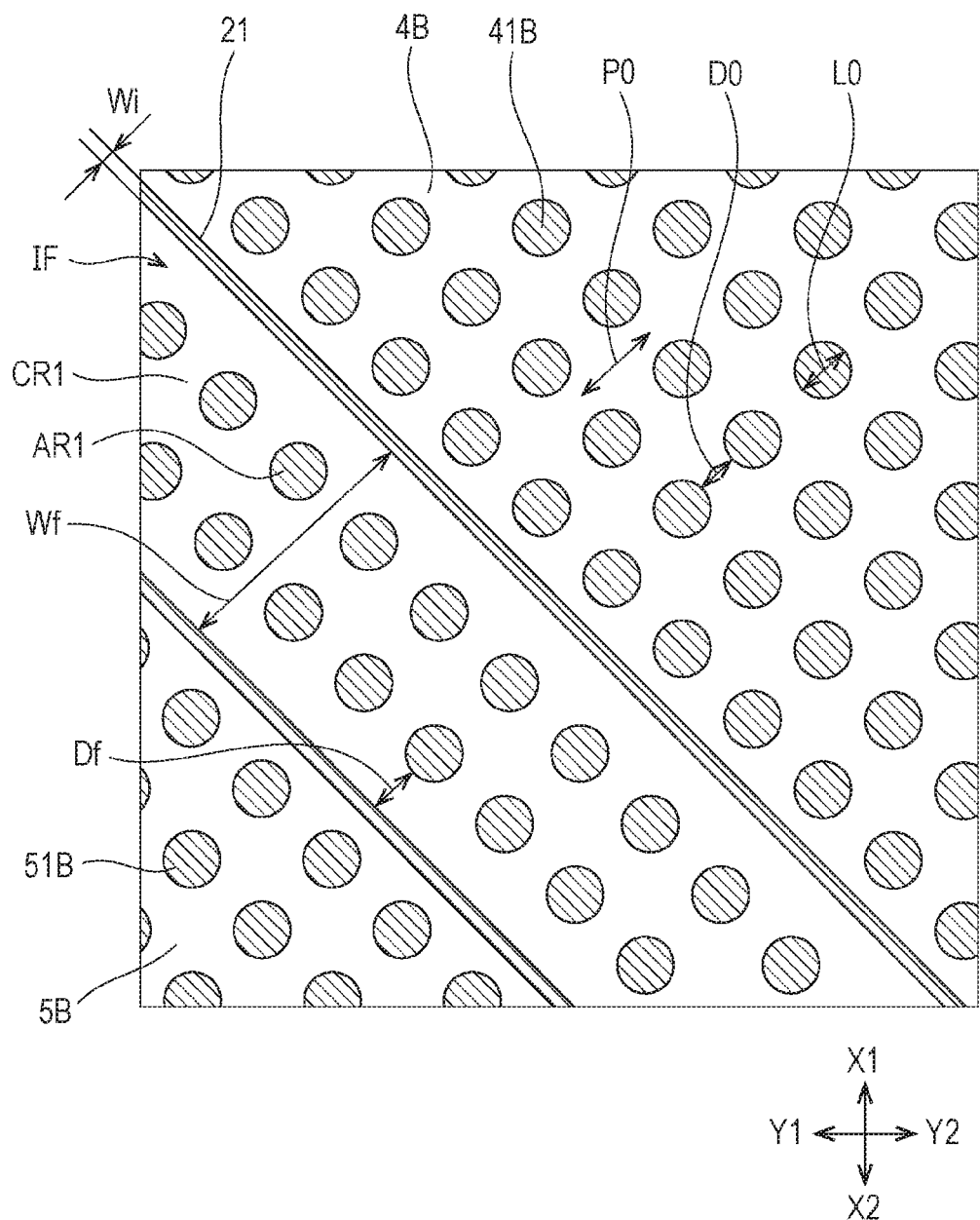
FIG. 40 is a partially enlarged view of a region including a dummy region in the second variation.

As indicated in FIG. 40, a plurality of dummy optical adjustment areas AR1 are provided in the dummy region IF that is separated from the first transparent electrode 4B by one insulating layer 21 and is also separated from the second transparent electrode 5B by another insulating layer 21, the insulating layer 21 having a width Wi of, for example, about 10 µm. These dummy optical adjustment regions AR1 have no portion contiguous to the insulating layer 21. That is, the minimum value (specifically, the minimum separation distance) Df of the separation distance between the dummy optical adjustment region AR1 and the insulating layer 21 in a plan view satisfies the equation below:

$$Df > 0$$

Thus, since the insulating layer 21 and dummy optical adjustment region AR1 are not in direct contact with each other, that is, the dummy optical adjustment region AR1 has no portion contiguous to the insulating layer 21, the invisibility of the insulating layer 21 can be maintained. It is preferable for the minimum separation distance Df to be 10 µm or more; it is more preferable for the minimum separation distance Df to be 20 µm or more; it is particularly preferable for the minimum separation distance Df to be 30 µm or more. However, if the minimum separation distance Df becomes excessively large, the invisibility of the dummy region IF may tend to drop because of the nonexistence of the dummy optical adjustment area AR1. Therefore, it is preferable for the minimum separation distance Df to be 100 µm or less, it is more preferable for the minimum separation distance Df to be 90 µm or less, it is further preferable for the minimum separation distance Df to be 80 µm or less, and it is particularly preferable for the minimum separation distance Df to be 70 µm or less.

It is preferable for the placement density of dummy optical adjustment regions AR1 in the dummy region IF to have a relationship to the placement density of first optical adjustment regions 41B in the first optical adjustment region 41B and the placement density of second optical adjustment regions 51B in the second optical adjustment region 51B. As described above, the first optical adjustment regions 41B are evenly placed in the first transparent electrode 4B, and the second optical adjustment regions 51B are evenly placed in the second transparent electrode 5B. There is an essential match between the placement of first optical adjustment regions 41B in the first transparent electrode 4B and the placement of second optical adjustment regions 51B in the second transparent electrode 5B so that the first transparent electrode 4B and second transparent electrode 5B have similar visibility. In the description below, therefore, the placement of first optical adjustment regions 41B in the first transparent electrode 4B and the placement of dummy optical adjustment regions AR1 in the dummy region IF will be compared.

The separation distance (inter-closest-region separation distance) D0 between each two of a plurality of first optical adjustment regions 41B placed in the first transparent electrode 4B, the two being placed at the closest positions the distance of which is shortest in a plan view, is the difference (P0−L0) between a pitch P0 between the two first optical adjustment regions 41B at the closest positions and the length of each first optical adjustment region 41B in the array direction. It is preferable for this inter-closest-region separation distance D0 to satisfy the following relation to the minimum separation distance Df described above:

$$0.5 \leq Df/D0 \leq 2.5$$

Since Df/D0 (separation ratio) is in the above range, the invisibility of the dummy region IF can be stably assured. To more stably assure the invisibility of the dummy region IF, it is sometimes preferable for the separation ratio Df/D0 to be 0.7 or more and 2.0 or less and it is sometimes more preferable for the separation ratio Df/D0 to be 0.7 or more and 1.3 or less.

A relationship that satisfies the following equation is preferably present between the area ratio (electrode adjustment ratio) AA0 (unit: %) of a region composed of first optical adjustment regions 41B in the first transparent electrode 4B and the area ratio (dummy adjustment ratio) AAf (unit: %) of a region composed of dummy optical adjustment areas AR1 in the dummy region IF:

$$AAf/AA0 < 1$$

That is, it is preferable for the dummy adjustment ratio AAf to be lower than the electrode adjustment ratio AA0. Insulating layers 21 with the predetermined width Wi are positioned so as to enclose the dummy region IF. In consideration of this, therefore, if the dummy adjustment ratio AAf is set so as to be lower than the electrode adjustment ratio AA0, superior invisibility can be attained. To more stably achieve superior invisibility, it is sometimes preferable for AAf/AA0 (adjustment area ratio) to be 0.3 or more and 0.95 or less and it is sometimes more preferable for AAf/AA0 to be 0.6 or more and 0.9 or less.

Descriptions will be given below with specific examples.

FIGS. 41 to 45 are each a partially enlarged view of a detection region having transparent electrodes (specifically, first transparent electrodes and second transparent electrodes) and dummy regions. In these drawings, reference characters are omitted so that an impression given by the entire drawing is easily confirmed.

The optical adjustment regions (specifically, first optical adjustment region 41B and second optical adjustment region 51B) in the transparent electrodes (specifically, first transparent electrode 4B and second transparent electrode 5B) are each in a circular shape with a diameter of 35 μm in a plan view, and are evenly placed in the transparent electrodes. Specifically, the arrangement pitch P0 between each two optical adjustment parts that are the closet arranged is 68 μm. Therefore, the inter-closest-region separation distance D0 is 33 μm. The width Wf of the dummy region IF separated from the transparent electrodes (specifically, first transparent electrode 4B and second transparent electrode 5B) by the insulating layers 21 with the width Wi is 180 μm. Conditions for visual confirmation are as described above.

First Example

Figure 41:
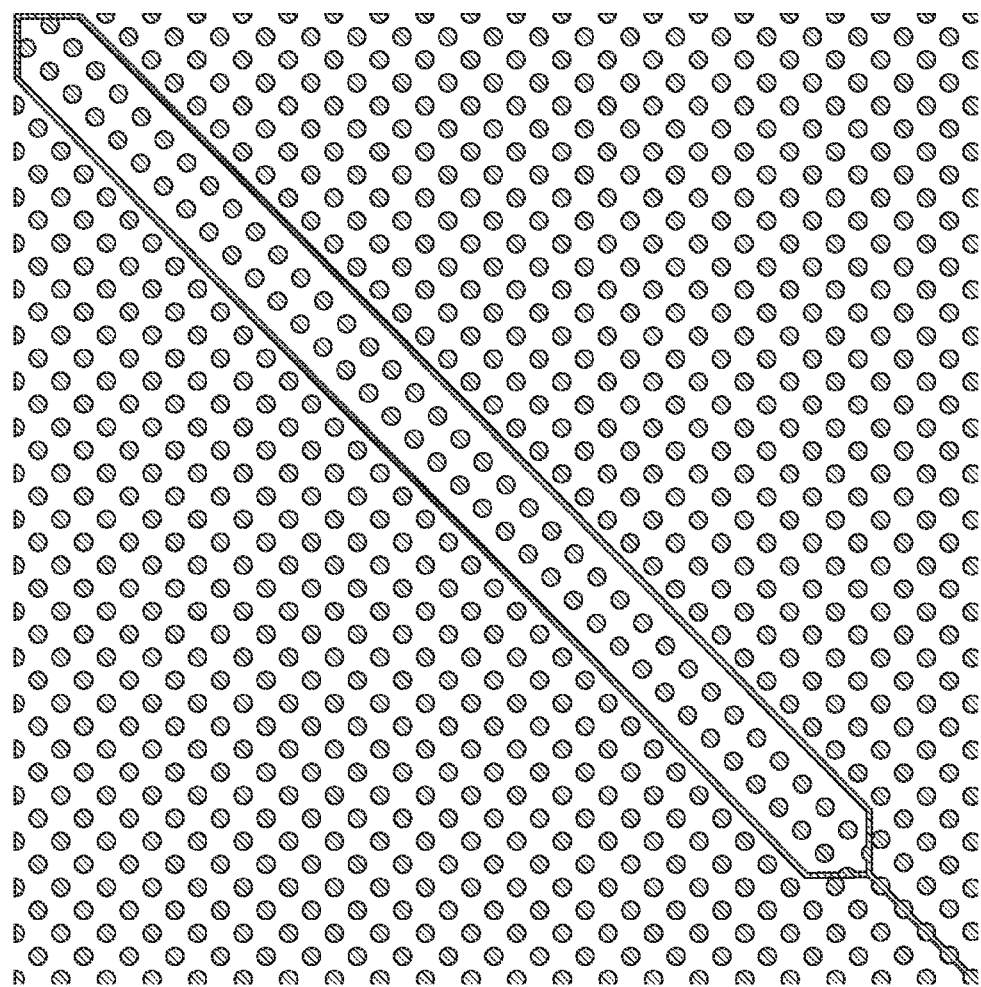
FIG. 41 is a partially enlarged view of a detection region in a first example.

In the detection region 11 according to a first example illustrated in FIG. 41, two rows of dummy optical adjustment regions AR1 in a circular shape (diameter: 35 μm), the minimum separation distance Df of each dummy optical adjustment region AR1 in each row being 36.6 μm in relation to each of two insulating layers 21 positioned in the width direction of the dummy region IF, are placed at a pitch of 75 μm in a direction in which the dummy region IF extends. The separation ratio Df/D0 in this case is 1.22 and the adjustment area ratio AAf/AA0 is 0.7. In this case, this embodiment is superior particularly in invisibility, and it was not essentially visually recognized that the dummy region IF is placed in the detection region 11.

Second Example

Figure 42:
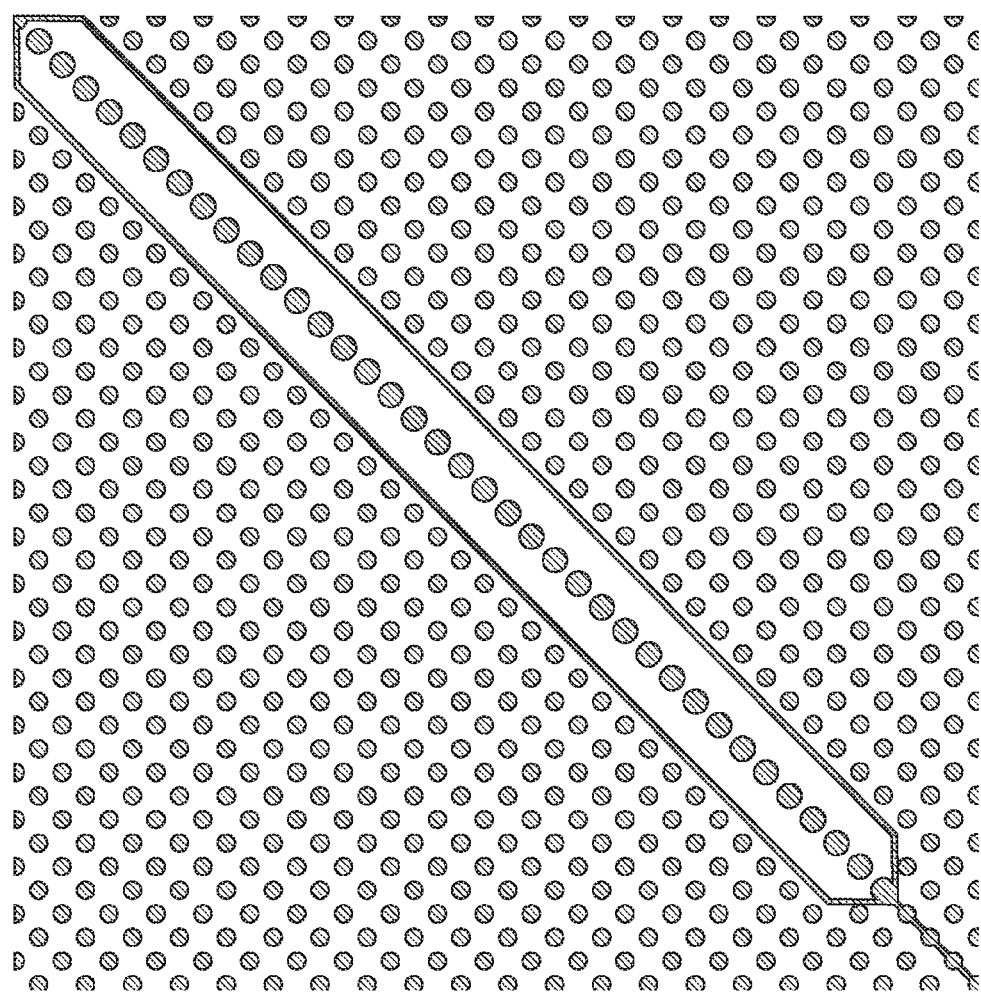
FIG. 42 is a partially enlarged view of a detection region in a second example.

In the detection region 11 according to a second example illustrated in FIG. 42, dummy optical adjustment regions AR1 in a circular shape (diameter: 50 μm), the minimum separation distance Df of each dummy optical adjustment region AR1 in each row being 65 μm in relation to each of two insulating layers 21 positioned in the width direction of the dummy region IF, are placed at a pitch of 75 μm in a direction in which the dummy region IF extends. The separation ratio Df/D0 in this case is 1.96 and the adjustment area ratio AAf/AA0 is 0.33. In this case as well, this embodiment is superior in invisibility to substantially the same extent as the first example, and it was not essentially visually recognized that the dummy region IF is placed in the detection region 11.

Third Example

Figure 43:
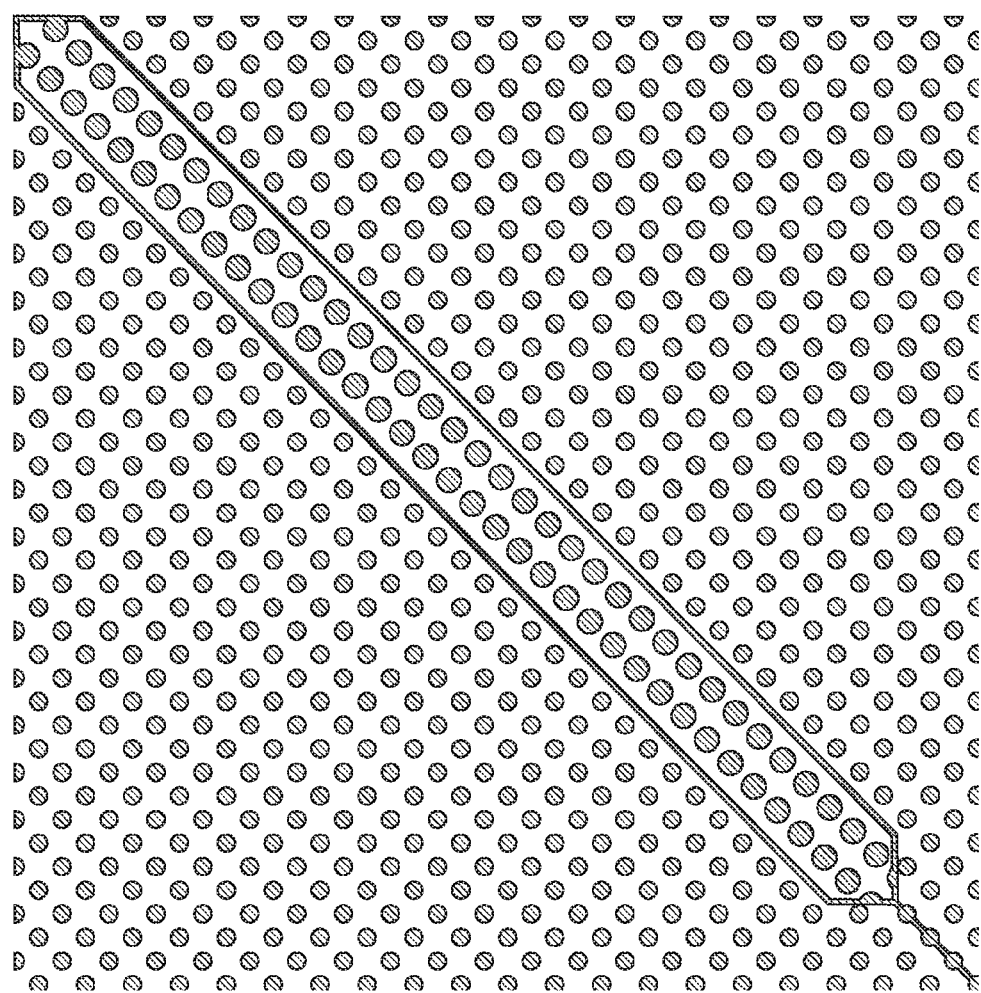
FIG. 43 is a partially enlarged view of a detection region in a third example.

In the detection region 11 according to a third example illustrated in FIG. 43, two rows of dummy optical adjustment regions AR1 in a circular shape (diameter: 60 μm), the minimum separation distance Df of each dummy optical adjustment region AR1 in each row being 20 μm in relation to each of two insulating layers 21 positioned in the width direction of the dummy region IF, are placed at a pitch of 75 μm in a direction in which the dummy region IF extends. The separation ratio Df/D0 in this case is 0.6 and the adjustment area ratio AAf/AA0 is 2.0. Although, in this case as well, this embodiment is superior in invisibility, the presence of dummy optical adjustment regions AR1 was visually recognized slightly when compared with the first example.

First Comparative Example

Figure 44:
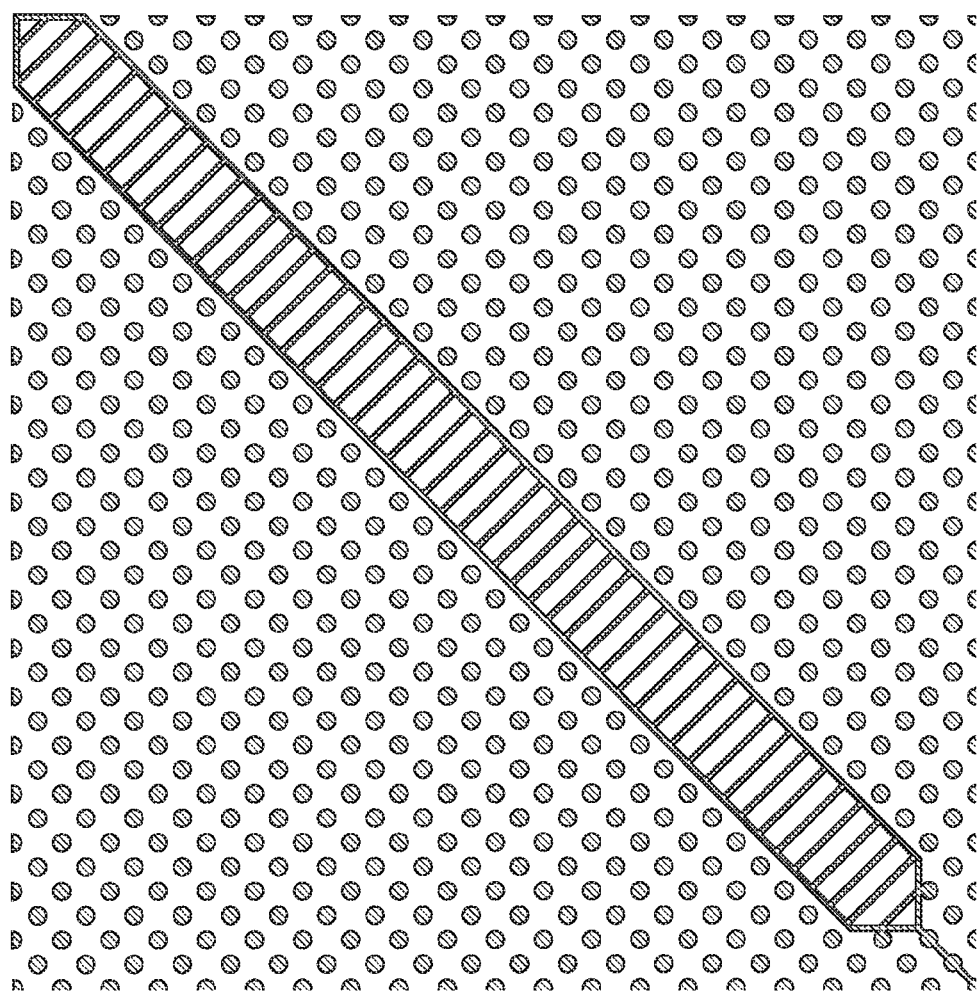
FIG. 44 is a partially enlarged view of a detection region in a first comparative example.

In the detection region 11 according to a first comparative illustrated in FIG. 44, dummy optical adjustment regions AR1 in a linear shape (width: 10 μm), which are linked to two insulating layers 21 positioned in the width direction of the dummy region IF, are placed at a pitch of 50 μm in a direction in which the dummy region IF extends. The separation ratio Df/D0 in this case is 0 and the adjustment area ratio AAf/AA0 is 1.0. In this case, it was visually recognized that the dummy region IF is placed in the detection region 11 because the linking part of the dummy optical adjustment region AR1 to the insulating layer 21 makes the presence of the insulating layer 21 noticeable.

Second Comparative Example

Figure 45:
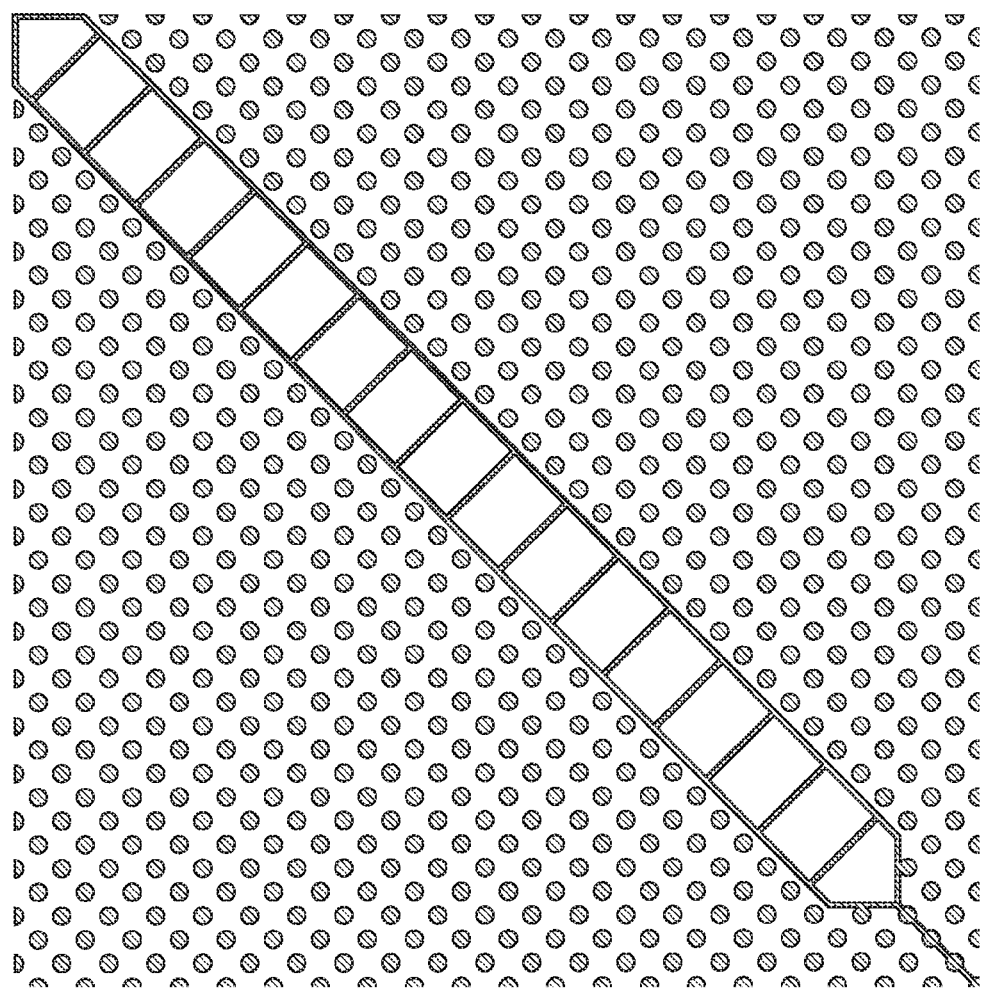
FIG. 45 is a partially enlarged view of a detection region in a second comparative example.

In the detection region 11 according to a second comparative illustrated in FIG. 45, dummy optical adjustment regions AR1 in a linear shape (width: 10 μm), which are linked to two insulating layers 21 positioned in the width direction of the dummy region IF, are placed at a pitch of 150 μm in a direction in which the dummy region IF extends. The separation ratio Df/D0 in this case is 0 and the adjustment area ratio AAf/AA0 is 0.5. In this case, although the adjustment area ratio AAf/AA0 is adequately smaller than 1, it not possible to hide the prominence of the insulating layer 21 due to the connection part of the dummy optical adjustment region AR1 to the insulating layer 21, so it was visually recognized that the dummy region IF is placed in the detection region 11 as in the first comparative example.

So far, an embodiment and its application examples have been described above. However, present invention is not limited to these examples. For example, the scope of the present invention also includes embodiments obtained as a result of adding or deleting constituent elements to or from the embodiment described above or its application examples, performing design changes to the embodiment or its application examples, or appropriately combining features in the embodiment as long as the obtained embodiments are within the intended scope of the present invention; the additions, deletions, design changes, or combination is effected by a person having ordinary skill in the art.

What is claimed is:

1. A transparent electrode member comprising:
    a base having a translucent property, the base having a first surface;
    a transparent electrode having a translucent property, the transparent electrode being provided in a region on the first surface; and
    an insulating layer provided in an insulating region on the first surface, the insulating region including at least part of a peripheral region surrounding the region in which the transparent electrode is provided, viewed from a direction normal to the first surface,
    wherein the transparent electrode includes a dispersion layer, the dispersion layer including:
        a matrix formed of an insulating material; and
        conductive nanowires dispersed in the matrix,
    wherein the transparent electrode has a conductive region and an optical adjustment region viewed from the normal of the first surface, the conductive region being formed of a conductive portion of the dispersion layer having a first conductivity, and the optical adjustment region being formed of an optical adjustment portion of the dispersion layer having a second conductivity smaller than the first conductivity,
    wherein the conductive portion has a first dispersion density of the conductive nanowires, and the optical adjustment portion has a second dispersion density of the conductive nanowires smaller than the first dispersion density,
    wherein the optical adjustment region has a plurality of areas that are discretely arranged within the conductive region,
    and wherein a shape of each of the plurality of areas is a circle, and a diameter of the circle is 10 µm or more and 100 µm or less.

2. The transparent electrode member according to claim 1, wherein a reflectivity of the insulating region is lower than a reflectivity of the conductive region.

3. The transparent electrode member according to claim 2, wherein the insulating layer includes a matrix which is the same as the matrix of the dispersion layer.

4. The transparent electrode member according to claim 1, wherein the optical adjustment region is arranged within the conductive region.

5. The transparent electrode member according to claim 1, wherein a ratio of the optical adjustment region per unit area is 40% or less.

6. The transparent electrode member according to claim 1, wherein the plurality of areas are separated 30 µm or more from one another.

7. The transparent electrode member according to claim 1, wherein the plurality of areas are disposed over the entire transparent electrode.

8. The transparent electrode member according to claim 1, wherein the optical adjustment portion of the dispersion layer has the dispersion density of the conductive nanowires which is reduced to an extent that the optical adjustment portion exhibits an insulation property.

9. A method of manufacturing the transparent electrode member according to claim 8, the method comprising:
    preparing a first laminated body by laminating a layer including silver nanowires dispersed in the matrix on the first surface, thereby forming the dispersion layer on the base;
    covering part of the dispersion layer in the first laminated body with a resist layer, the resist layer exposing a first region;
    processing the first region of the dispersion layer with an iodine liquid so that at least part of the silver nanowires present in the first region is iodinated to a silver iodide, thereby making the first region of the dispersion layer insulative;
    processing the first region with a thiosulfate solution to remove at least part of the silver iodide from the first region; and
    removing the resist layer, thereby obtaining a member including:
the optical adjustment portion having an insulation property and the insulating layer in the first region; and
the conductive portion provided in a region that was covered by the resist layer.

10. A capacitive sensor comprising:
    the transparent electrode member according to claim 1; and
    a detection unit that detects a change in capacitance generated between the transparent electrode and a manipulating body including a finger of an operator.

11. A transparent electrode member comprising:
    a base having a translucent property, the base having a first surface;
    a transparent electrode having a translucent property, the transparent electrode being provided in a region on the first surface; and
    an insulating layer provided in an insulating region on the first surface, the insulating region including at least part of a peripheral region surrounding the region in which the transparent electrode is provided, viewed from a direction normal to the first surface,
    wherein the transparent electrode includes a dispersion layer, the dispersion layer including:
        a matrix formed of an insulating material; and
        conductive nanowires dispersed in the matrix,
    wherein the transparent electrode has a conductive region and an optical adjustment region viewed from the normal of the first surface, the conductive region being formed of a conductive portion of the dispersion layer having a first conductivity, and the optical adjustment region being formed of an optical adjustment portion of the dispersion layer having a second conductivity smaller than the first conductivity,
    wherein the conductive portion has a first dispersion density of the conductive nanowires, and the optical adjustment portion has a second dispersion density of the conductive nanowires smaller than the first dispersion density, wherein the optical adjustment region has a plurality of areas that are discretely arranged within the conductive region, and wherein a shape of each of the plurality of areas is a quadrangle, and a length of the longest diagonal line of the quadrangle is 10 μm or more and 100 μm or less.

12. A transparent electrode member comprising:

a base having a translucent property, the base having a first surface;

a transparent electrode having a translucent property, the transparent electrode being provided in a region on the first surface and including a dispersion layer, the dispersion layer including:
- a matrix formed of an insulating material; and
- conductive nanowires dispersed in the matrix;

an insulating layer provided in an insulating region on the first surface, the insulating region including at least part of a peripheral region surrounding the region in which the transparent electrode is provided, viewed from a direction normal to the first surface;

a transparent wire made of a material having a translucent property; and a dummy region having a translucent property, wherein the transparent electrode has a conductive region and an optical adjustment region viewed from the normal of the first surface, the conductive region being formed of a conductive portion of the dispersion layer having a first conductivity, and the optical adjustment region being formed of an optical adjustment portion of the dispersion layer having a second conductivity smaller than the first conductivity, wherein the conductive portion has a first dispersion density of the conductive nanowires, and the optical adjustment portion has a second dispersion density of the conductive nanowires smaller than the first dispersion density, wherein the transparent electrode is formed of a plurality of transparent electrode parts disposed on the first surface and electrically connected by the transparent wire, the plurality of transparent electrode parts including:
- a plurality of first transparent electrode parts arranged along a first direction which is one of in-plane directions of the first surface, the plurality of first transparent electrode parts being electrically connected to one another, and
- a plurality of second transparent electrode parts arranged along a second direction which is another of the in-plane directions of the first surface, the plurality of second transparent electrode parts being electrically connected to one another;

wherein the transparent wire includes:
- a first transparent wire part that electrically connects two adjacent first transparent electrode parts; and
- a second transparent wire part that electrically connects two adjacent second transparent electrode parts, the first transparent wire part and the second transparent wire part having an overlapping portion in the direction normal to the first surface with an insulator interposed therebetween, wherein the dummy region is provided between one of the plurality of first transparent electrode parts and corresponding one of the plurality of second transparent electrode parts which is adjacent to the first transparent electrode part, the dummy region having a length of 70 μm or greater in a separation direction in which the first transparent electrode part and the corresponding second transparent electrode part are separated by the dummy region, wherein the insulating region includes a portion surrounding the dummy region, wherein the dummy region includes:
- a dummy conductive region having a same structure as that of the conductive region in the transparent electrode; and
- a dummy optical adjustment region having a same structure as that of the optical adjustment region in the transparent electrode, and wherein a minimum separation distance Df, which is a distance from the insulating region surrounding the dummy region to the dummy optical adjustment region closest to the insulating region, satisfies a following relationship:

$$Df>0.$$

13. The transparent electrode member according to claim 12, wherein the optical adjustment region of the transparent electrode has a plurality of areas that are discretely arranged within the conductive region of the transparent electrode; and the minimum separation distance Df and a minimum inter-area distance D0 which is a separation distance between two closest areas among the plurality of areas, satisfies a following relationship:

$$0.5 \leq Df/D0 \leq 2.5.$$

14. A transparent electrode member, comprising:

a base having a translucent property, the base having a first surface;

a transparent electrode having a translucent property, the transparent electrode being provided in a region on the first surface and including a dispersion layer, the dispersion layer including:
- a matrix formed of an insulating material; and
- conductive nanowires dispersed in the matrix;

an insulating layer provided in an insulating region on the first surface, the insulating region including at least part of a peripheral region surrounding the region in which the transparent electrode is provided, viewed from a direction normal to the first surface;

a transparent wire made of a material having a translucent property; and a dummy region having a translucent property, wherein the transparent electrode has a conductive region and an optical adjustment region viewed from the normal of the first surface, the conductive region being formed of a conductive portion of the dispersion layer having a first conductivity, and the optical adjustment region being formed of an optical adjustment portion of the dispersion layer having a second conductivity smaller than the first conductivity, wherein the conductive portion has a first dispersion density of the conductive nanowires, and the optical adjustment portion has a second dispersion density of the conductive nanowires smaller than the first dispersion density, wherein the transparent electrode is formed of a plurality of transparent electrode parts disposed on the first surface and electrically connected by the transparent wire, the plurality of transparent electrode parts including:

a plurality of first transparent electrode parts arranged along a first direction which is one of in-plane directions of the first surface, the plurality of first transparent electrode parts being electrically connected to one another, and
a plurality of second transparent electrode parts arranged along a second direction which is another of the in-plane directions of the first surface, the plurality of second transparent electrode parts being electrically connected to one another;
wherein the transparent wire includes:
a first transparent wire part that electrically connects two adjacent first transparent electrode parts; and
a second transparent wire part that electrically connects two adjacent second transparent electrode parts, the first transparent wire part and the second transparent wire part having an overlapping portion in the direction normal to the first surface with an insulator interposed therebetween,
wherein the dummy region is provided between one of the plurality of first transparent electrode parts and corresponding one of the plurality of second transparent electrode parts which is adjacent to the first transparent electrode part, the dummy region having a length of 70 μm or greater in a separation direction in which the first transparent electrode part and the corresponding second transparent electrode part are separated by the dummy region,
wherein the insulating region includes a portion surrounding the dummy region,
wherein the dummy region includes:
a dummy conductive region having a same structure as that of the conductive region in the transparent electrode; and
a dummy optical adjustment region having a same structure as that of the optical adjustment region in the transparent electrode,
and wherein a ratio AA0 of the optical adjustment region per unit area in the transparent electrode and a ratio AAf of the dummy optical adjustment region per unit area in the dummy region satisfy a following relationship:

$$AAf/AA0<1.$$

15. The transparent electrode member according to claim 14, wherein the ratio AA0 and the ratio AAf further satisfy a following relationship:

$$0.3 \leq AAf/AA0 \leq 0.95.$$

16. A transparent electrode member, comprising:
a base having a translucent property, the base having a first surface;
a transparent electrode having a translucent property, the transparent electrode being provided in a region on the first surface and including a dispersion layer, the dispersion layer including:
a matrix formed of an insulating material; and
conductive nanowires dispersed in the matrix;
an insulating layer provided in an insulating region on the first surface, the insulating region including at least part of a peripheral region surrounding the region in which the transparent electrode is provided, viewed from a direction normal to the first surface;
a transparent wire made of a material having a translucent property; and
a dummy region having a translucent property,
wherein the transparent electrode has a conductive region and an optical adjustment region viewed from the normal of the first surface, the conductive region being formed of a conductive portion of the dispersion layer having a first conductivity, and the optical adjustment region being formed of an optical adjustment portion of the dispersion layer having a second conductivity smaller than the first conductivity,
wherein the conductive portion has a first dispersion density of the conductive nanowires, and the optical adjustment portion has a second dispersion density of the conductive nanowires smaller than the first dispersion density,
wherein the transparent electrode is formed of a plurality of transparent electrode parts disposed on the first surface and electrically connected by the transparent wire, the plurality of transparent electrode parts including:
a plurality of first transparent electrode parts arranged along a first direction which is one of in-plane directions of the first surface, the plurality of first transparent electrode parts being electrically connected to one another, and
a plurality of second transparent electrode parts arranged along a second direction which is another of the in-plane directions of the first surface, the plurality of second transparent electrode parts being electrically connected to one another;
wherein the transparent wire includes:
a first transparent wire part that electrically connects two adjacent first transparent electrode parts; and
a second transparent wire part that electrically connects two adjacent second transparent electrode parts, the first transparent wire part and the second transparent wire part having an overlapping portion in the direction normal to the first surface with an insulator interposed therebetween,
wherein the dummy region is provided between one of the plurality of first transparent electrode parts and corresponding one of the plurality of second transparent electrode parts which is adjacent to the first transparent electrode part, the dummy region having a length of 100 μm or smaller in a separation direction in which the first transparent electrode part and the corresponding second transparent electrode part are separated by the dummy region,
wherein the insulating region includes a portion surrounding the dummy region,
and wherein the dummy region is formed of a dummy conductive region having a same structure as that of the conductive region in the transparent electrode.

17. The transparent electrode member comprising:
a base having a translucent property, the base having a first surface;
a transparent electrode having a translucent property, the transparent electrode being provided in a region on the first surface; and
an insulating layer provided in an insulating region on the first surface, the insulating region including at least part of a peripheral region surrounding the region in which the transparent electrode is provided, viewed from a direction normal to the first surface,
wherein the transparent electrode includes a dispersion layer, the dispersion layer including:
a matrix formed of an insulating material; and
conductive nanowires dispersed in the matrix, wherein the transparent electrode has a conductive region and an optical adjustment region viewed from the normal of the first surface, the conductive region being formed of a conductive portion of the dispersion layer having a first conductivity, and the optical adjustment region being formed of an optical adjustment portion of the dispersion layer having a second conductivity smaller than the first conductivity, wherein the conductive portion has a first dispersion density of the conductive nanowires, and the optical adjustment portion has a second dispersion density of the conductive nanowires smaller than the first dispersion density, and wherein the optical adjustment portion has a higher conductivity than that of the insulating layer.

18. A method of manufacturing the transparent electrode member according to claim 17, the method comprising:

preparing a first laminated body by laminating a layer including silver nanowires dispersed in the matrix on the first surface, thereby forming the dispersion layer on the base;

covering part of the dispersion layer in the first laminated body with a first resist layer, the first resist layer exposing a first region;

processing the first region of the dispersion layer with an iodine liquid so that at least part of the silver nanowires present in the first region is iodinated to a silver iodide, thereby causing the first region of the dispersion layer to function as the insulating layer;

processing the first region with a thiosulfate solution to remove at least part of the silver iodide from the first region;

removing the first resist layer to obtain an intermediate member having the insulating layer formed in the first region;

covering a second region with a second resist layer, the second region being part of a region that was covered by the first resist layer, the second resist layer exposing a third region which was another part of the region covered by the first resist;

processing the third region with an iodine liquid so that at least part of the silver nanowires present in the third region is iodinated to a silver iodide, thereby reducing a conductivity of the third region to be smaller than a conductivity of the second region;

processing the third region with a thiosulfate solution to remove at least part of the silver iodide from the third region; and removing the second resist layer, thereby obtaining a member including:

the insulating layer provided in the first region;

the conductive portion provided in the second region; and the optical adjustment portion provided in the third region, the optical adjustment portion having a conductivity higher than a conductivity of the insulating layer and lower than a conductivity of the conductive portion.

* * * * *